(12) United States Patent
Phaneuf et al.

(10) Patent No.: US 11,923,168 B2
(45) Date of Patent: Mar. 5, 2024

(54) MICROSCOPY IMAGING METHOD FOR 3D TOMOGRAPHY WITH PREDICTIVE DRIFT TRACKING FOR MULTIPLE CHARGED PARTICLE BEAMS

(71) Applicant: FIBICS INCORPORATED, Ottawa (CA)

(72) Inventors: Michael William Phaneuf, Ottawa (CA); Ken Guillaume Lagarec, Ottawa (CA)

(73) Assignee: FIBICS INCORPORATED, Ontario (CA)

( * ) Notice: Subject to any disclaimer, the term of this patent is extended or adjusted under 35 U.S.C. 154(b) by 0 days.

(21) Appl. No.: 17/937,510

(22) Filed: Oct. 3, 2022

(65) Prior Publication Data

US 2023/0044598 A1 Feb. 9, 2023

Related U.S. Application Data

(63) Continuation of application No. 17/138,329, filed on Dec. 30, 2020, now Pat. No. 11,462,383, which is a
(Continued)

(51) Int. Cl.
*H01J 37/22* (2006.01)
*H01J 37/26* (2006.01)
(Continued)

(52) U.S. Cl.
CPC ............ *H01J 37/26* (2013.01); *H01J 37/222* (2013.01); *H01J 37/28* (2013.01);
(Continued)

(58) Field of Classification Search
CPC ............... H01J 37/26; H01J 37/222; G06T 2207/10061
See application file for complete search history.

(56) References Cited

U.S. PATENT DOCUMENTS

| 4,050,817 A | 9/1977 | Bromfield et al. |
| 4,523,849 A | 6/1985 | Stone |

(Continued)

FOREIGN PATENT DOCUMENTS

| EP | 3528276 | 12/2018 |
| EP | 2707893 | 1/2019 |

(Continued)

OTHER PUBLICATIONS

K Ogura et al., "Gigantic Montages with a Fully Automated FE-SEM (Serial Sections of a Mouse Brain Tissue)", Microscopy and Microanalysis, vol. 16, No. S2, Jul. 1, 2010, pp. 52-53, XP055584073, ISSN: 1431-9276, DOI: 10.1017/S143192761005628X.

(Continued)

*Primary Examiner* — Irfan Habib
(74) *Attorney, Agent, or Firm* — Shin Hung; VanTek IP LLP

(57) ABSTRACT

A method to compensate for drift while controlling a charged particle beam (CPB) system having at least one charged particle beam controllable in position. Sources of drift include mechanical variations in the stage supporting the sample, beam deflection shifts, and environmental impacts, such as temperature. The method includes positioning a sample supported by a stage in the CPB system, monitoring a reference fiducial on a surface of the sample from a start time to an end time, determining a drift compensation to compensate for a drift that causes an unintended change in the position of a first charged particle beam relative to the sample by a known amount over a period of time based on a change in the position of the reference fiducial between the start time and the end time, and adjusting positions of the first charged particle beam by applying the determined drift compensation during an operation of the CPB system.

19 Claims, 34 Drawing Sheets

Related U.S. Application Data continuation of application No. 16/784,708, filed on Feb. 7, 2020, now Pat. No. 10,886,100, which is a continuation of application No. 15/783,054, filed on Oct. 13, 2017, now Pat. No. 10,586,680, which is a continuation of application No. 15/420,844, filed on Jan. 31, 2017, now Pat. No. 9,812,290, which is a continuation of application No. 14/117,256, filed as application No. PCT/CA2012/050316 on May 14, 2012, now Pat. No. 9,633,819.

(60) Provisional application No. 61/485,713, filed on May 13, 2011.

(51) Int. Cl.
*H01J 37/28* (2006.01)
*H01J 37/30* (2006.01)
*H01J 37/304* (2006.01)
*H01J 37/305* (2006.01)

(52) U.S. Cl.
CPC ........ *H01J 37/3005* (2013.01); *H01J 37/304* (2013.01); *H01J 37/3045* (2013.01); *H01J 37/3056* (2013.01); *G06T 2207/10061* (2013.01); *H01J 2237/226* (2013.01); *H01J 2237/2811* (2013.01); *H01J 2237/3174* (2013.01); *H01J 2237/31749* (2013.01)

(56) References Cited

U.S. PATENT DOCUMENTS

| | | | | |
|---|---|---|---|---|
| 5,825,017 | A | 10/1998 | Pryor | |
| 5,825,035 | A * | 10/1998 | Mizumura | H01J 37/3056 315/111.41 |
| 5,871,391 | A | 2/1999 | Pryor | |
| 6,069,364 | A * | 5/2000 | Itoh | B82Y 40/00 250/492.23 |
| 6,134,002 | A * | 10/2000 | Stimson | G01J 3/2803 359/368 |
| 6,472,662 | B1 * | 10/2002 | Archie | G01N 23/225 250/306 |
| 6,533,641 | B1 * | 3/2003 | Morken | B24B 49/12 451/6 |
| 6,727,500 | B1 * | 4/2004 | Berger | H01J 37/3005 250/492.2 |
| 6,852,973 | B2 * | 2/2005 | Suzuki | H01J 37/28 250/306 |
| 6,888,149 | B2 * | 5/2005 | Ikku | H01J 37/3045 250/492.23 |
| 7,135,123 | B1 * | 11/2006 | Thompson | H01L 23/544 700/121 |
| 7,244,932 | B2 * | 7/2007 | Nakasuji | H01J 37/06 250/306 |
| 7,312,448 | B2 | 12/2007 | Principe | |
| 7,385,197 | B2 * | 6/2008 | Nakasuji | H01J 37/28 250/306 |
| 7,612,337 | B2 * | 11/2009 | Suzuki | H01J 37/3005 250/311 |
| 7,750,293 | B2 | 7/2010 | Principe | |
| 8,110,814 | B2 * | 2/2012 | Ward | H01J 37/252 250/424 |
| 8,227,781 | B2 * | 7/2012 | Zaykova-Feldman | H01J 37/304 250/559.4 |
| 8,421,010 | B2 * | 4/2013 | Hiroi | H01J 37/20 250/311 |
| 8,519,334 | B2 * | 8/2013 | Tadaka | H01J 37/28 250/306 |
| 8,679,307 | B2 * | 3/2014 | Fischione | G01N 1/32 156/345.31 |
| 8,766,280 | B2 * | 7/2014 | Thoumazet | H01L 31/0445 257/431 |
| 8,816,276 | B2 * | 8/2014 | Touya | H01J 37/3007 250/306 |
| 9,177,759 | B2 * | 11/2015 | Li | H01J 37/265 |
| 9,202,672 | B2 * | 12/2015 | Kitayama | H01J 37/304 |
| 9,312,111 | B2 * | 4/2016 | Bendall | H01J 49/0036 |
| 9,373,424 | B2 * | 6/2016 | Touya | B82Y 10/00 |
| 9,633,819 | B2 | 4/2017 | Phaneuf et al. | |
| 9,812,290 | B2 | 11/2017 | Phaneuf et al. | |
| 10,586,680 | B2 | 3/2020 | Phaneuf et al. | |
| 10,886,100 | B2 | 1/2021 | Phaneuf et al. | |
| 11,462,323 | B2 | 10/2022 | Phaneuf et al. | |
| 2004/0108458 | A1 | 6/2004 | Gerlach et al. | |
| 2005/0092432 | A1 * | 5/2005 | Fukushima | H01J 37/3053 156/345.4 |
| 2005/0253067 | A1 | 11/2005 | Kawada et al. | |
| 2006/0133657 | A1 * | 6/2006 | Schmid | G02B 21/26 382/128 |
| 2006/0192145 | A1 * | 8/2006 | Adamec | H01J 37/28 250/492.1 |
| 2007/0075887 | A1 * | 4/2007 | Stovall | H03M 1/66 341/155 |
| 2008/0014679 | A1 * | 1/2008 | Shen | H01L 23/562 438/106 |
| 2008/0265245 | A1 * | 10/2008 | Gotoh | H10K 50/85 257/E33.001 |
| 2009/0039263 | A1 | 2/2009 | Matsuoka et al. | |
| 2009/0072230 | A1 * | 3/2009 | Ito | H10K 77/111 428/448 |
| 2009/0077697 | A1 * | 3/2009 | Su | G01Q 30/04 850/52 |
| 2009/0135240 | A1 * | 5/2009 | Phaneuf | G01N 1/286 347/246 |
| 2009/0179161 | A1 * | 7/2009 | Ward | H01J 37/08 250/424 |
| 2009/0251699 | A1 | 10/2009 | George | |
| 2009/0314937 | A1 | 12/2009 | Sellmair | |
| 2010/0072365 | A1 | 3/2010 | Shoham et al. | |
| 2010/0089636 | A1 * | 4/2010 | Ramadas | B82Y 15/00 428/323 |
| 2010/0092070 | A1 | 4/2010 | Young et al. | |
| 2010/0167031 | A1 * | 7/2010 | Leu | B32B 27/08 428/212 |
| 2010/0276607 | A1 * | 11/2010 | Wanzenboeck | H01J 37/261 427/533 |
| 2011/0181688 | A1 | 7/2011 | Miyamoto et al. | |
| 2012/0104253 | A1 * | 5/2012 | Tsuneta | H01J 37/263 250/307 |
| 2012/0217152 | A1 * | 8/2012 | Miller | H01J 37/3053 204/192.34 |
| 2012/0228641 | A1 * | 9/2012 | Thoumazet | H02S 40/20 428/218 |
| 2013/0200270 | A1 * | 8/2013 | Smit | G05D 23/00 165/300 |

FOREIGN PATENT DOCUMENTS

| | | |
|---|---|---|
| GB | 2258083 | 1/1993 |
| JP | 2007527326 | 9/2007 |
| WO | 1997/40493 | 10/1997 |
| WO | 2002/45125 | 6/2002 |

OTHER PUBLICATIONS

Lifshin et al., "Three Dimensional Imaging of Microelectronic Devices Using a CrossBeam FIB", Proceedings from the 30th Annual International Symposium for Testing and Failure Analysis, Nov. 14-18, 2004, Worcester, Massachusetts, pp. 429-435.

Principe, "High Density FIB-SEM 3D Nanotomography: With Applications of Real-Time Imaging During FIB Milling", Chapter 6, 2007. 23 pages.

Principe, "Application of FIB in Combination With Auger Electron Spectroscopy", Chapter 15, Introduction to Focused Ion Beams: Instrumentation, Theory, Techniques, and Practice, L. Giannuzzi, F. Stevie (Eds.), Elsevier, 2004, pp. 301-327.

Reimer, "Scanning electron microscopy", Scanning electron microscopy, Dec. 31, 1985, XP055145353, pp. 1-3.

(56) References Cited

OTHER PUBLICATIONS

Tapia et al., "High contrast en bloc staining of neuronal tissue for field emission scanning electron microscopy", Nat Protoc, Jan. 12, 2012, vol. 7, No. 2, pp. 193-206.
Uchich et al., "Three-Dimensional Microstructural Characterization Using Focused Ion Beam Tomography", Contributor to a special issue of MRS Bulletin: Focused Ion Beam Microscopy and Micromaching, vol. 32, May 6, 2007, 19 pages.
International Search Report and Written Opinion dated Jul. 31, 2012, issued in corresponding International Application No. PCT/CA2012/050316.
International Preliminary Report on Patentability dated Nov. 28, 2013, issued in corresponding International Application No. PCT/CA2012/050316.
European Search Report dated Jul. 22, 2019, issued in corresponding European Patent Application No. 18211266.
Office Action dated Jul. 23, 2020, issued in corresponding European Patent Application No. 18211266.
Office Action dated Mar. 1, 2017 from European Patent Application No. 12785045.1.
Office Action dated Feb. 23, 2016 from European Patent Application No. 12785045.1.
Extended European Search Report dated Oct. 20, 2014 from European Patent Application No. 12785045.1.
Office Action dated Sep. 17, 2019 issued in corresponding Canadian Application No. 2,835,713.
Office Action dated Feb. 3, 2022 issued in corresponding Canadian Application No. 2,835,713.
Office Action dated Mar. 25, 2021 issued in corresponding European U.S. Appl. No. 18/211,266.
Office Action dated Nov. 10, 2017 issued in corresponding Canadian Application No. 2,835,713.
Office Action dated Oct. 15, 2018 issued in corresponding Canadian Application No. 2,835,713.
Non-Final Office Action dated Aug. 28, 2023 issued in U.S. Appl. No. 17/937,510.
List of References issued Aug. 28, 2023 issued in U.S. Appl. No. 17/937,510.

* cited by examiner

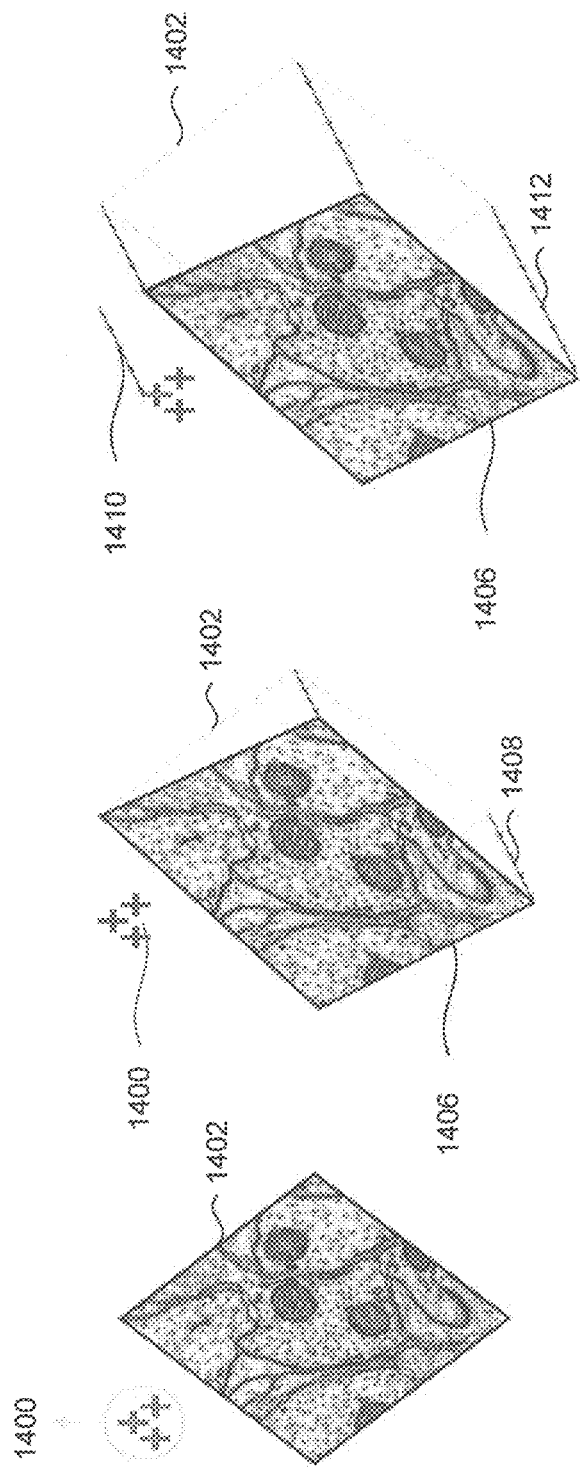

MICROSCOPY IMAGING METHOD FOR 3D TOMOGRAPHY WITH PREDICTIVE DRIFT TRACKING FOR MULTIPLE CHARGED PARTICLE BEAMS

CROSS REFERENCE TO RELATED APPLICATIONS

This application is a continuation of U.S. application Ser. No. 17/138,329, filed on Dec. 30, 2020, which is a continuation of U.S. application Ser. No. 16/784,708, filed Feb. 7, 2020, now issued as U.S. Pat. No. 10,886,100, which is a continuation of U.S. application Ser. No. 15/783,054, filed Oct. 13, 2017, now issued as U.S. Pat. No. 10,586,680 which is a continuation of U.S. application Ser. No. 15/420,844, filed on Jan. 31, 2017, now issued as U.S. Pat. No. 9,812,290 on Nov. 7, 2017, which is a continuation of U.S. application Ser. No. 14/117,256, filed on Nov. 12, 2013, now issued as U.S. Pat. No. 9,633,819 on Apr. 25, 2017, which claims the benefit of priority of U.S. Provisional Patent Application No. 61/485,713 filed May 13, 2011, which are incorporated herein by reference.

FIELD

The present disclosure relates generally to charged particle beam (CPB) systems. More particularly, the present disclosure relates to imaging a material surface using a rastered beam system.

BACKGROUND

Examples of CPB systems include Scanning Electron Microscope (SEM) systems, Focused Ion Beam (FIB) systems and hybrids that include both CPB types, which are commonly known as "Dual Beam" or "Cross Beam" microscope systems. A Focused Ion Beam system is commonly referred to as a FIB. FIB systems produce a narrow, focused beam of charged particles, and scan this beam across a specimen in a raster fashion, similar to a cathode ray tube. Unlike the SEM, whose charged particles are negatively charged electrons, FIB systems use charged atoms, hereinafter referred to as ions, to produce their beams. These ions are, in general, positively charged. Note also that CPB systems may include multiple ion beams or multiple electron beams, perhaps in combination with each other.

These ion beams, when directed onto a sample, will eject charged particles, which include secondary electrons, secondary ions ($i^+$ or $i^-$), and neutral molecules and atoms from the exposed surface of the sample. By moving the beam across the sample and controlling various beam parameters such as beam current, spot size, pixel spacing, and dwell time, the FIB can be operated as an "atomic scale milling machine," for selectively removing, or sputtering, materials wherever the beam is placed. The dose, or amount of ions striking the sample surface, is generally a function of the beam current, duration of scan, and the area scanned. The ejected particles can be sensed by detectors, and then by correlating this sensed data with the known beam position as the incident beam interacts with the sample, an image can be produced and displayed for the operator. The imaging capability of FIB systems, and of similar CPB systems, is advantageous for many applications where it is necessary or beneficial to analyze structures or features having nano scale sizes.

FIG. 1 is a schematic of a typical CPB system 10. This CPB system 10, also referred to as a dual beam or cross beam system, includes a vertically mounted SEM column and a focused ion beam (FIB) column mounted at an angle from vertical (although alternate geometric configurations also exist). A scanning electron microscope 41, along with power supply and control unit 45, is provided with the dual beam system 10. An electron beam 43 is emitted from a cathode 52 by applying voltage between cathode 52 and an anode 54. Electron beam 43 is focused to a fine spot by means of a condensing lens 56 and an objective lens 58. Electron beam 43 is scanned two-dimensionally on the sample by means of a deflection coil 60. Operation of condensing lens 56, objective lens 58, and deflection coil 60 is controlled by power supply and control unit 45. Electron beam 43 can be focused onto sample 22, which is on movable stage 25 within lower chamber 26. When the electrons in the electron beam strike sample 22, various types of electrons are emitted. These electrons may be detected by various detectors within the electron column or they may detected by one or more electron detectors 40 external to the column.

Dual beam system 10 also includes focused ion beam (FIB) system 11 which comprises an evacuated chamber having an upper neck portion 12 within which are located an ion source 14 and a focusing column 16 including extractor electrodes and an electrostatic optical system. The axis of focusing column 16 is tilted at an angle, such as 54 degrees from the axis of the electron column by example. The ion column 12 includes an ion source 14, an extraction electrode 15, a focusing element 17, deflection elements 20, and a focused ion beam 18. Ion beam 18 passes from ion source 14 through column 16 and between electrostatic deflection means schematically indicated at 20 toward sample 22, which comprises, for example, a semiconductor device positioned on movable stage 25 within lower chamber 26.

Stage 25 can preferably move in a horizontal plane (X and Y axes) and vertically (Z axis). Stage 25 can be tilted and rotated about the Z axis. A door or load lock 61 is opened for inserting sample 22 onto X-Y stage 25 and also for servicing an internal gas supply reservoir, if one is used. The door is interlocked so that it cannot be opened if the system is under vacuum.

An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. If performing gas assisted processes such as etching or deposition, an etch retarding gas, or a deposition precursor gas is used, the chamber background pressure may rise, typically to about $1\times10^{-5}$ Torr.

The high voltage power supply provides an appropriate acceleration voltage to electrodes in ion beam focusing column 16 for energizing and focusing ion beam 18. When it strikes sample 22, material is sputtered, that is physically ejected, from the sample. Alternatively, ion beam 18 can decompose a precursor gas to deposit a material on the surface of the sample.

High voltage power supply 34 is connected to liquid metal ion source 14 as well as to appropriate electrodes in ion beam focusing column 16 for forming an approximately 1 keV to 60 keV ion beam 18 and directing the same toward a sample. Deflection controller and amplifier 36, operated in accordance with a prescribed pattern provided by pattern generator 38, is coupled to deflection plates 20 whereby ion beam 18 may be controlled manually or automatically to trace out a corresponding pattern on the upper surface of sample 22. The liquid metal ion source 14 typically provides a metal ion beam of gallium. The source typically is capable of being focused into a sub one-tenth micrometer wide beam at sample 22 for either modifying the sample 22 by ion milling, enhanced etch, material deposition, or for the purpose of imaging the sample 22. Note that newer source technologies such as plasma, gas field ion sources and/or atomic level ion sources will produce other ionic species besides gallium.

A charged particle detector 240 used for detecting secondary ion or electron emission is connected to a video circuit 42 that supplies drive signals to video monitor 44 and receiving deflection signals from controller 19. The location of charged particle detector 40 within lower chamber 26 can vary in different configurations. For example, a charged particle detector 40 can be coaxial with the ion beam and include a hole for allowing the ion beam to pass. In other configurations, secondary particles can be collected through a final lens and then diverted off axis for collection.

A micromanipulator 47 can precisely move objects within the vacuum chamber. Micromanipulator 47 may include precision electric motors 48 positioned outside the vacuum chamber to provide X, Y, Z, and theta control of a portion 49 positioned within the vacuum chamber. The micromanipulator 47 can be fitted with different end effectors for manipulating small objects.

A gas delivery system 46 extends into lower chamber 26 for introducing and directing a gaseous vapor toward sample 22. For example, xenon difluoride can be delivered to enhance etching, or a metal organic compound can be delivered to deposit a metal.

A system controller 19 controls the operations of the various parts of dual beam system 10. Through system controller 19, an operator can control ion beam 18 or electron beam 43 to be scanned in a desired manner through commands entered into a conventional user interface (not shown).

In recent years, two and three dimensional imaging of large areas and volumes in a charged particle beam system such as SEM, FIB, or SEM/FIB combination microscope has attracted significant interest. Commercial systems such as the Carl Zeiss ATLAS two dimensional imaging system along with three dimensional imaging systems such as the FEI Company "Slice and View" along with methods described in U.S. Pat. No. 7,312,448 B2 have been available commercially. These techniques are generally performed on "bulk" samples, where the charge particle beam penetrates but does not transmit through the sample. It should be noted that this is quite different from the technique of electron tomography, which relies on the charged particle beam passing through the sample in transmission. While electron tomography is a well established technique in transmission electron microscopy, and can yield three dimensional datasets, these datasets are limited in scale due to the necessity of passing the electron beam completely through the sample and detecting it on the other side.

The aforementioned "ATLAS" two-dimensional and "Slice and View" style three dimensional techniques are sophisticated in their own right, however they both approach the problem of acquiring large datasets in a similar "step and repeat" fashion. In both cases a two-dimensional area is imaged either as a single image or as a collection of image "tiles" that may be "stitched" together to form a larger mosaic. Two-dimensional techniques tend to perform this step and repeat imaging over much larger areas than three-dimensional techniques, however three-dimensional techniques also remove a thin "slice" of material, then repeat the imaging process so as to build up a three dimensional dataset. This slice of material may be removed in several ways known in the art, including the use of a focused ion beam (typically at glancing angle, but occasionally closer to normal incidence), a broader ion beam which is often combined with some sort of mechanical beam stop to create a sharp edge, or an in-microscope ultramicrotome whose knife cuts away each slice.

CPB systems, such as FIBs or SEMs, have been used prevalently in the past for imaging small regions of a sample at high resolution. In the field of semiconductor circuits for example, typical structures being imaged include transistor devices and other small structures having dimensions from a few nanometers up to a few microns. In recent years, bio-medical applications are emerging in which higher resolution images for a large area of a sample are desired using the aforementioned 2D and 3D imaging techniques, and combining FIB and SEM. For example, imaging of a tissue sample having an area of 100×100 microns may be required in order to facilitate visual identification of a particular structure of interest which may be present. Accordingly, a high resolution image of the entire area is required, otherwise it may not be possible to visually identify the structure of interest. Furthermore, the particular structure of interest may lie within a plane different from the exposed area being imaged. In this example, if the imaged area of the sample is defined by an x-y plane, then the tissue sample has a depth component, z. Therefore sections of the tissue sample are taken at predetermined depths and the newly exposed area is imaged.

The problem with currently known techniques is the large amount of time required to image large volume samples at high resolution. The increasing demand for 3D high resolution images of 100 μm×100 μm×100 μm volume samples is problematic. Typically sections are prepared ~15 μm Sections @ ~3 nm pixels with ~9 nm depth per slice using a FIB; more typically three times this depth per slice is all that can be achieved using other sectioning methods which can be used. Typical dwell times for the electron beam are on the order of 1 μs per pixel in order to obtain sufficient signal to noise. At 3 nm voxels with a dwell point time of 1 μs, 20 minutes of imaging time alone per section are required, and about 110 hours per μm of depth sectioned, which must be multiplied by 100 to section through 100 um of depth, and this is imaging time alone, i.e. it is assumed sectioning occurs concurrently or near instantly. Therefore a total of about 1.5 years of time is required to image a 1,000,000 μm³ cube, assuming that the CPB system is capable of operating for this continuous period of time without malfunction or interruption, or the sample undergoing sectioning can be reacquired and realigned in an acceptable manner. Another issue related to imaging large areas is the fact that the sample is vulnerable to "drifting" during the imaging process, in which the sample moves due to mechanical variations in the stage supporting the sample, and/or thermal effects on the environment of the microscope.

It is, therefore, desirable to provide a method and system for reducing the amount of time required for CPB imaging while maintaining accuracy.

SUMMARY

It is an object of the present disclosure to obviate or mitigate at least one disadvantage of previous CPB systems.

In a first aspect, there is provided a selective high resolution imaging method for a charged particle beam apparatus. The method includes acquiring and displaying a sample area image of a sample at a first resolution; scanning at least one exact region of interest in the sample area image; and acquiring and displaying an image of the at least one exact region of interest at a second resolution greater than the first resolution.

According to the embodiments of the present aspect, the sample can be cross-sectioned to expose a new surface, of which the same exact region of interest is imaged at the second resolution. This sequence of sectioning and imaging the exact region of interest can continue until a new sample area image of the sample at the first resolution is requested. At this time, new exact regions of interest can be added, or the previous exact region of interest can be modified.

In yet further embodiments, alignment vernier notches can be formed on the sample, which are visible as a pair of objects in cross-section that approach each other in distance as further cross-sections of the sample are taken. Comparisons of the notch distances from a current to previous cross-section can be used to determine the exact cross-section thickness, for the purposes of adjusting a milling rate of the FIB.

According to further embodiments, any beam of the charged particle beam apparatus can be controlled with accuracy by use of a multi-digital to analog circuit, which receives a primary digital code corresponding to a primary deflection voltage for moving a position of the focused ion beam, and at least one additional digital code proximate to the primary digital code for generating a secondary deflection voltage. These deflection voltages are averaged to provide a final deflection voltage.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIGS. 26B, 26C and 26D are example diagrams of image drift;

DETAILED DESCRIPTION

Generally, the present disclosure provides a method and system for improving imaging efficiency for CPB systems while maintaining or improving imaging accuracy over prior CPB systems. According to the present embodiments, a large field of view image of a sample is acquired at a low resolution and thus, at high speed. The low resolution level is selected to be sufficient for an operator to visually identify structures or areas of interest on the low resolution image. The operator (or an image analysis subsystem, which will be considered another type of "operator") can select one or more small areas of arbitrary shape and size on the low resolution image, referred to as an exact region of interest (XROI). The outline of the XROI is mapped to an x-y coordinate system of the image, and the CPB system is then controlled to acquire a high resolution image of only the XROI identified on the low resolution image. For 3D imaging, once the XROI is identified, each section of the sample can be iteratively imaged in the previously described manner, with the operator having the option to redefine the XROI later. The operator may also observe the information contained in the XROI image data and redefine the XROI based on this information.

Figure 1:
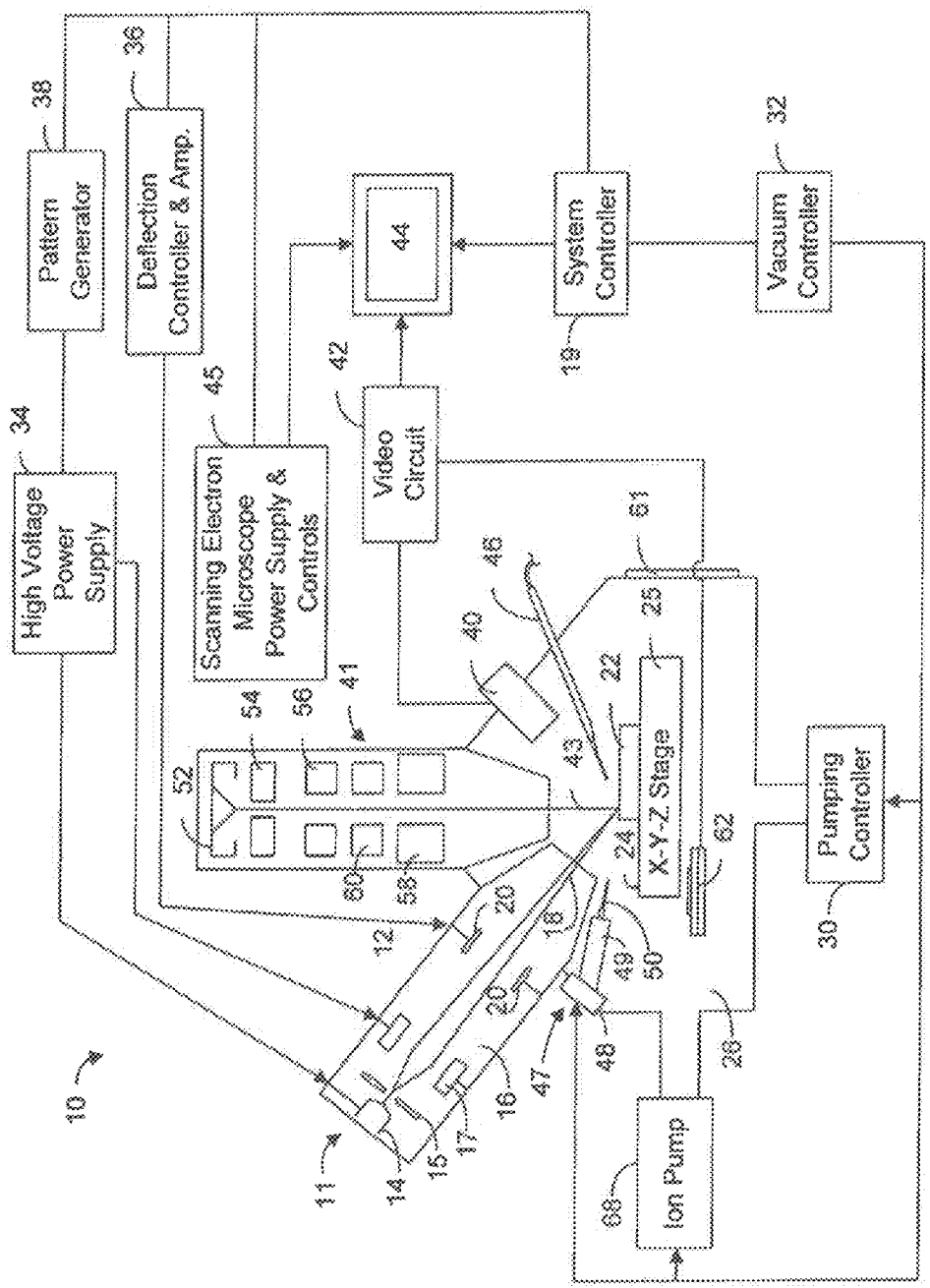
FIG. 1 is a schematic of a known CPB system.
Figure 2:
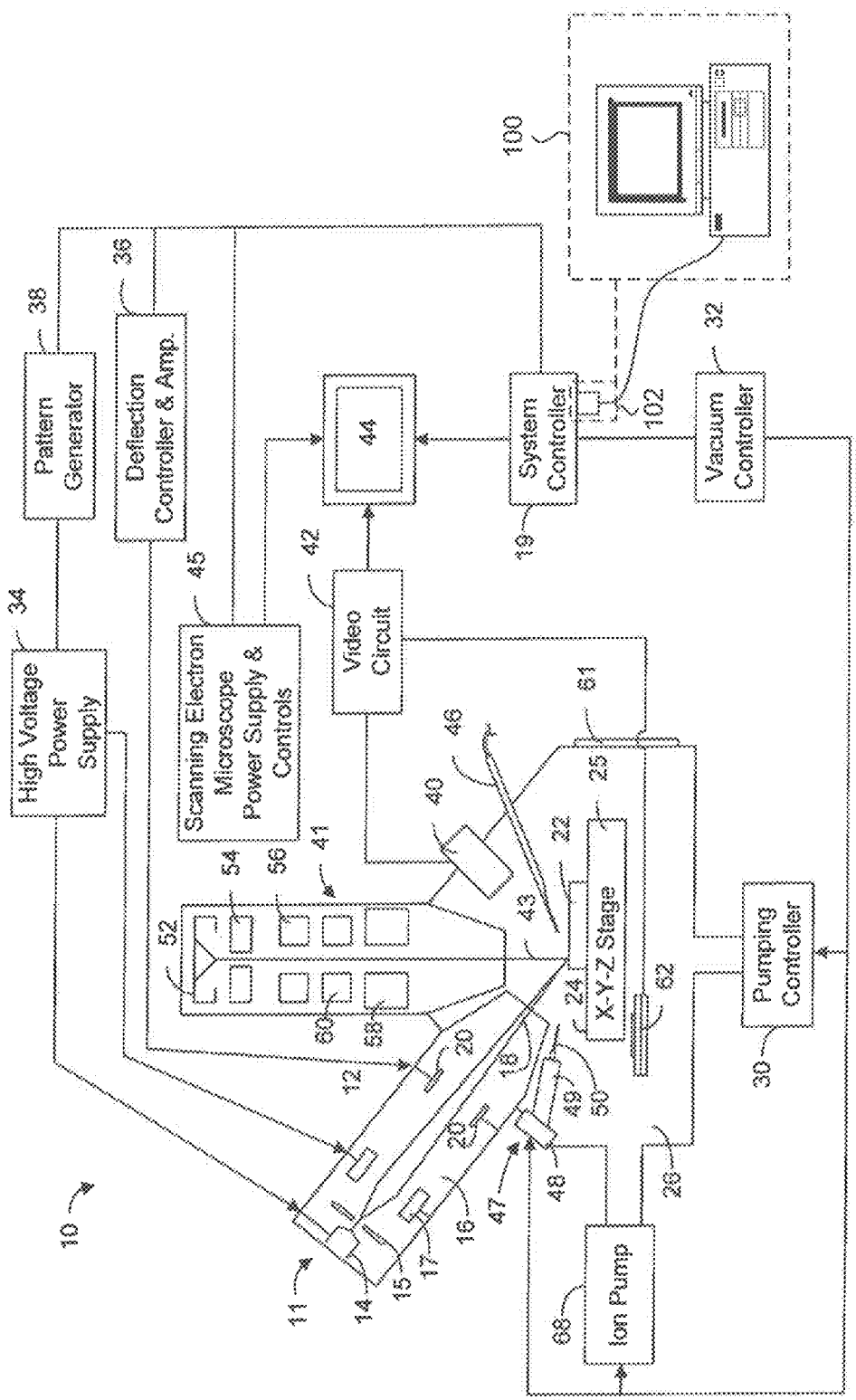
FIG. 2 is a schematic of a CPB system and a CPB workstation, according to an embodiment of the present invention.

FIG. 2 is a block diagram showing the general relationship between the same CPB system 10 shown in FIG. 1 and a CPB workstation 100, according to an embodiment of the present invention. CPB workstation 100 can be a separate system that runs its own image and data processing algorithms independently of CPB system 10. More importantly, CPB workstation 100 is configured to control various aspects of CPB system 10. Alternately, control, image and data processing systems can be integrated into the host CPB system. CPB workstation 100 can be used to "retro-fit" older CPB systems while the functionality of CPB workstation 100 can be integrated during assembly/design of newer CPB systems. According to the present embodiments, the CPB system 10 is a dual beam FIB-SEM system, which uses the FIB to mill the sample and the SEM to image the sample. For ease of reference, the term CPB system should be understood to include the aforementioned dual beam FIB-SEM system. The presently described embodiments are applicable to CPB systems in which a single column does both imaging and sectioning of the sample.

Many CPB systems have an accessible console with removable boards inserted therein to control particular functions of the CPB system 10. Preferably, CPB workstation 100 includes a microprocessor, memory and mass storage, typically embodied as a computer workstation with a monitor, and a CPB system hardware interface 102 which can be connected to the system controller 19 of the CPB system 10. In the presently shown embodiment of FIG. 4, a cable is the means for communicating the data, including but not limited to image data, to the workstation. However, any transmission means can be used, including directly or indirectly supplying analog deflection voltages to control the position(s) of the beam(s). The CPB workstation 100 is an active system which can control operational functions of the CPB system, such as the pattern generator 38, deflection controller 36 and the stage 25, while receiving video data from video circuit 42 and any other. In general, CPB workstation 100 can respond to data from the CPB system 10 and execute operations to control the CPB system 10 in return.

The presently described embodiments are executed by the CPB workstation 100 for controlling the CPB system 10 components to improve imaging throughput while maintaining image quality. In a first embodiment, referred to as a selective high resolution imaging method, only specific regions of interest on a 2D large field of view image of a sample are acquired by the CPB system 10. Therefore, significant time savings are obtained because the entire large field of view is not imaged at high resolution. In the present embodiments, any number of specific regions of interest, referred to as exact regions of interest (XROI) can be inputted to the CPB workstation 100 for acquiring high resolution images thereof, or a series of image resolution levels from low to high resolution.

Figure 3:
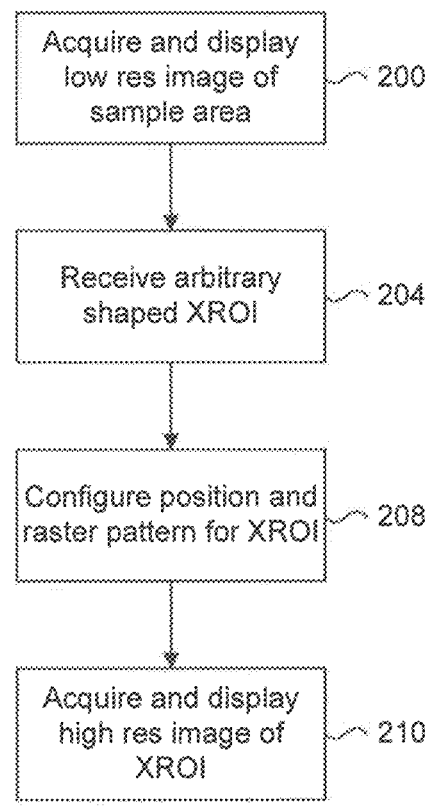
FIG. 3 is a flow chart of a selective high resolution imaging method, according to an embodiment of the present invention.
Figure 4:
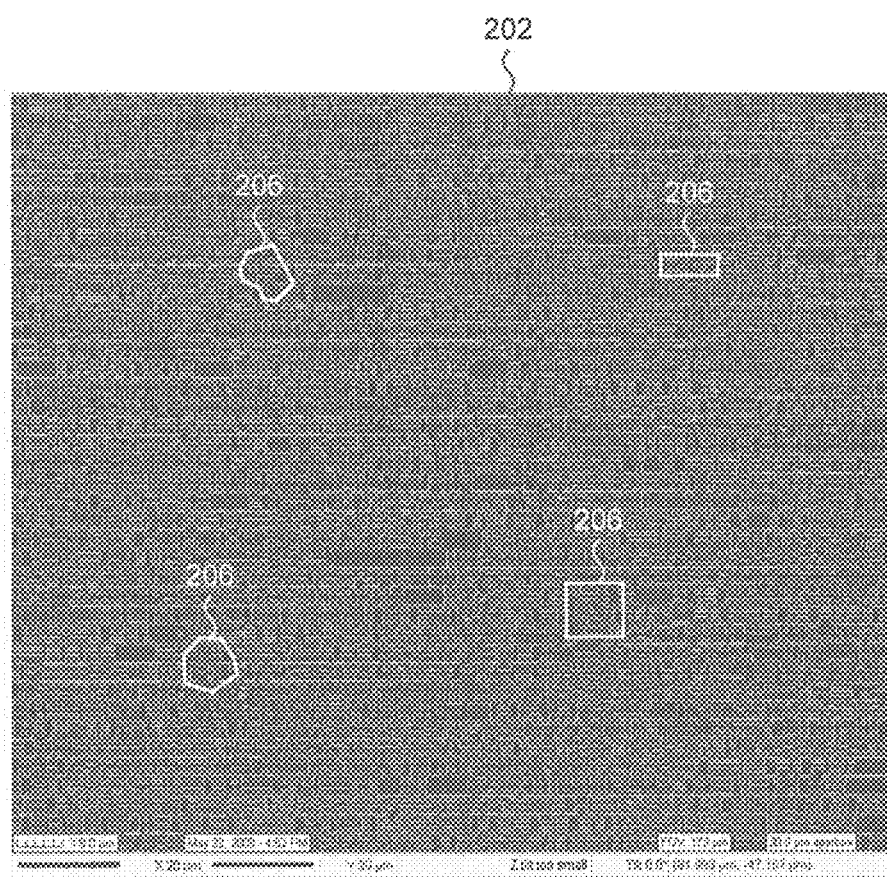
FIG. 4 is an example extreme field of view image generated by the CPB workstation of the present embodiments.
Figure 5:
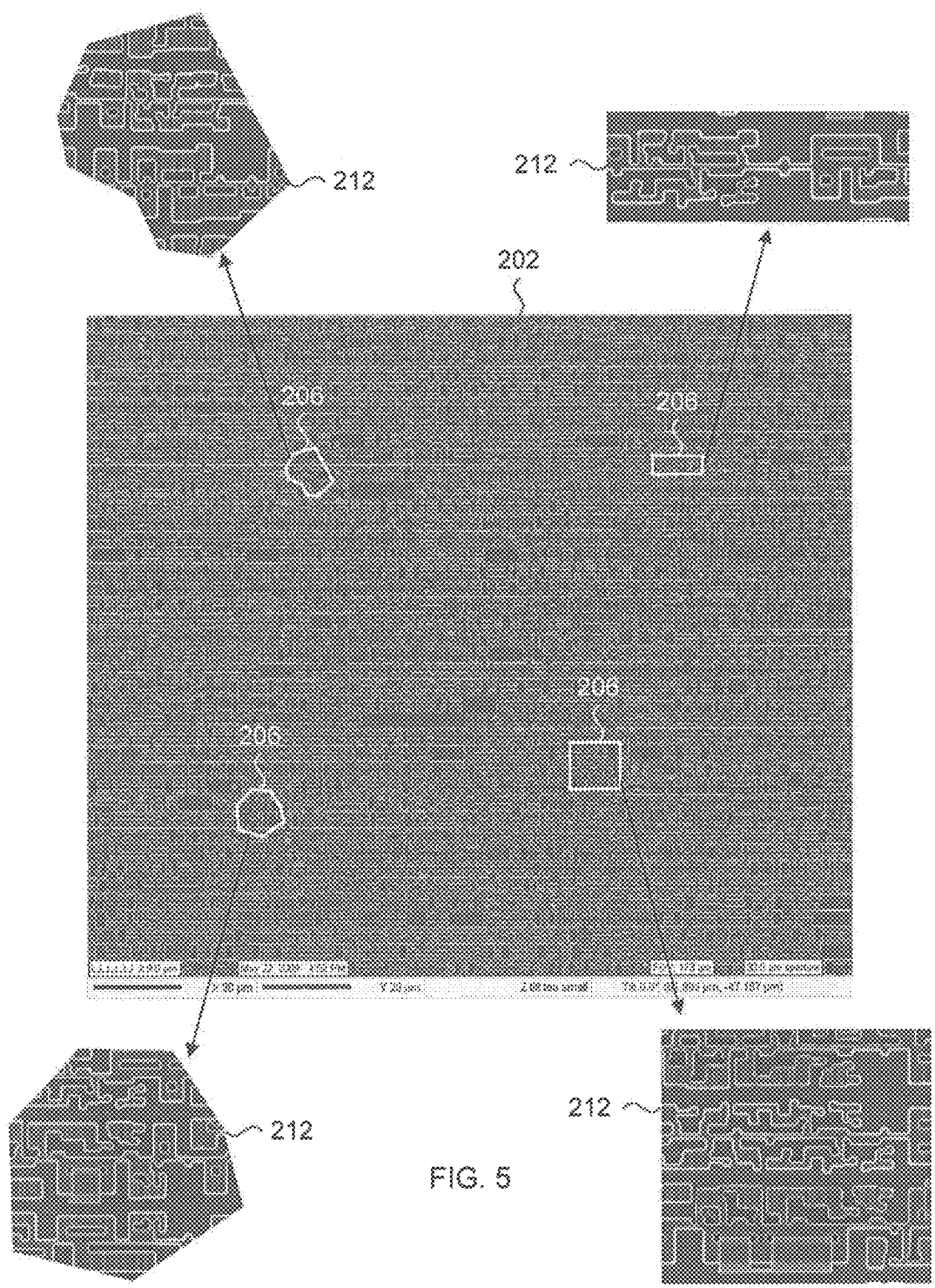
FIG. 5 is an example extreme field of view image with high resolution images of selected exact regions of interest generated by the CPB workstation of the present embodiments.

FIG. 3 is a flow chart outlining an embodiment of the selective high resolution imaging method, which is described with reference to the example images shown in FIG. 4 and FIG. 5. It is assumed that the operator has visually identified a large region of the sample for which an image is desired from either the native visual terminal of the CPB system 10 or the visual terminal of the CPB workstation 100. Alternately, this information can be determined by an image analysis subsystem using information obtained from correlative techniques such as optical microscopy, coupled with an alignment phases wherein the data from these correlative techniques is mapped spatially into the frame of reference of the CPB system, potentially defining XROIs in (X,Y,Z) coordinates in advance of any sectioning and imaging being performed. At step 200, the operator selects a large area of the sample to image, by creating an outline of a region of desired size and shape on the visual terminal. The CPB system 10 is then controlled to acquire a low resolution image of the selected area. This is generally done by controlling the electron beam to raster over the area. If the area is too large, then the CPB workstation 100 will control the CPB system 10 to acquire individual tiles of predetermined area and shape, and subsequently mosaic them together to generate the final image. The stage may need to be moved to a different position for acquiring an image for the next adjacent tile. This can be done under control of the CPB workstation 100. This is referred to as an extreme field of view (XFOV) image, shown in FIG. 4 as image 202 by example. The low level resolution is selectable by the operator based on the level of detail deemed sufficient to identify particular structures or areas of interest for further analysis. For example, the resolution can be set to 30 nm pixels, which is relatively fast to image, and far improved relative to the prior art technique of acquiring the entire XFOV image at the high resolution of a 3 nm pixel size.

This low resolution XFOV image 202 is displayed for the operator, who can analyze the image and determine the presence of one or more desirable XROI. At 204, the operator can create an outline of any arbitrary shape on image 202, indicating a desired XROI. This is shown in FIG. 4 as XROI outlines 206, which can be applied using the interface of CPB workstation 100. It can be seen from FIG. 4 that the XROI outlines 206 can have rectangular, square and round-type outlines. Because the XFOV image 202 is calibrated to an x-y coordinate system, the location of XROI outlines 206 are thus known. At 208, the CPB workstation 100 receives and processes the XROI outlines 206, for the purposes of configuring the position of the outlines and to generate corresponding raster patterns for directing the beam rastering to be confined within the XROI outlines 206 only. This may involve moving the stage to properly position the sample for rastering the XROI. At this point in time, the operator can optionally select a desired higher resolution level for imaging the areas within XROI outlines 206. At 210, the beam is controlled according to the raster patterns and the set resolution, and higher resolution images corresponding to the XROI outlines 206 are generated and displayed. FIG. 5 shows the resulting higher resolution images 212 corresponding to XROI outlines 206 of the low resolution image 202, generated by the CPB workstation 100. If desired, the operator can repeat the process by selecting a further XROI within the images 212 with an even higher allowable resolution. According to one embodiment, the higher resolution images 121 can be displayed within their own windows of the video monitor of CPB workstation 100, thereby allowing the operator to zoom in and pan for detailed visual inspection of the image. Note that the term rastering is used for convenience to describe the process by which the beam is scanned across the sample, however it is understood than many different scanning strategies may be employed to obtain the optimal image quality and speed, and these scanning strategies are collectively termed "rastering" for convenience.

Figure 6:
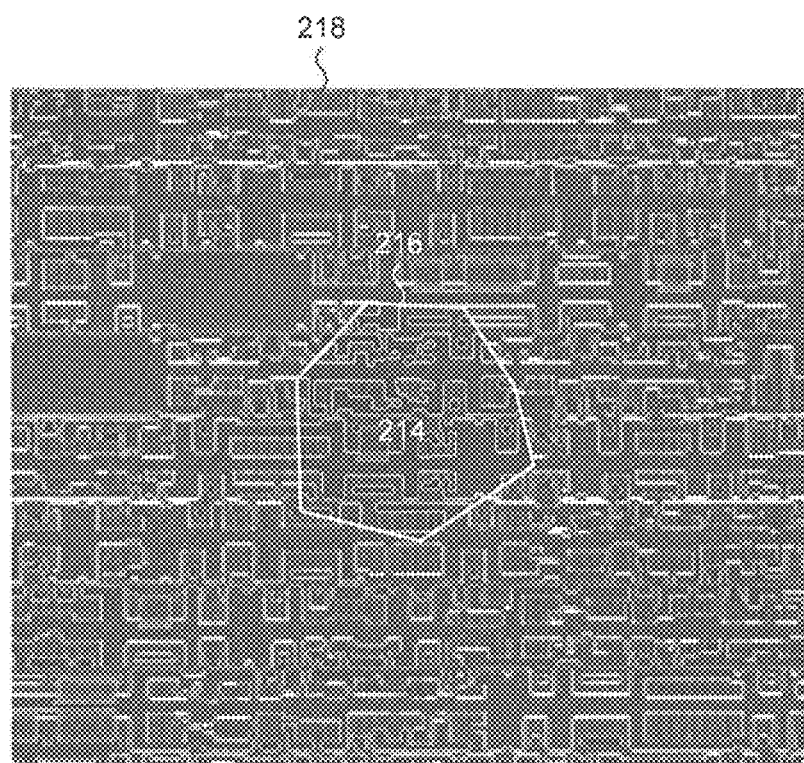
FIG. 6 is an example extreme field of view image with overlayed high resolution images of the selected exact regions of interest generated by the CPB workstation of the present embodiments.

To enhance the context of the higher resolution images 212, the CPB workstation 100 can overlay the higher resolution images 212 over the low resolution XFOV image 202 so that the operator can generally view the structures surrounding the higher resolution image areas. An example of this is shown in FIG. 6, where a high resolution image 214 has been overlayed onto the position of an XROI outline 216 of low resolution image 218. Once again, because the x-y coordinates of the XROI outlines 206 are known relative to the XFOV image 202, the high resolution image 214 can be positioned within outline 216 via image processing by CPB workstation 100.

Accordingly, it is not necessary to image the entire XFOV image 202 at high resolution, as this would consume a significant amount of time when the area of interest may only occupy a small portion of the image. Therefore, the combination of acquiring a low resolution image of the large XFOV area at high speed followed by selective high resolution image acquisition of smaller XROI areas improves can significantly improve the overall imaging throughput of the XROI at high resolution, relative to the prior art schemes. The final images can be subjected to graphical post-processing, such as for example by adding virtual colouring to features having the same particular grey-shading intensities.

Another factor for improving overall imaging throughput is the ability to select XROI outlines of shapes which can approximate the outline of an area of interest. As shown in the previous example images, choosing a precise XROI, rather than being limited to merely scanning a rectangle that contains the region of interest, allows a reduction in the number of pixels to be scanned, thus increasing throughput. Any other improvements to the system, such as signal to noise, detector efficiency, beam current and spot size improvements, merely make the XROI approach more efficient. For example, a common yeast cell is approximately spherical. It is known that the volume of a cube of diameter D is approximately twice the volume of a sphere of diameter D. Thus, if one is constrained to imaging a constant rectangular or square area, the CPB system requires approximately twice as long to image relative to imaging a circular XROI. Equations 1 and 2 below mathematically illustrate this relationship.

$$V_{Cube} = D^3 \quad \quad \text{Equation (1)}$$

$$V_{Sphere} = \frac{4}{3}\pi r^3 \cong \frac{1}{2}D^3 \quad \quad \text{Equation (2)}$$

The previously discussed selective high resolution imaging method throughput benefits are significantly scaled when applied to generating data for 3D reconstruction of a sample. This is due to the fact that for each new section of the sample, a new image of a region of interest taken at high resolution is acquired. As previously discussed, the prior art technique of obtaining high resolution images of a large area XFOV for a plurality of sections can be unacceptably long.

Figure 7:
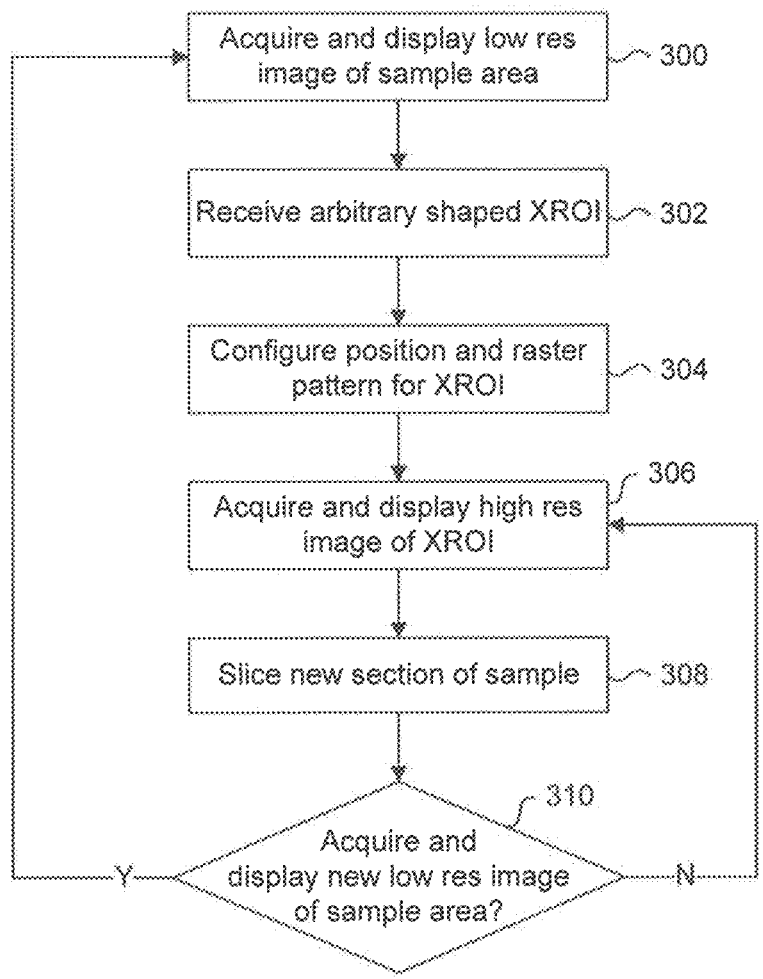
FIG. 7 is a flow chart of a selective high resolution imaging method for 3D imaging applications, according to a present embodiment.
Figure 8:
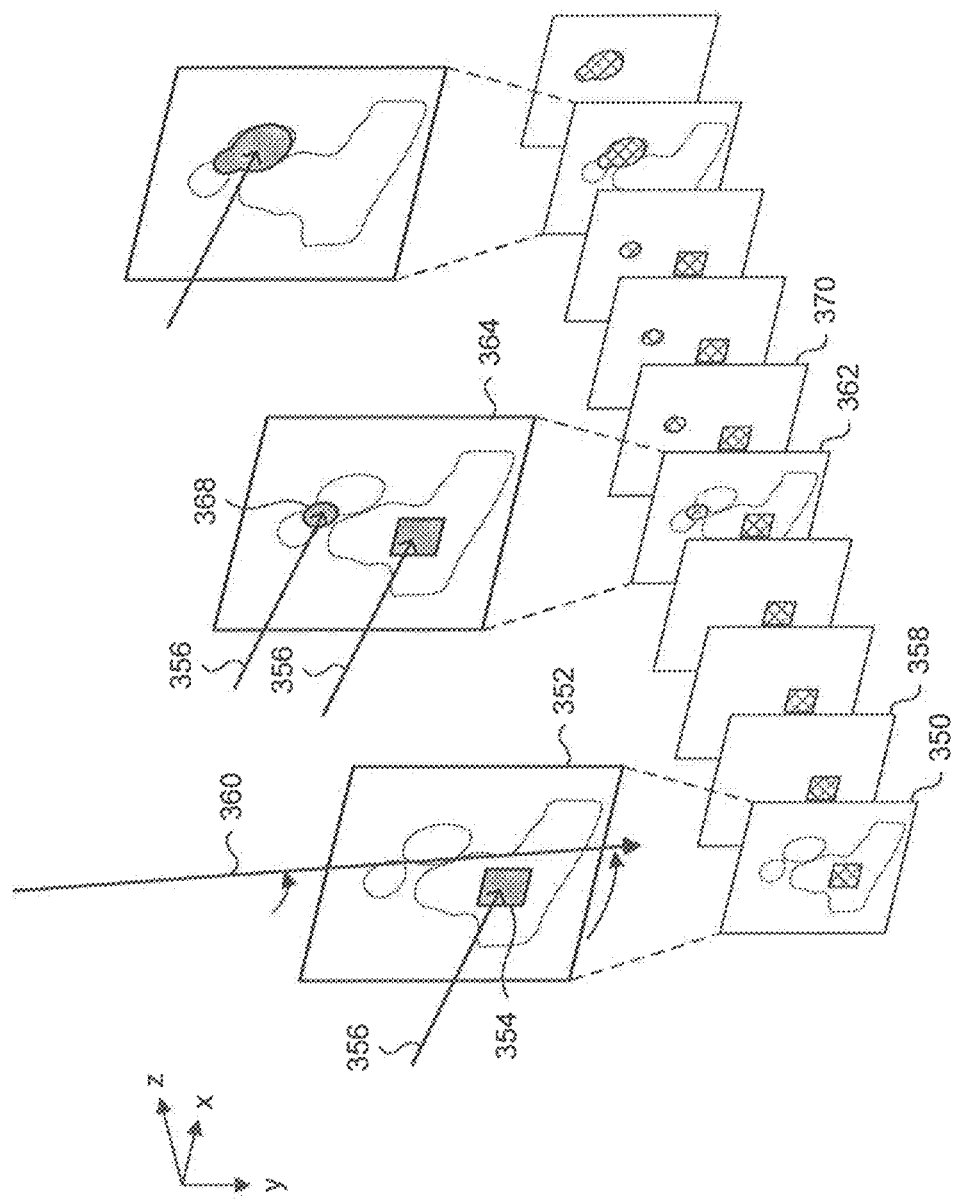
FIG. 8 is an illustration showing a sequence of images obtained for each section of a sample, according to the method of FIG. 7.

FIG. 7 is a flow chart outlining an alternate embodiment of the selective high resolution imaging method, adapted for 3D imaging applications. It is noted that processes 300, 302, 304 and 306 are the same as processes 200, 204, 208 and 210 of the method of FIG. 3. The 3D selective high resolution imaging method of FIG. 7 is now discussed with reference to the diagram of FIG. 8. The diagram of FIG. 8 is an illustration of the sequence of images obtained for each section, or slice, of the sample. Starting at 200, a low resolution image of the sample area is acquired by the CPB system for display on a monitor of the CPB workstation 100. This image is referred to as a key frame image. In FIG. 8, this first key frame image 350 appears at the left-most side, and includes image information for visual display to the operator. Key frame image 352 is an enlarged version of key frame image 350 to better illustrate some displayed features. At 302, the operator will identify an area of interest on the key frame image 352, and add XROI outline 354 on the display. This information is received and processed by the CPB workstation 354. At 304, the CPB workstation 100 configures the raster pattern and position for the CPB system 10, and at 306, a high resolution image of only the area outlined by XROI outline 354 is displayed on the monitor of the CPB workstation 100. Imaging at 306 is executed by rastering the electron beam 356 within the XROI outline 354. As shown in FIG. 8, the high resolution image corresponding to XROI outline 354 appearing on the monitor of CPB workstation 100 is frame 358.

Now that the region of interest of the current section of the sample has been imaged at high resolution, the method proceeds to 308 where a new section of the sample is obtained. In FIG. 8, the FIB beam 360 which rasters side to side in the x-axis, is advanced by a predetermined distance or depth in the z-axis, ie. towards the right side of the diagram, and activated to cut away the sample material to expose a new sample surface. Note it is also possible that the FIB beam is advanced in smaller increments in a more continuous manner than in the discrete steps described above. Returning to FIG. 7, the method then proceeds to 310 to determine if a new low resolution key frame image is required. This is typically determined by the operator who can control the CPB system 10 via controls of the CPB workstation 100 to request a new key frame. If no key frame is required, the method returns to 306 for acquisition and display of a high resolution image of the same XROI outline 354, for the new sample surface. Processes 306, 308 and 310 loop iteratively until the operator decides to terminate image acquisition, or until the operator determines that a new key frame image is required. This is due to the fact that during the iterations of 306, 308 and 310, the monitor displays only the acquired high resolution image defined by XROI outline area 354. Therefore, other structures surrounding this area cannot be seen.

In the present example of FIG. 8, after the fourth frame, the operator decides at 310 that a new key frame image is required. The method then returns to 300 and the CPB system 10 acquires new key frame image 362 in FIG. 8, shown in enlarged format as key frame image 364. As previously mentioned, this is done by scanning the entire sample area at low resolution, which may involve iteratively imaging an area, moving the stage to image another area, and tiling the resulting images together. At 302, the operator can add or remove XROI outlines. In the present example, a new XROI outline 368 is added to the displayed image by the operator, which is received and processed by the CPB workstation 100 at 302. After processes 304 and 306 are executed by the CPB system 10, the resulting image frame 370 is displayed for the operator. As shown in FIG. 8, only high resolution images for original XROI outline 354 and for new XROI outline 368 are shown in image frame 370. Then the system iteratively sections and images these regions automatically.

By periodically acquiring "Key Frame" images of the entire sectioned surface of interest, this allows the automatic or manual selection of new XROI's that may appear during sectioning, and the dynamic changing of the existing XROIs. Note that the image data from each (typically higher resolution XROI) can also be interrogated to determine if, on the next or future XROI imaging passes, the boundaries of the XROI should be modified.

According to a further embodiment, of the present invention, overall imaging throughput can be increased by examining a particular region of interest and determining based on pixel intensity of a rapidly acquired lower resolution image, whether an area should be scanned. For example, when imaging biological material stained using common protocols that introduce heavy metals into the tissue, and observing/detecting backscattered electrons with inverted contrast (as is common), tissue appears dark (more signal, resulting in a dark pixel when observing with inverted contrast), and embedding material appears brighter (less signal, resulting in a bright pixel when observing with inverted contrast). These images can be processed (including Key Frames or XROIs) to detect regions containing only embedding material, and avoid imaging these regions of embedding material, or avoid imaging regions of embedding material that are sufficiently distant from regions that are identified as not being embedding material (thus imaging regions of embedding material near what may be true sample), so as to increase throughput.

Alternately, it is possible to analyse the signal as it is being accumulated within a single pixel or dwell point, and determine during a subsampling time, such as the initial subsampling time, for that pixel whether sufficient signal has been detected to expect that pixel is a region of embedding material, and not a region of tissue. If it is determined that the pixel is tissue, the dwell continues to improve signal to noise; if not, the beam is advanced to the next pixel before the full dwell time is reached, thereby improving throughput. The "advanced from" pixel (presumed to be embedding material) may have it's intensity normalized as if the signal had been acquired for the full dwell time, and it may also be flagged somehow to indicate that it was not dwelled for the complete period, and optionally how long a dwell time did occur. Additionally, the dwell time required to achieve a certain number of counts can be recorded, advancing to the next pixel when a predetermined number of counts has occurred, and thus generating a "dwell time to a given number of events" image map, rather than an image map of the intensity observed in a fixed dwell time.

According to another embodiment, the CPB system 100 can be configured to analyse information from clusters of neighbouring pixels to determine if an "advanced from" pixel should truly have been advanced from, or if perhaps it's signal did not occur during the subsampling time do to some anomaly, based the known methods of Poisson and other discrete particle counting statistics. Thus a particular pixel within the same image can be revisted/re-imaged based on processing of neighbouring pixels should those pixels appear to indicate a high probability that a particular pixel has been undersampled. In systems where slices are archived, a neighboring pixel can be within other slices, thus the other slices can be re-imaged at a later time.

The "time of flight" between a charged particle leaving the CPB column, impacting the sample to generate a secondary signal, and this secondary signal being detected can be significant enough that a considerable latency can exist in the system, in which case an image can be accumulated from multiple "subimage" passes over the same physical region, each pass taking sufficient time that the individual pixel latency is small in comparison to the time per pass to acquire a subimage. The exact scan strategy to create the next subimage may be modified based on an analysis of pixel information in one or more subimages, using the methods described above, ultimately building up a final image potentially composed of pixels that have seen various total dwell times, in a similar manner to the fashion described above, but overcoming the impact of time of flight latency or other latencies such as detector response or dead time. Note also that image alignment techniques may be used between subimage passes to correct for sample or instrument drift which would otherwise cause the system to perform subimaging passed in what is potentially the wrong location.

As the end data set of this serial sectioning and imaging method ultimately ends up with three dimensions of data, represented by a "stack" of images which may be aligned, there are cases where one can infer from a pixel in stack N whether a pixel at stack N+1 requires imaging. Thus, referring to an earlier example, knowing no tissue is present in a pixel in stack N, it may be sufficient not to bother imaging that same position in stack N+1 (or indeed up to N+M). Alternately, reconstruction algorithms may be able to interpolate or otherwise deduce the necessary data even from "sparse" images, for example if only half of the pixels are imaged on even sections, the other half on odd slices (after the fashion of a checkerboard—"red squares"=pixels imaged on even slices, "black squares"=pixels imaged on odd slices. Image processing at the acquisition level may be used to interpolate or otherwise "fill in" the missing data to increase throughput. Note that this is not limited to a "checkerboard" approach, and as the rate limiting step is often the SEM imaging, these "sparse imaging" approaches, be they temporal or geometric can lead to greater throughput which can be used to achieve finer slice resolution in the FIB/SEM system, which in turn may allow for more intelligent algorithms to supply the intensity values for those pixels "skipped" using sparse methods.

The previously described 2D and 3D imaging methods can benefit from additional improvements over control of the CPB system 10, which can be provided by CPB workstation 100. These are referred to as multi-pass rastering, spatial super-sampling and temporal sub-sampling, which can be optionally enabled during the imaging phase in order to improve data quality or optimize a particular component of the signal that is used to generate the image.

While the previously described 3D imaging method is described for a dual beam FIB-SEM system, the techniques can be applied to imaging methods where the slices of a sample are archived, such as by using the "ATLUM/ATUM" technique developed by Dr. Jeff Lichtman et al. of the Department of Molecular and Cellular Biology of Harvard University. In the Lichtman technique, slices of a sample are pre-prepared and subsequently imaged. Therefore an operator can return to any slice for re-imaging any particular region of interest. The application of the present 3D imaging embodiments to archived slices includes performing imaging at multiple resolutions—a first, lower resolution pass through a series of sections, which are then image processed to determine where higher resolution imaging is to occur, after which further, higher resolution images are acquired. The previously described imaging methods can be applied to all stages of this process.

According to further embodiments, the previously described embodiments can complement the technique of Lichtman, which may be used to acquire sections that are relatively thick—for example, 300 nm in thickness. For example, "lower resolution" imaging of each section and its XROIs (which are not necessarily limited in area and may indeed be the entire section) is executed by the CPB system 10. Further processing then determines regions that require higher resolution data acquisition. At this point, it is possible to use the FIB/SEM approach to slice through the "thick" section in a serial manner, for example, sectioning at 90 degrees to the originally sectioned surface, and obtaining a higher resolution data set within this FIB/SEM sectioning area on each desired thick section, once again applying the XROI technique as desired to further improve throughput.

During the process of imaging one or more XROI's, it is possible that a given XROI or the agglomerate of XROI's desired may exceed the maximum size of image unencumbered by differential non-linearity (DNL) artifacts that is available using the digital to analog (DAC) hardware. This can be dealt with using techniques such as the multi-DAC approach discussed later, and/or through the use of a mosaic tiling approach, sometimes referred to as montaging of an image. The current state of the art requires the use of rectangular image tiles, however as discussed below, this can be improved in many cases using non-rectangular tiles.

In order to image a large area at high resolution, it is necessary to acquire a mosaic of multiple smaller images at high resolution and stitch them together. This is commonly done with square or rectangular images as they are normally obtained from a scan generator. However, as the size of the field of view becomes large for ultra-high pixel density images, there may be scan and beam distortions that limit the extent of the images. Examples of scan distortions include a "pin cushion" type distortion where the normally straight edges of a square or rectangle appear deflated, and a "barrel" type distortion where the normally straight edges of a square or rectangle appear inflated. Examples of beam distortions includes focus and astigmatism distortions. These types of distortions are well known in the art.

Figure 9:
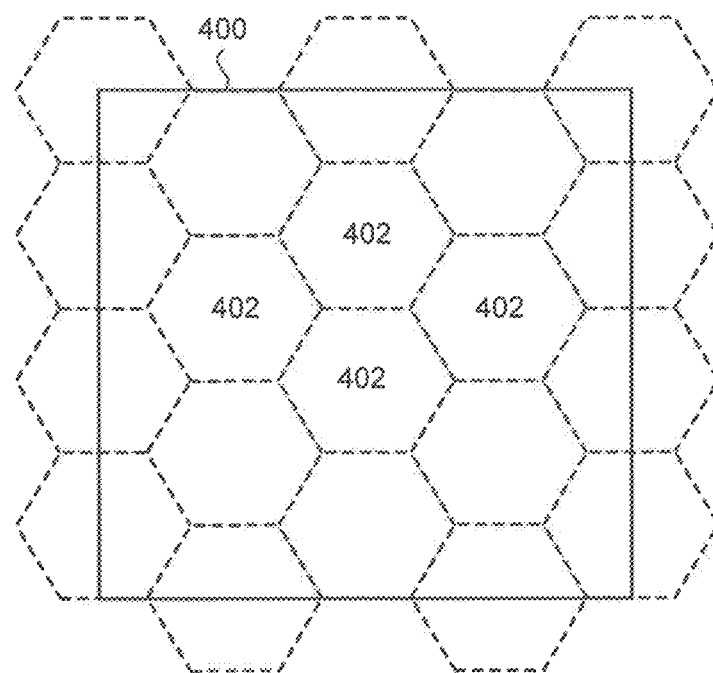
FIG. 9 is a diagram illustrating a mosaic of a series of hexagonal tiles to achieve a best fit within a desired exact region of interest.

Since these distortions typically have circular symmetry, the greatest distortions occur in the corners of a square or rectangular image. To avoid these artifacts yet still use the largest field of view possible to minimize the number of images required, the CPB system 10 can be configured by the CPB workstation 100 to acquire images with a hexagonal shape that tile to completely fill the mosaic while allowing for efficient stitching. Therefore, overall image quality is improved over rectangular tiling, while improving image capture throughput. The mathematical reasoning behind using hexagonal shaped tiles is further explained. FIG. 9 is a diagram illustrating a mosaic of a series of hexagonal tiles to achieve a best fit within a desired XROI. As shown in FIG. 9 by example, a rectangular XROI 400 can be assembled from mosaicing multiple hexagonal tiles 402. For the hexagonal tiles 402 on the periphery of XROI 400, where only a part of the tile is within XROI 400, the tile scan patterns are truncated such that no scanning of the hexagonal tile area outside of XROI 400 is executed.

If it is assumed that the distortions become unacceptable a distance r from the centre of the field of view, then the area of the largest hexagon with acceptable distortions is $3\sqrt{3}/2 r^2 \approx 2.59 r^2$, compared to $2r^2$ for a square image. This means 30% fewer images are required when using hexagons compared to squares, which are the most efficient rectangles, thereby requiring fewer stage movements and less stitching. For comparison, using a non-square image with an aspect ratio of $\alpha$, the area is even smaller than for a square image ($A = 4r^2/(\alpha + 1/\alpha)$, $0 \leq A \leq 2r^2$). Any other combination of shapes that completely fills the space can be used, such as octagons and diamonds by example.

Figure 10:
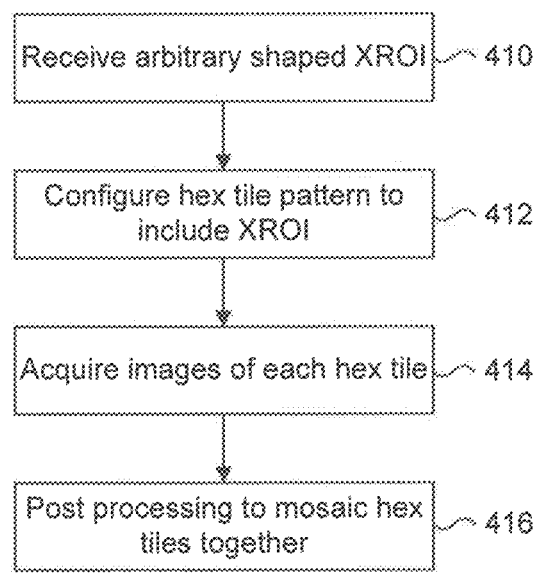
FIG. 10 is a flow chart of a method of acquiring an image from a sample using hexagonal tiles, according to a present embodiment.

FIG. 10 is a flow chart illustrating a method of acquiring an image from a sample using the hex tiles. This method can be incorporated into the previously described methods of FIG. 3 and FIG. 7 where high resolution images of an XROI is acquired. The method starts at 410 when the XROI outline is received by the CPB workstation, after the operator has drawn it on the low resolution key frame image by example. The CPB workstation then executes an optimization algorithm to achieve a best fit mosaic of hexagonal tiles that would encompass the XROI at 412. For example, the optimization criteria could include ensuring that the maximum number of full hexagonal tiles are included with the XROI. At 412, image acquisition begins and the CPB system 10 is controlled to acquire images at high resolution for each hexagonal tile by rastering the electron beam over the sample surface within a virtual hexagonal boundary. After the image data is acquired for one hexagonal tile area, the stage may be moved to better position the beam for rastering of the next hexagonal tile area. Once all hexagonal tiles of the established hex tile pattern have been imaged, post processing operations are executed at 416 to mosaic the hexagonal tiles together. This resulting image is then displayed for the operator on the monitor of the CPB workstation 100.

Creating such a mosaic requires some translation from tile to tile, be it using a Pan/Shift capability of the microscope, or for larger distances a physical motion of the microscope stage. In the case of a physical motion, in either 2D or 3D image acquisition, a technique of high resolution XROI imaging can be employed to improve the accuracy of the stage motion as follows.

Figure 11:
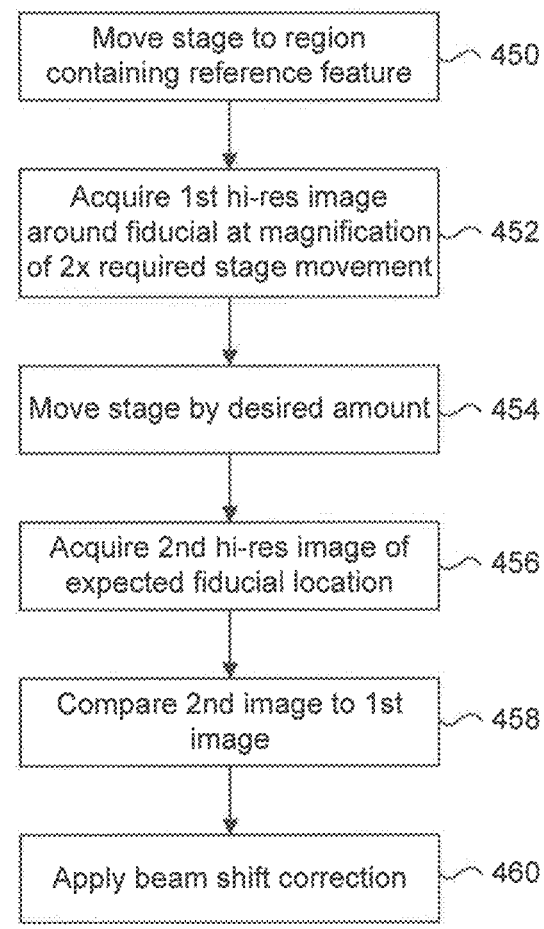
FIG. 11 is a flow chart of a method for accurate movement of a microscope stage, according to a present embodiment.

In many instances, the stage should be moved by a very precise amount relative to the current position. If the stage is not accurate enough, due to mechanical limitations for example, then such a move is not normally possible to the required precision. Assume for example that one wants to locate a specific contact in a semiconductor memory array. Because of the repetitive nature of the array, it is only possible to identify a contact based on its exact position relative to the corner of a memory array which is unique enough to be identified. Using a stage movement from the corner results in a given uncertainty because of the inaccuracy and imprecision of the stage. If the cell size is smaller than the uncertainty of the stage move, then it is not possible to identify which cell and which contact around the resulting approximate position is the actual target. According to a present embodiment, the stage can be moved by the desired amount, followed by an identification of precisely how much it has actually moved. Any additional correction is then accomplished by precisely shifting the beam. This is achieved by using high resolution imaging at a large field of view (FOV) and pattern recognition. FIG. 11 is a flow chart outlining a method for accurate movement of a microscope stage.

The method of FIG. 11 begins at 450, by automatically or manually moving the stage to a region of the sample containing a suitable feature to be used as a reference fiducial. At 452, a sufficiently high resolution XROI image of the region of interest around a fiducial, large enough to cover a region greater than the aggregate of the fiducial size plus a multiple of the stage accuracy, for example the size of the fiducial plus twice the stage accuracy, is acquired. A resolution is considered sufficiently high if, after a subsequent offset error value is determined as discussed below, the sub-pixel uncertainty on that calculated offset error value is sufficiently small as to give the desired positional accuracy. The magnification is set such that the field of view is at least twice the required stage movement in either or both of x and y axes. Then the stage is moved by the desired amount at 454. At 456, another high resolution XROI image is acquired of the region of interest at the position on the sample where the fiducial is expected to be, assuming exact stage positioning has been achieved. This can be easily computed by the CPB workstation 100 by applying mathematical translation techniques. The high resolution images from 454 and 456 are compared to each other at 458 to determine the precise error of the positioning of the stage, obtaining an (x,y) offset value representing the measured error in positioning. This offset value can be computed by many methods well known to those skilled in the art, including cross-correlation based image comparison techniques. In other words, by comparing the two imaged regions of interest with each other, the second image could have the fiducial offset in position relative to the fiducial in the first image.

Figure 12A:
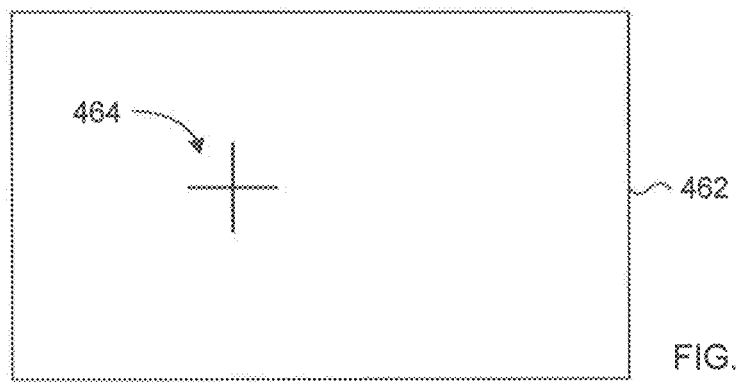
FIGS. 12A, 12B and 12C are example images of a region of interest used for the method of FIG. 11.
Figure 12B:
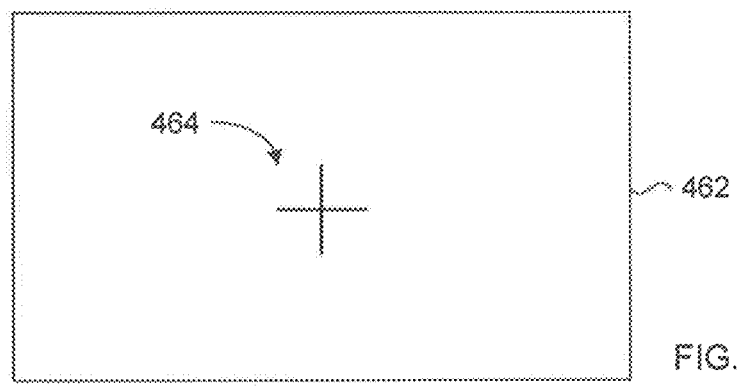
Figure 12C:
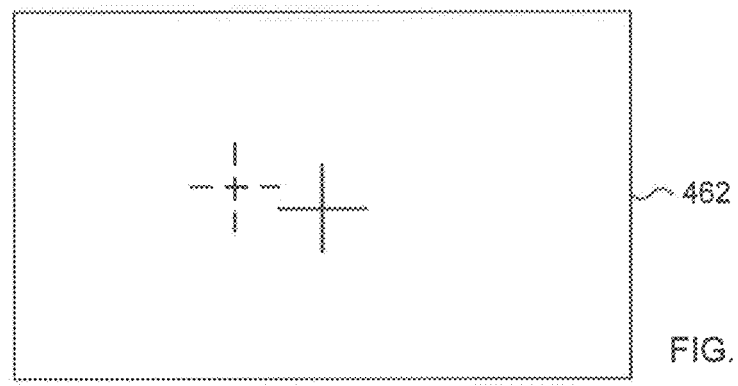

FIG. 12A is an example high resolution image of a region of interest 462, including a reference fiducial 464 in the form of a "+" symbol, acquired at step 452 of FIG. 11. FIG. 12B is an example high resolution image of the region of interest 462 acquired at the expected location of the reference fiducial 464. FIG. 12C illustrates the difference in position between the first and second reference fiducial images, where the dashed line reference fiducial represents its original reference position. Now the beam can be precisely shifted by the error amount at 462, resulting in the center of the field of view being precisely offset relative to the reference fiducial, allowing the user to zoom in for even higher resolution imaging. Note that a combination of beam placement and stage placement shifting can be performed, if need be in an iterative fashion, until the desired accuracy is achieved.

According to an alternate embodiment, the FOV can be only as large as the required stage motion by doing two stage moves and reacquiring a reference image between the two. Assuming a high resolution image at 32768 pixels along the FOV and an absolute scan accuracy of 4 pixels, this method would result in a precision of 10 nm for stage movements up to 80 microns, or 25 nm precision is achievable for stage movements up to 200 microns. In any implementation, an improvement in scan accuracy will directly result in more precision or larger stage movement given the same precision requirements.

In another alternate embodiment, the method involves continuously scanning a region of interest at a frequency sufficient that any motion in that feature would be a small increment during a single image pass, and tracking that feature across a high resolution scan (this is greatly enable by a high resolution of 32 k×32 k or higher existing technology being typically limited to 8 k×8 k) while the stage is moved to the desired location—thus by relying on the well calibrated scan and tracking the feature continuously through high speed scanning, a precise determination of the position of the feature can be achieved, relative to the accuracy of the scanned image field, throughout the entire period during which the stage is moving, which typically will yield greater positional accuracy than can be achieved by a mechanical stage system.

When acquiring images at large fields of view, it is common to encounter distortions that affect the quality of the image. These may be divided in to three general groups: scan distortions due to lensing or sample tilt effects, beam distortions such as astigmatism and focus differences across the image or sample induced distortions. According to present embodiments, the CPB workstation 100 is configured to mitigate or eliminate some of these distortions through active and/or passive processes. Active distortion mitigation methods include modifying the scan and beam conditions. Passive distortion mitigation methods include post-processing of the images and some correction of these artifacts. Following is a non-exhaustive listing of possible distortions that could be corrected for with the presently described distortion mitigation embodiments: (i) loss of focus and stigmation, particularly in the corners of the image; (ii) barrel or pincushion distortion at large FOV; (iii) leading edge distortion due to beam dynamics; (iv) tilt parallax (trapezoidal distortion); (v) leading edge distortions due to minor sample charging; and (vi) focus changes due to sample geometry.

One embodiment for large area distortion mitigation is dynamic scan and beam compensation.

When dealing with geometric distortions, with the use of a digital scan generator, it is possible to apply a correction to the scan such that the actual scan after distortion by the column and/or sample produces the original desired result. Consider the microscope has a non-ideal transfer function $T(\vec{r})$ that converts an input scan position $\vec{r}=(x,y)$ into a real position $\vec{r}'=(x',y')$:

$$\vec{r}'=T(\vec{r})$$

If the inverse $T^{-1}(\vec{r})$ of this transfer function is known, then the desired scan position is obtained when a corrected input $\vec{r}''=T^{-1}(\vec{r})$ is fed to the system:

$$T(\vec{r}'')=T(T^{-1}(\vec{r}))=\vec{r}$$

Accordingly, the correction can be generated by two different techniques according to the present embodiments. In one embodiment, the inverse of the transfer function is parametrized analytically and the parameters are adjusted until the proper output is obtained. In another embodiment, a calibration grid is used and a map of the inverse transfer function is built numerically based on the measured discrepancy between the input and the output. In either case, for a digital scan generator equipped with a digital signal processor (DSP) or a field programmable gate array (FPGA), the corrected input can be calculated or accessed from a lookup table and applied directly in the scan generator hardware. For simple corrections such as a tilt parallax, the function can be implemented as an analytical function, but for more complicated corrections, a predetermined lookup map can be employed.

A second embodiment for large area distortion mitigation is dynamic focus tracking along a cross-section.

In the situation when imaging a sample that is tilted and two faces are exposed to the beam (for example the original surface of the sample and the cross-sectioning face), the focus of the beam is dynamically adjusted as a function of the position in the image in order to keep in focus along both faces of the sample. Current implementations of dynamic focus are limited to allow tracking within one plane, either the surface or the cross-section. By having a more complex tracking routine, it is possible to determine, based on the current scanning position in the image, which plane is being scanned and thus adapt the focus appropriately. The focus is constantly adjusted according to the known sample topography to preserve focus on the entire area, provided the focus adjustment can be performed sufficiently fast to keep up with the scan. Under these conditions, the focus can be adjusted in order to mitigate defocussing effects away from the centre of the image by constantly adjusting the focus according to a predefined map. If optimal stigmation varies within the image field of view, then it is also possible to adjust the stigmation according to a pre-established map, according to the position of the beam in the image.

Currently, calls to adjust the focus and stigmation are generated in software by the native CPB system 10, so changes to the focus and stigmation within a scan line are only possible for very slow scans. According to the present embodiment, the scan generator is configured to output not just the x and y deflection signals but also a focus and stigmation correction signal, which would make the system operational for regular scan speeds. In this embodiment, the scan generator is configured to include a lookup table in memory for both the focus and stigmation as a function of beam position. As the scan is generated, the focus and stigmation outputs are converted to signals usable by the microscope using a standard digital to analog conversion and amplification mechanism.

Figure 13:
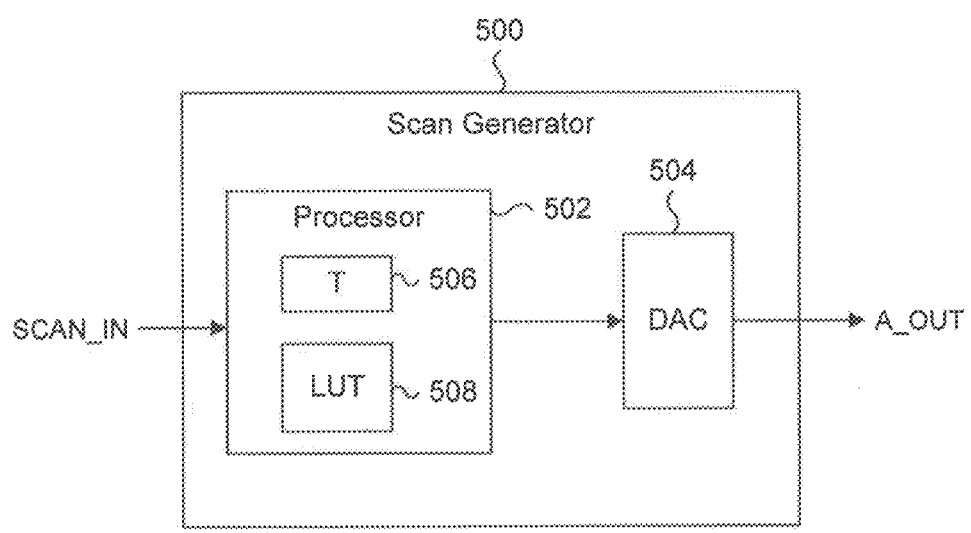
FIG. 13 is a block diagram of a scan generator configured to have microscope compensation features for a CPB system, according to a present embodiment.

FIG. 13 is a block diagram showing a scan generator configured for both the previously described dynamic scan and beam compensation, and the dynamic focus tracking compensation embodiments. The scan generator 500 includes a processor 502, such as a DSP or an FPGA by example, that receives input scan information SCAN_IN and provides a corrected output to a digital to analog converter (DAC) 504. The DAC 504 converts the received digital information into an analog signals collectively referred to as A_OUT, which include x and y axis deflection voltage signals for controlling beam position, and focus and stigmation control voltages. The processor 502 is configured to include the aforementioned a function processing circuit 506, and a lookup table (LUT) 508. For the present embodiment, the processor 502 can selectively determine if the received input scan information SCAN_IN should be processed by function processing circuit 506 or LUT 508. The function processing circuit 506 is used for readily modeled dynamic scan, focus, stigmation and beam compensation. The LUT 508 is embodied as memory within the processor 502 and is used for more complex dynamic scan, focus, stigmation and beam compensation.

Either in combination with or independently from the dynamic beam and scan and focus tracking embodiments above, the images can be post-processed to compensate for large area imaging distortion.

Assuming an image was acquired with a known distortion, post-processing operations can be performed on the image to remove the effect of the distortion. This is commonly done in optical imaging or photography where some lens artifacts are well defined. Wide angle lenses tend to have some degree of barrel distortion which is commonly post-corrected inside the camera as the image is saved to a file. According to the present embodiment, the CPB workstation 100 is configured to include the same type of process, where the acquisition engine automatically morphs the image as it is acquired so that the output obtained by the operator is free from distortions. As in the case of in-camera processing, the distortion should be well established prior to acquisition.

One example implementation is for imaging moderately charging samples. When imaging a charging sample with an SEM, the act of scanning the beam results in charge accumulation on the sample surface which slightly affects the beam position. Under certain conditions, the scanned area of the image will have a systematic compression on all lines, on the edge where the scanning begins. In this case a standard raster scan is used, imaging all lines from left to right. By comparing the resulting image to the known geometry of the sample, a simple model of exponential decay can be used to accurately model the amount of lateral shift of each pixel from its nominal position, $dx=Ae^{-x/\tau}$ (where A is the shift of the left-most pixel and $\tau$ characterizes how fast the shift decays to 0). Using this model, the necessary warping of the measured image can be performed in real-time such that the operator is shown a proper image free of the artifact.

Another contributor to large area imaging distortion is dynamic drift. Acquisition of a high pixel density image takes much longer than under conventional imaging conditions, and therefore the stability of the microscope may result in unacceptable drift during the duration of the acquisition. The sources of this drift may be electronic (beam deflection shift) or mechanical (stage drift). Typically, the largest source of drift is stage drift, assuming the microscope and electronics are up to stable operating conditions.

According to a dynamic drift compensation embodiment, this drift is compensated for by shifting the beam systematically at the scan level according to a predictive drift model. This model is developed from prior images, where, for example, a given system has a known relaxation drift after a stage move. Alternately, the drift model can be generated dynamically by regularly pausing the imaging and performing registration on a fiducial to evaluate the current amount of drift. A model can then be applied to anticipate the amount of correction that is needed to compensate for the drift.

As an example, a 32 k×32 k image of 1 Gigapixel is acquired using a dwell time of 2 µs will take approximately 35 minutes. Assuming the system stage drift specification is 3 nm/minute, the stage may have drifted by nearly 100 nm at the completion of the image. If the image was acquired with a resolution of 5 nm, this will result in an error of 20 pixels between the top and the bottom of the image. By pausing the image and determining the amount of drift periodically, this error can be reduced. By way of example, by pausing every 5 minutes, it is possible to reduce the error to 15 nm (3 pixels), or less if the drift is systematic and can be modeled properly.

According to the present embodiments, it is also possible to measure the change in environmental variables such as for example, the temperature, sound, vibration or pressure, in close proximity to the sample or the microscope, and by evaluating the drift as a function of such environmental variables, create a predictive model for the impact a change in such a variable may have on the image (including drift). For example, it may be that a rise in temperature typically corresponds to a certain drift in a certain direction that lags the measured temperature rise by a certain time. Thus it may be possible to dynamically adapt the scan to (optimally smoothly) compensate for this drift during the course of acquisition of one or more images.

It is also possible to look for rapid changes in these variables, such as the sound of a slamming door, and (either additionally or in place of) also evaluate the local portion of the image as acquired (such as the last few scan lines) against the average metrics of the image. At present, this can be done by analyzing the entire image on completion. According to a present embodiment an algorithm can be developed to analyze pairs of lines in the image for the purposes of calculating the following:

The calculated threshold (product of the user defined threshold by the standard deviation of the standard deviation of each line pair difference)

The average standard deviation of each line pair difference

The standard deviation of the standard deviation of each line pair difference

The largest calculated standard deviation for a given line pair difference. This also includes how much larger than the average it is and for which row this value was observed.

Determining a FAIL or PASS state, whether the largest calculated standard deviation exceeds the threshold above the average or not.

However, the current art requires completion of the image, and post-calculation of the PASS or FAIL state, which can in turn trigger the entire image to be reacquired. It is advantageous to look for problems with the image either by dynamically performing such analysis as the image is acquired, or by measuring environmental variables and looking for signatures of events previously determined to cause problems in the image. When a likely problem is discovered, for example a sound is detected by an acoustic monitoring circuit that is above the threshold determined to be sufficient to cause a deficiency in the image it is then possible to repeat a portion of the image to remove the problem. For example, if a vibration is detected either by analyzing the lines of the image as discussed above, or by observing an environmental event (such as a sound spike caused by the slamming of a door), the acquisition can be stopped and the beam "backed up" to a point spatially that had been scanned prior to the event being detected, and this small portion of the image can be re-scanned, rather than requiring the entire image to be rescanned. This also has the advantage that the "back up and repeat" happens temporally very close to the original scan, leaving little time for errors such as drift to occur. And additional step of "drift correction" to align the last "known good" portion of the image prior to the environmental event and the first portion of the backed-up and re-imaged portion may be performed during acquisition to ensure the final image that is saved has a seamless transition across the portion of the sample that was being imaged when the original environmental event occurred.

Figure 14:
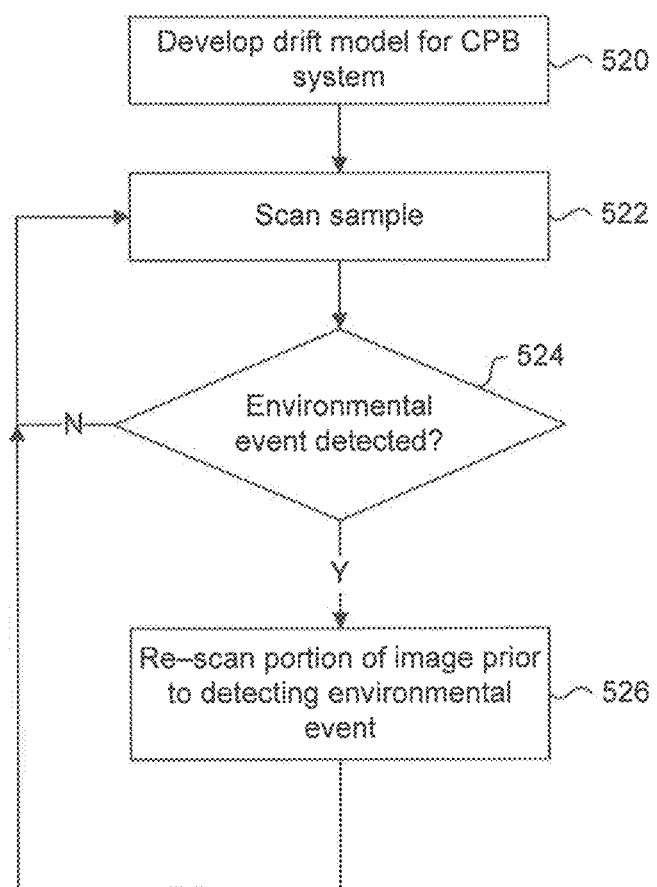
FIG. 14 is a flowchart of a drift compensation embodiment for improving imaging of a large area, according to a present embodiment.

FIG. 14 is a flowchart summarizing a general drift compensation embodiment for improving imaging of a large area. Starting at 520 a drift model, such as to model relaxation drift by example, is developed and if necessary updated for the CPB system 10 by either analyzing prior images scanned by the system, or through periodic pausing of the imaging and performing registration on a fiducial to evaluate the current amount of drift. This model can also incorporate the effect of environmental variables as previously discussed. Scanning of the sample surface begins at 522 with application of feature small to adjust the scan position of the beam to compensate for the expected drift of the sample. During scanning, the system is actively monitoring predetermined environmental variables which may affect instantaneous shifting of the sample. If an environmental event is detected at 524, just the portion of the image that was scanned prior to detection of the environmental event is rescanned. The method then returns to 522 to resume scanning of the sample. This is done by pausing the current scan, and repositioning the beam to a point on the sample anytime before the environmental event was detected. Otherwise, in the absence of a detected environmental event, the system continues scanning the sample. In the present method, the drift model developed at 520 can be updated periodically, either at a predetermined time or schedule, and/or when some static environmental condition has changed since the last drift model was developed.

In addition to automatically attempting to improve the imaging conditions of the microscope, the operator may wish to have more direct control over the imaging conditions.

Figure 15:
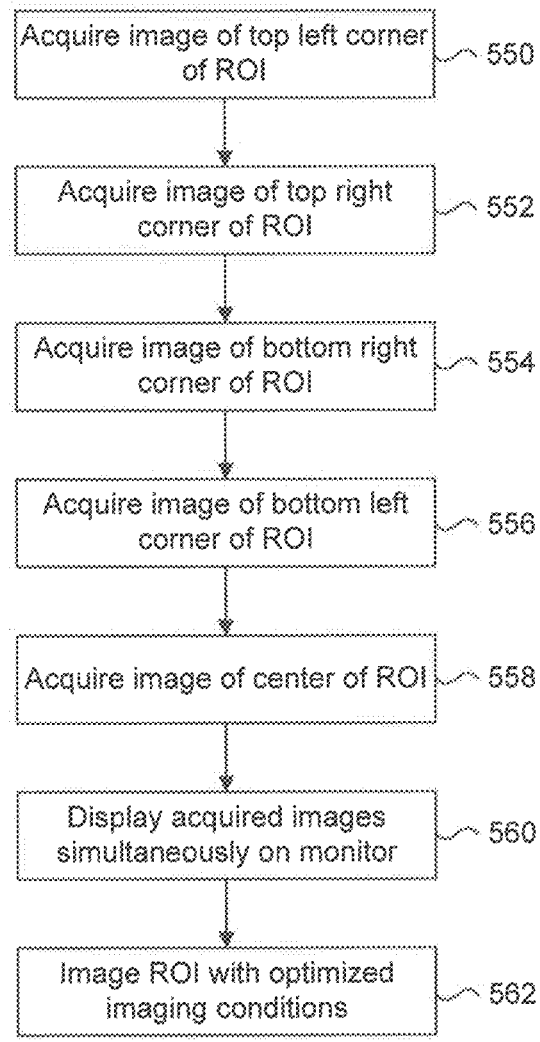
FIG. 15 is a flowchart of an imaging condition optimization method, according to a present embodiment.

When acquiring very large images, it is difficult to determine if imaging conditions such as focus, stigmation, etc. are optimized for the best trade-off across the entire image. It is therefore advantageous to be able to have a single display that allows the operator to see multiple regions of the large image at full, or otherwise high, resolution at essentially the same time. According to a present imaging condition optimization embodiment, the operator can view multiple images taken at different areas of the sample simultaneously for the purposes of manually adjusting imaging conditions to obtain the optimal trade-off for best results in all parts of the image. FIG. 15 is a flowchart outlining the present imaging condition optimization method according to a present embodiment. It is assumed that the operator has selected a region of interest of the sample for which an image is required. An image of the top left corner of the ROI is acquired at 550, followed by acquisition of images of the other 3 corners of the ROI at 552, 554 and 556. At 558, an image is acquired at a generally central area of the ROI. Once these images have been acquired, they are simultaneously displayed on the monitor of the CPB workstation 100 at step 560. Alternately, the display of each region made be dynamically updated as the scan is performed. Now the operator has the ability to adjust and set the imaging conditions which are optimal for all 5 displayed regions of the ROI. Full image acquisition of the ROI can then proceed at 562 with the set imaging conditions.

Figure 16:
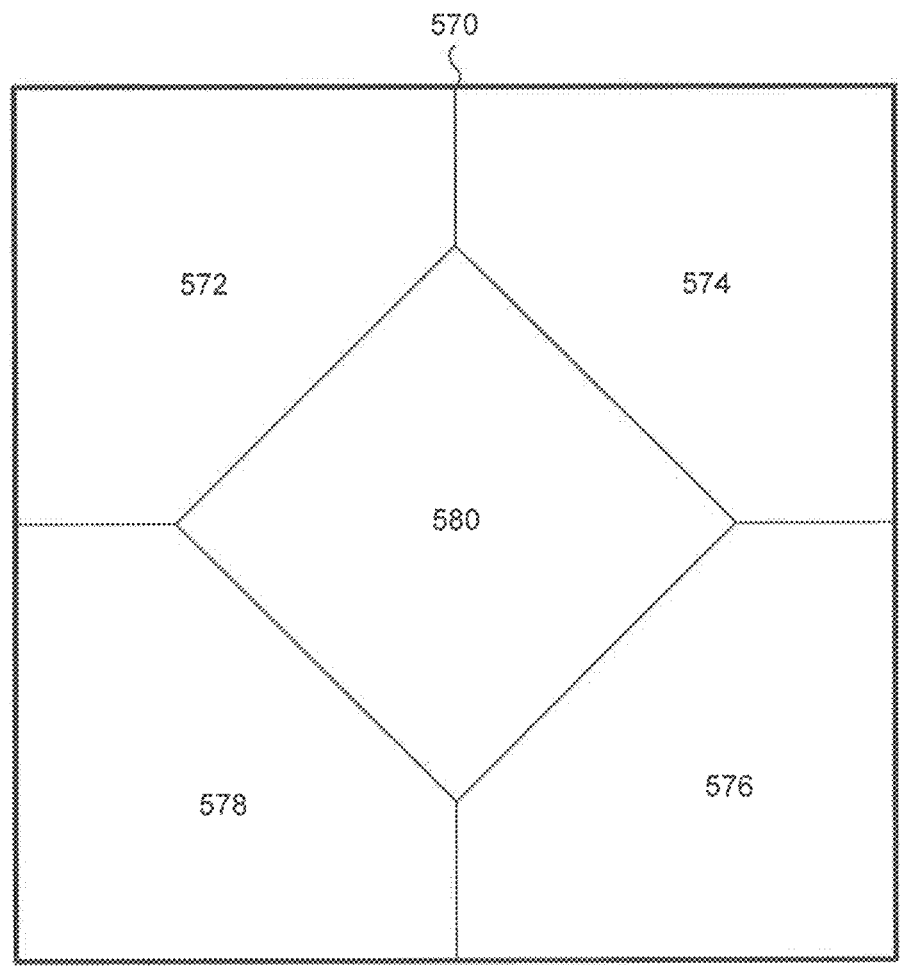
FIG. 16 shows an example layout of images acquired by the method of FIG. 15, according to a present embodiment.

FIG. 16 shows an example layout of all 5 images acquired in the method of FIG. 15 displayed in a window 570 of the monitor of CPB workstation 100. In the presently shown example, the positions of the images generally corresponds to the regions of the ROI they were taken from. In FIG. 16 by example, the top left corner image 572 displays the acquired image taken from the top left corner of the ROI. Similarly, the other 3 corner images 574, 576 and 578 each displays the acquired images taken from the top right, bottom right and bottom left corners of the ROI respectively. The central image 580 in window 570 displays the acquired image taken from the central part of the ROI.

Window 570 is referred to as a multi-region image, which now allows the operator to adjust the focus, stigmation, beam shift, and other CPB conditions to obtain the optimal trade-off for best results in all parts of the image. According to an aspect of the present method, the five regions scanned have the same area (number of pixels), so each requires the same time to scan. In alternate embodiments, more than 5 regions of the ROI can be scanned and displayed in window 570. For example, a 3×3 matrix showing the center of edges plus the four corners plus the center is possible. Furthermore, the operator can reposition these regions within window 570 as desired, i.e. it is not required that the actual regions scanned have exact positional correspondence to the four corners and the center, nor that each region scanned have the same area as the other regions.

It is also desirable to apply local image processing to adjust for stigmation or focus issues within different regions of the image once the best results are obtained through optimizing CPB conditions. Such local processing can be applied to each of the multiple regions described above, then the determined values interpolated between regions. Determining optimal local settings may be done by a human user, or through image processing techniques.

When two charged particle beams are used for 3D analysis involving both material removal slice-by-slice and imaging, as shown in FIG. 8, it is advantageous to be able to track the position or drift of the sample in three dimensions on a regular basis due to the extended periods of time involved in the process. An approach is described below that allows for a determination of any drift in the "XY" plane as viewed from the perspective of the imaging beam (generated by, for example, an SEM or a GFIS column) as well as determining the rate of advancement (slicing rate or slice by slice thickness in "Z") of the milling beam (generated by, for example a LMIS gallium FIB column).

Maintaining knowledge of the position of the cross-section face in three dimensional space is vital to ensuring each slice is at or close to the desired thickness, and also deriving a knowledge of the actual thickness of each slice. A 3D positional tracking method is described that enables the tracking of the position of the cross-section face during sectioning and imaging in such a way that a direct measurement of the actual position of each slice can be calculated, allowing for dynamic repositioning to account for drift in the plane of the sample and also dynamic adjustment of the forward advancement rate of the FIB to account for variations in the sample, microscope, microscope environment, etc. that contributes to drift. An additional result of this approach is the ability to dynamically calculate (and potentially report to a dynamic image processing module) the actual thickness of each acquired slice as it is acquired.

Figure 17:
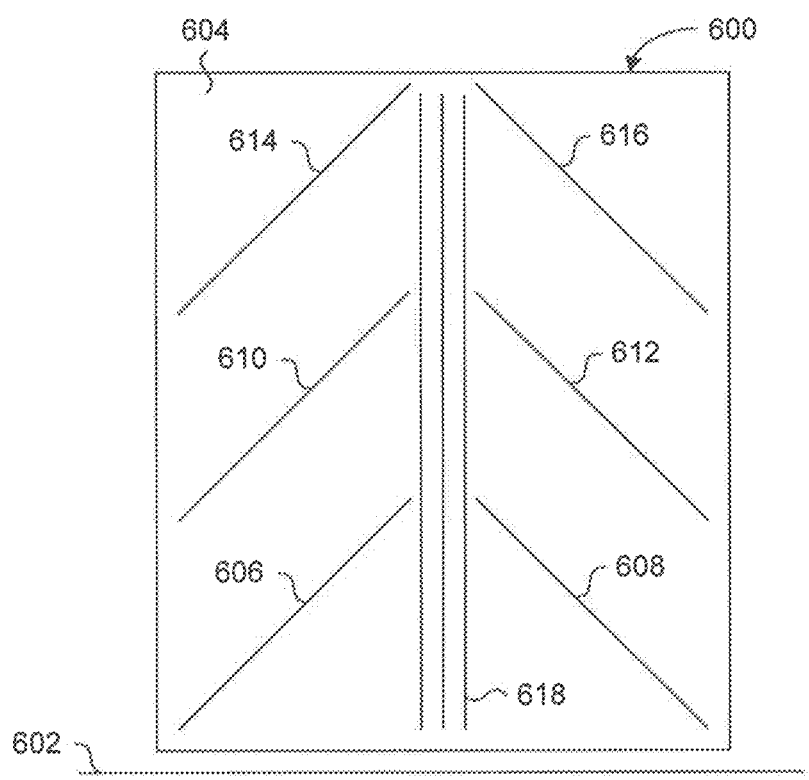
FIG. 17 shows a top-down view of a sample having alignment notches, according to a present embodiment.

FIG. 17 shows a top-down view of the sample 600 where an initial cross-section 602 has been or is to be fabricated and a first protective layer 604 is deposited. A leftmost first notch 606 and a rightmost first notch 608 are nanofabricated into or onto (the "notch" may be raised be selectively depositing, rather than removing, material, as discussed below) the first protective layer; the leftmost and rightmost first notches are together referred to as a first chevron. A leftmost second notch 610 and a rightmost second notch 612 form the second chevron. This process may be repeated multiple times as required, forming the leftmost "nth" notch 614 and the rightmost "nth" notch 616. Or a single notch pair may span the entire first protective layer.

Note that it is also possible to nanofabricate the "notches" directly on the surface of the sample 600 (in the absence of a first protective layer), and it is also possible to fabricate the "notch" as a raised structure rather than a groove, i.e. depositing rather than removing material. The term "notch" is understood to refer to a structure deliberately nanofabricated for purposes of alignment, such as a line or curve, whose geometry is known. It is often desirable that this structure be contiguous, however noncontiguous structures such as a dotted line may also be employed, and additional information may be gleaned from the "duty cycle" of the "dots". Multiple dotted lines with different or offset duty cycles may be employed.

In a similar fashion, one or more parallel or nearer parallel "notches" 618 may be nanofabricated to serve as known good targets for autofunctions such as auto focus, auto stigmation, auto brightness, auto contrast, etc. as these features can be fabricated to have a known and constant position on the cross-section face during all or a portion of the cross-sectioning process. In the present embodiment shown in FIG. 17, three such parallel notches are nano fabricated in the surface of the sample 600. These notches 618 extend in a direction orthogonal to the base of the cross-section face 602. These are all referred to as "autofunction targets" and it is desirable that they have multiple sharp features and interfaces in the cross-sectioned view in order to improve the execution of autofunctions; such multiple interfaces and features can be achieved using one or more notches in close proximity.

Figure 18:
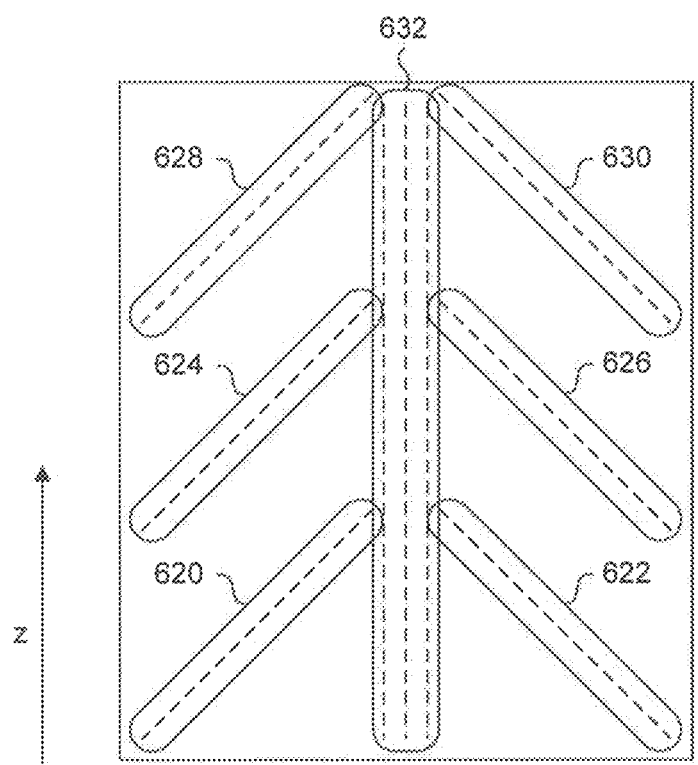
FIG. 18 shows the sample of FIG. 17 having a protective layer over the notches, according to a present embodiment.

FIG. 18 shows the deposition of a second protective layer over the notches shown in FIG. 17, which may cover in whole or in part the first protective layer. The second protective layer can be a single "blanket" over the areas of interest or it can be selectively nanofabricated to cover just the areas around the notches as shown by the outlines in FIG. 18. FIG. 18 illustrates such a selectively nanofabricated protective layer composed of multiple regions, including a leftmost first protective region 620 and a rightmost first protective region 622 are nanofabricated onto the first chevron and the first protective layer. A leftmost second protective region 624 and a rightmost second protective region 626 protect the second chevron. This process may be repeated multiple times as required, forming the leftmost "nth" protective region 628 and the rightmost "nth" protective region 630. Similarly, a protective layer 632 is deposited over the known good autofunction targets.

From a "top down" perspective, a number of notches are nanofabricated onto the surface of the first protective layer. These notches converge at a predefined angle and a set of them may have the appearance of chevrons, although it is not a requirement that the notches meet at a point nor have any other specific geometry relationship other than the fact they are not parallel and their geometry is known. In FIG. 18, the sample is sectioned in the z-direction, to expose a new x-y surface for imaging.

Figure 19A:
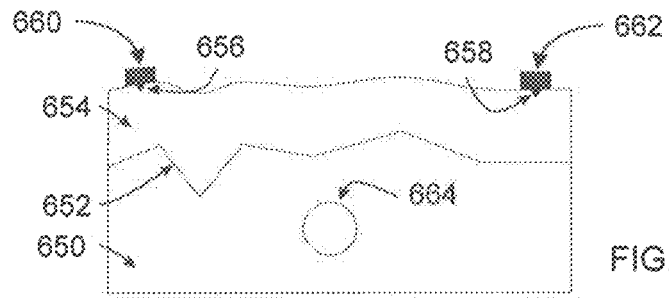
FIGS. 19A, 19B, 19C and 19D are example cross-section images a sample having the alignment notches.
Figure 19B:
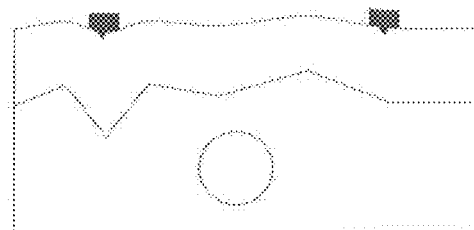
Figure 19C:
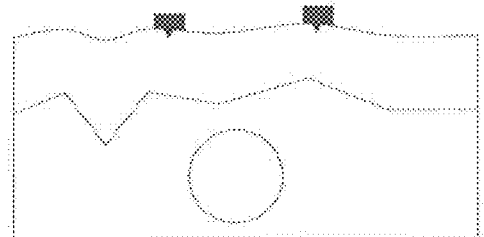
Figure 19D:
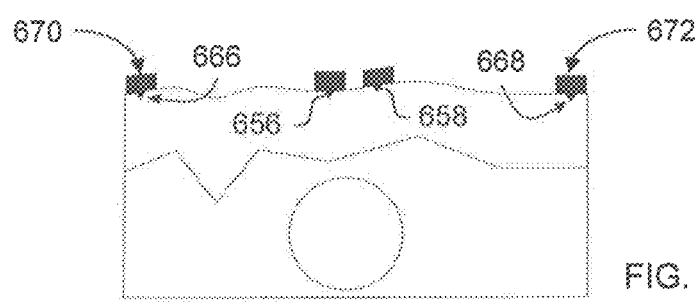

FIGS. 19A through 19D show multiple cross sectional slices of a sample containing a feature of interest. By example, FIGS. 19A through 19D show an x-y plane surface of the sample 600 shown in FIG. 17. It is noted that the presently shown cross section images do not show the parallel notches 618. According to the present embodiments, the operator can select an XROI from these images for the purposes of obtaining a high resolution image of the feature of interest. FIGS. 19A, 19B, 19C and 19D are images of each cross section of the sample, i.e. the slice of FIG. 19D is acquired after (and thus deeper in the z-direction) compared to the slice of FIG. 19C, which is deeper in than the slice shown in FIG. 19B, etc. Progressive changes in size of the feature of interest 664 can be observed. The cross-section image of FIG. 19A shows a sample 650 having a top surface 652, a first protective layer 654, a left chevron notch 656, a right chevron notch 658, and second protective layers 660 and 662 formed over notches 656 and 658 respectively. Shown in the cross-section face is a feature of interest 664. It can be seen from FIG. 19A to FIG. 19C that the feature of interest 664, shows as a circle, is increasing in diameter as the slices of the sample are removed. Also, it can be seen that the notches 656 and 658 with their protective layers 660 and 662 appear to be moving towards each other. With reference to FIG. 17, notches 656 and 658 correspond to first notches 606 and 608. Eventually at FIG. 19D, a second set of notches 666 and 668 with their respective protective layers 670 and 672 appear. It can be seen that the purpose for having the second set of notches 666 and 668 is to continue the depth tracking when notches 656 and 658 eventually disappear.

FIGS. 20A through 20D show multiple cross sectional slices of a sample containing a feature of interest, similar to those shown in FIG. 19A though 19D, except that parallel notches, such as parallel notches 618 of FIG. 17 are shown.

Figure 20A:
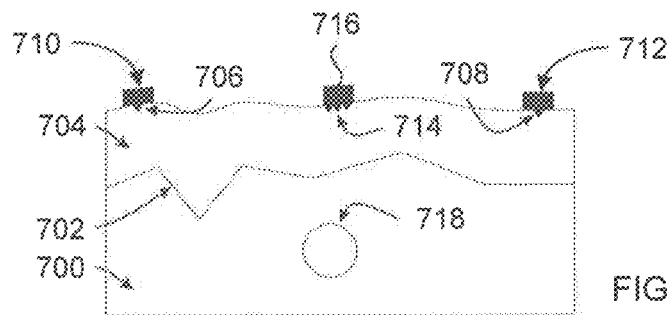
FIGS. 20A, 20B, 20C and 20D are example cross-section images a sample having the alignment notches and parallel alignment notches.
Figure 20B:
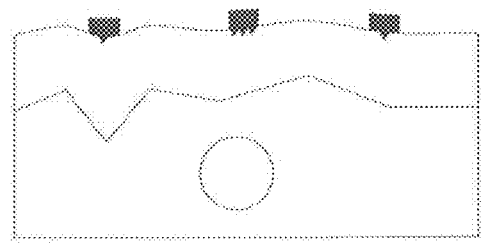
Figure 20C:
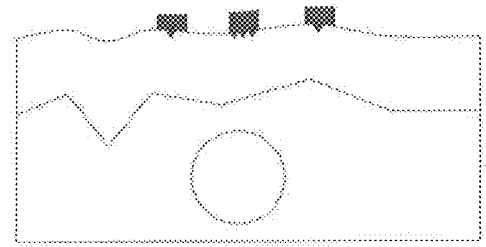
Figure 20D:
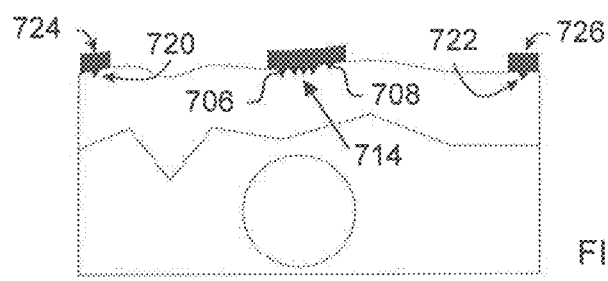

The cross-section image of FIG. 20A shows a sample 700 having a top surface 702, a first protective layer 704, a left chevron notch 706, a right chevron notch 708, and second protective layers 710 and 712 formed over notches 706 and 708 respectively. These features are similar to those shown in FIG. 19A. FIG. 20A further includes parallel notches 714, of which 3 are shown in the present example. Formed over parallel notches 714 is a second protective layer 716, composed of the same material as second protective layers 710 and 712. Shown in the cross-section face is a feature of interest 718. FIGS. 20A, 20B, 20C and 20D are images of each cross section of the sample, i.e. the slice of FIG. 20D is acquired after (and thus deeper in the z-direction) compared to the slice of FIG. 20C, which is deeper in than the slice shown in FIG. 20B, etc. The notches 706 and 708 progressively approach each other in position by FIG. 20C, and at FIG. 20D are shown almost directly adjacent to parallel notches 714. At FIG. 20D, a second set of notches 720 and 722, and their respective second protective layers 724 and 726 appear.

Figure 21:
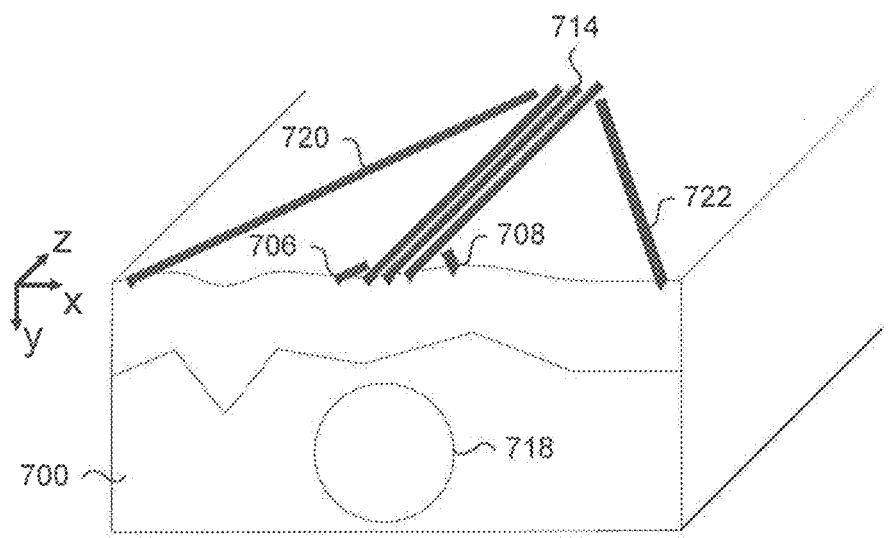
FIG. 21 is a perspective view image of a sample after removal of several sections.

FIG. 21 is a perspective view of sample 700 after several sections have been taken. The second protective layer over notches 706, 708 and parallel notches 714 is not shown in FIG. 21. In the presently shown example, the second set of notches 720 and 722 appear in the x-y plane of the cross section face, while the ends of the first set of notches 706 and 708 are shown in the same cross section face.

As is readily seen in cross-section, the sample has a surface which has a certain surface roughness. Depositing a first protective layer over the surface, could have the additional benefit of providing a degree of planarization, smoothing out a portion of the roughness.

In the microscope, it is also more readily observed in cross-section that it is desirable that there be contrast between the first protective layer and the second protective layer. One way this can be achieved is if the average atomic number of the material from the first protective layer is sufficiently different from the average atomic number of the second protective layer. This can be accomplished by depositing one of the layers using a heavier (higher average atomic number) materials such as deposited "platinum" or "tungsten" from a precursor gas such as tungsten hexacarbonyl (W(CO)6). Those skilled in the art will realize that the process of ion (such as Ga+ or He+) or electron beam deposition from a precursor gas is well known, and also leads to a "tungsten" deposition that incorporates a mixture of W, C, and the incident beam (Ga, etc.). A lighter (lower average atomic number) material such as "carbon" or "silicon oxide" can be deposited for the other layer. When viewed using a detector sensitive to the average atomic number (i.e. one such as the Carl Zeiss Energy Selective Backscatter Detector, EsB), regions of higher average atomic number have higher signal (brighter) and regions of lower average atomic number have lower signal (darker). Note also that the EsB allows imaging of SEM generated electrons of a certain energy and filters out the FIB generated electrons during simultaneous milling and imaging.

It is also possible to achieve the desired contrast between the first and second layers using a single gas precursor, and depositing one layer using a first beam (say an ion beam such as Ga+, He+, Ne+ or Ar+ by example) and a second layer using a different beam (an ion beam of a different species or an electron beam). In the case of using a Ga beam for one layer and an electron beam for another, the average atomic number of the two layers would be different due to factors such as the incorporation of the Ga into one layer (whereas the deposition by an electron beam would not leave an elemental species incorporated in the layer), differences in density of the layer due to different chemical processes arising from the deposition method, etc.

It is also possible that the one or both of the protective layers is omitted, and the contrast arises between the features nanofabricated into or onto the sample and the sample itself (and any protective layers thus employed).

In the presently disclosed embodiments, the notches are used as alignment marks, ie. patterns in the sample that are such that when imaging the cross-section face, the distance between the marks allow unique identification of the position of the cross-section plane along the Z axis. These alignment marks can be repeating structures that only allow unique identification of their position when a coarse position of the cross-section is also known, and can be patterned directly into the sample surface using the patterning beam. In one example, the notches are patterned such as to produce a suitable contrast when imaging the cross-section. For example, the alignment mark generated by first depositing a Pt or W layer on the sample surface, milling the marks and the depositing a C layer on top. This arrangement results in a high contrast image with most imaging beams and detectors. The second protective layer can be a material with high contrast relative to the material of the notches, to further enhance notch patter recognition by the CPB workstation 100, since the combination of the contrasting layers would be unique in the image, and thus easily detectable by the system for auto depth calculations. This feature is now described in more detail.

Figure 22:
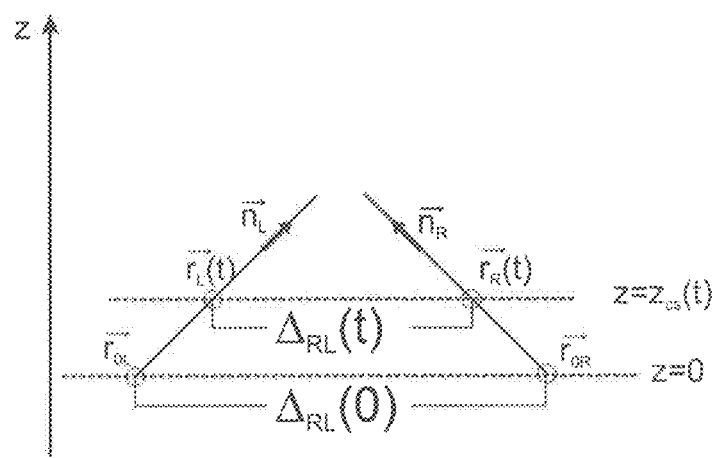
FIG. 22 is an illustration of the mathematical relationship between the alignment notches and depth of section.

Referring to FIG. 22, mathematically, a pair of notches are idealized as segments in the XZ plane with all points in the segments parametrized as:

$$\vec{r_L} = \vec{n_L} s + \vec{r_{0L}}$$

And $$\vec{r_R} = \vec{n_R} s + \vec{r_{0R}}$$

With $$\vec{n_{L/R}} = \begin{pmatrix} n_{xL/R} \\ 0 \\ n_{zL/R} \end{pmatrix}, \vec{r_{0L/R}} = \begin{pmatrix} x_{0L/R} \\ y_{0L/R} \\ z_{0L/R} \end{pmatrix} \text{ and } s \in [0, 1].$$

Where these notches intersect the XY plane at $z=z_{CS}$, the distance between them is $$\Delta_{RL} = x_R - x_L =$$
$$\frac{n_{xR}}{n_{zR}}(z_{CS} - z_{0R}) - \frac{n_{xL}}{n_{zL}}(z_{CS} - z_{0L}) + (x_{0R} - x_{0L}) = \left(\frac{n_{xR}}{n_{zR}} - \frac{n_{xL}}{n_{zL}}\right) z_{CS} + \Delta_{0RL}.$$

If this distance is measured at some time taken as the origin and a time t later, then the precise position of the cross-section time can be determined from the change in distance between the notches:

$$z_{CS}(t) = \frac{\Delta_{RL}(t) - \Delta_{RL}(0)}{\frac{n_{xR}}{n_{zR}} - \frac{n_{xL}}{n_{zL}}} + z_{CS}(0)$$

If the notches are patterned at ±45°, then $$\frac{n_x}{n_z} = \pm 1$$

and this simplifies to:

$$z_{CS}(t) = \Delta_{RL}(t) - \Delta_{RL}(0) + z_{CS}(0)$$

Figure 23:
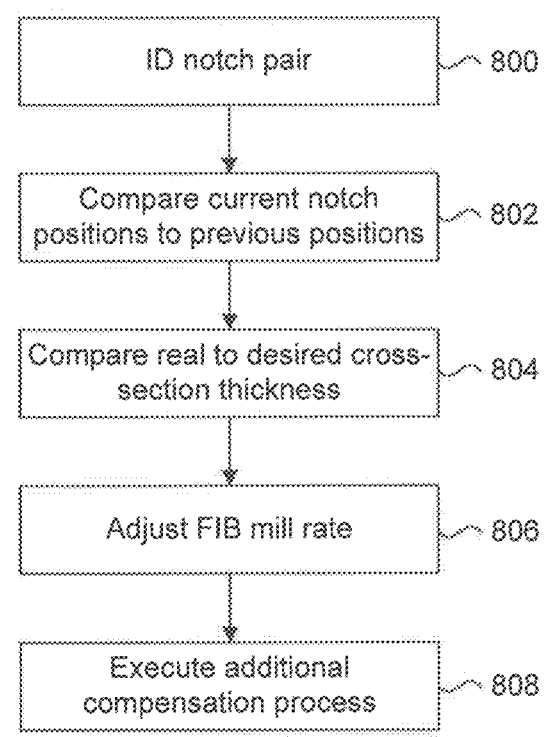
FIG. 23 is a flow chart of method for controlling an FIB sectioning rate, according to a present embodiment.

The change in distance between the notches is twice the change in z of the cross-section position. This means that under these conditions, with a precision of 2 nm when measuring the distance between the notches, the position of the cross-section can be determined to within 1 nm. According to the present embodiments, the method of FIG. 7 can include this calculation as frequently as is determined to be necessary by the calculated drift model, or as desired by the user, this calculation being performed based on high resolution XROI imaging of the expected location of the notches (iteratively if necessary, with expansion and/or repositioning of the notch imaging XROI if the first XROI image pass does not find the notch where it was expected to be). From these notch XROI images, the notches can be automatically identified by the system and a determination is made from the previous notch position the approximate depth the current cross-section image relative to the previous low resolution cross section image (key frame). From this calculation, if the current cross-section depth is thicker than desired, then the milling rate is decreased. Otherwise, if the current cross-section depth is thinner than desired, then the milling rate is increased. This rate of increase or decrease of the milling rate of the FIB can be calculated by the CPB workstation 100, which in turn controls the FIB accordingly. FIG. 23 is a flow chart illustrating a sub-process for controlling the FIB sectioning rate, which can be used in combination with the method of FIG. 7.

In FIG. 23, it is assumed that a key frame image, or even one or more high resolution images (which may be XROIs), of a region of interest of a sample having the aforementioned notches formed therein has been acquired. At 800, the faces of a pair of notches are identified from the image data. This can be done manually by having the operator input the notch positions, or automatically via pattern recognition routines executed by CPB workstation 100. Then the x axis positions of the notches are compared with the x-axis positions of the notches from a previous image at 802. The CPB workstation can then calculate the approximate real thickness of the section, being the material removed since the last image that resulted in the current image. A comparison is made between the real calculated thickness to the desired thickness input by the operator at 804. Based on this difference, a new FIB mill advancement rate is applied to the CPB system 10 which would result in the next section having a real thickness that matches the desired thickness. If there is no difference, within a predetermined margin of error, then no change to the FIB milling rate is made. In an optional step 808, at least one additional compensation process can be executed using the notches. These additional compensation processes are now described.

According to the present embodiments, the notches are imaged in the cross section view and can be used by the CPB workstation 100 to execute other different operations. The CPB workstation 100 can calculate the position of the mill based on the alignment marks, compared to where it is expected to be based on the intended position of the milling beam. Therefore, it is possible to determine the amount of drift of the sample relative to the milling beam. The source of this drift, be it stage, sample, beam electronics, etc. is unimportant, as it simply relates to the actual versus estimated position of the milling beam relative to the sample. A suitable model can be used to project future drift based on observed values and preemptively adjust the milling beam position to match a target milling rate.

In other application of the notches, the position of the sample surface in the X and Y plane (cross-section imaging position) can be determined. By calculating shifts in the image based on the notches, it is possible to determine the amount of drift of the sample relative to the imaging beam. The source of this drift is unimportant, it simply relates to the actual versus estimated position of the milling beam relative to the sample. A suitable model can be used to project future drift based on observed values and preemptively moderate the imaging beam position to minimize any drift that may occur during the image acquisition.

In yet another application, the CPB workstation 100 can normalize the intensity of the image based on the light and dark portions of the protective layers above and below the notches. When the notches are created as a stack of two materials of different CPB imaging contrast, the histogram of an image of the bilayer above and below the notches will generally be bimodal. The average and spread of the two modes of the histogram can be used to evaluate or compensate for brightness and contrast changes of the detector or the beam current, etc. of the CPB beam itself.

Additional applications for the notches include:
1) Automatic sample realignment. Using multiple fiducials would allow full and precise repositioning of the sample in the event the stage was moved or the sample unloaded.
2) Automated aperture alignment, in the event multiple milling apertures need to be used.
3) Automatic realignment in the event of a glitch (or power off/power on) of the milling beam.
4) Autofocus and autostigmation of the milling beam.

Figure 24:
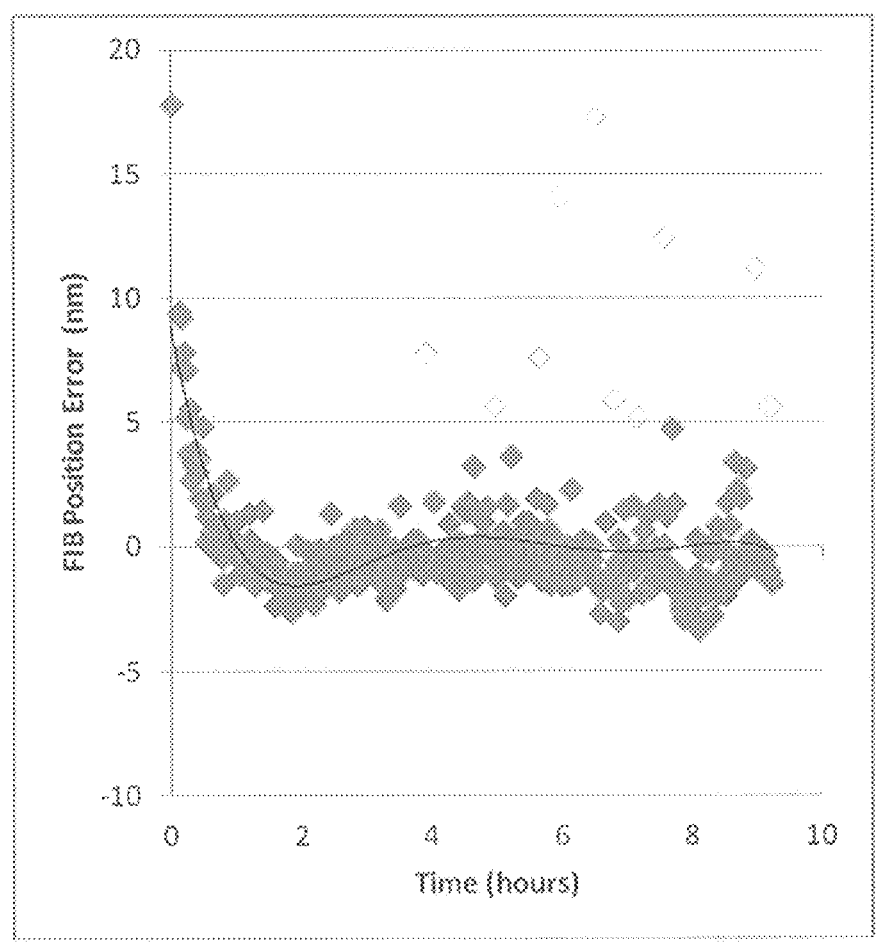
FIG. 24 is an example graph showing alignment data when using the 3D tracking method embodiment of FIG. 23.

FIG. 24 shows data from the execution of the 3D tracking method according to the previously described embodiment, operating on a sample whose desired slice thickness is 5 nm. The FIB Positional Error, which is effectively the measured error in the slice thickness, is plotted versus the time since the data acquisition run commenced. As shown in FIG. 24, during the first hour or thereabout after the sample has been loaded in the microscope and the run has begun, the drift rate is typically very high. In the absence of this algorithm this leads to slices that would be 25 nm or more in thickness (or 0 nm if the sample drifts away from the patterning beam). As can be seen in FIG. 24, the previously discussed tracking method rapidly reduces the error in the slice thickness to a nanometer or two. Note that approximately ten of the many hundred measurements are shown as open diamond symbols, rather than filled diamonds. These measurements are determined to likely be due to imaging error, as determined by algorithms that may compare the quality of the image of the notch, the likelihood, based on the predictive drift model, environmental feedback, etc., that the position of the notches as determined by the imaging of the notches is correct, etc. In the event this error checking algorithm determines there may potentially be a problem with the latest images of the notches, this algorithm can be set to trigger one or more iterative re-imaging steps to reduce or eliminate this error.

It is advantageous to correct for any drift in a predictive manner, allowing for a smooth, adaptable adjustment of both the milling and imaging beam position (or adjustment of just one beam) to predictively correct for any error measured from the fiducial marks discussed above, commonly referred to as "drift". It is often optimal that this smooth correction for drift be performed as a series of small corrections separated in time, rather than larger corrections that are more discontinuous in nature.

A slice of the sample is milled away by rastering the milling beam according to a pattern that is predominantly perpendicular to the thickness of the slice to be removed. In its simplest implementation, the milling beam is rastered in a single line, perpendicular to the slice thickness. As the beam is rastered, it is continuously or discretely shifted along the direction of the slice thickness with an nominal average linear progression rate in the direction of the slice thickness of $v_n$. After time $\Delta t$, a slice of nominal thickness $\Delta l_n = v_n \Delta t$ will have been removed. By imaging the fiducial notches at times $t_0$ and $t_0 + \Delta t$, it is possible to determine the actual thickness of the slice $\Delta l$ or equivalently the actual average progression rate of the beam $v = \Delta l / \Delta t$, and therefore infer the amount of drift of the entire system in the direction of the slice thickness. This drift is primarily comprised of drift of the milling beam due to electronic stability, physical sample drift as well as beam displacement induced by the interaction of the milling and/or imaging beams with the sample.

At certain intervals $t_i$, which might be for every slice of for a number of slices, the effective drift rate of the system $v_d(t_i)$ can thus be estimated. Given this estimate of the drift rate, it is possible to preemptively and continuously adjust the milling progression rate $v_m$ to include the drift rate and therefore produce slices that have thicknesses closer to the target nominal thickness. In the present embodiments, the milling beam progression rate $v_m$ is dynamically adjusted at each time $t_i$ base of the new measurement of the real progression as well as on past measurements $\{v(t_i)\}$ in an effort to generate the nominal milling rate $v_n$. A reader skilled in the art will recognize that this system is one where current and past measurements are used as feedback to predictively compensate for system errors and instabilities to recover a nominal target.

Figure 25:
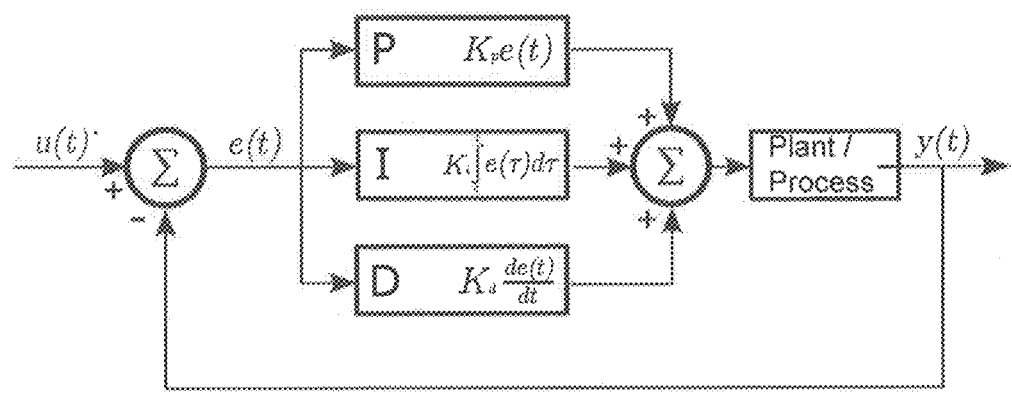
FIG. 25 is a block diagram of a proportional-integral-derivative (PID) controller.

Such a system can be solved by implementing a control-loop feedback mechanism such as one implemented in a proportional-integral-derivative (PID) controller. A block diagram of a known controller is shown in FIG. 25. In such a controller, where the error $e(t_i) = v_n - v(t_i)$ is the difference between the nominal milling rate and the measured milling rate, the correction to the milling drift rate is calculated based on the current error (proportional component), the integral of all past and present errors (integral component) and derivative of the current error (derivative component).

The determination of the optimal parameters ($K_P, K_I, K_D$) for accurately and reliably predicting the proper milling progression rate is beyond the scope of this document. In a simple implementation, the proportional, integral and derivative coefficients of the controller can be fixed by design, and the controller is simply used to calculate the milling rate applied to the beam based on all measurements of slice thicknesses. If the control mechanism is stable, this will result in slice thicknesses that are closer to the nominal target slice thicknesses. This is particularly relevant at very small nominal progression rates when the drift rate is comparatively large. Without compensation, the slice thicknesses could potentially be much too large resulting in loss of sample information.

The position of the fiducial notches can also be used to compensate for system drift as observed by the imaging beam. Prior to acquiring an image, the relative position of the notches is used to determine the z position of the cross-section face, and their absolute position can be used to re-centre the fiducials in the x-y imaging plane. Note that although only a single notch is necessary, using multiple notches allows more flexibility and more robustness in the calculation of the drift. In particular, it can be used to virtually eliminate surface topography effects by choosing which notches to use. It may be beneficial to perform this step during the acquisition process and not simply during post analysis as it allows the target volume of interest to be properly tracked and imaged efficiently. By example, steps 800 and 802 can be executed in combination with step 300 of FIG. 7, just prior to acquisition of the image to compensate for any drift.

Without correction, it may be necessary to image a larger volume than necessary to ensure that the target volume is acquired. Given the potentially very long acquisition times (possibly several days), the system stage may drift several microns under normal operating conditions, so it is advantageous to frequently adjust for this drift to obtain consistent and reliable results.

In addition to statically adjusting the imaging beam shift to re-centre the features prior to acquiring the image, it is also possible to correct for drift during the image based on the current, past and future measurements of the fiducial positions. As a first implementation performed during post-processing, given a measurement before and after an image, a calculation can be performed determine the average drift that occurred during the image and to skew the image to compensate for this drift: if a drift $\vec{d} = (d_x, d_y)$ is measured between times t and $t + \Delta t$, then an image scanned left to right and top to bottom can be skewed or otherwise adjusted during the scan (or less optimally during post-processing) according to FIGS. 26B, 26C and 26D to recover a more realistic representation of the sample.

FIG. 26B to 26D illustrates the track of a beam on the sample being distorted from a diamond XROI as shown at FIG. 26B, to the distorted shapes shown in images of FIG. 26C and FIG. 26D. A reference fiducial 1400 is shown in FIG. 26B. The original image 1402 drifts from slice to slice to distorted images 1406 as shown by cumulative drift 1408 and 1412 in FIGS. 26C and 26D, respectively. This distortion is evident even in the presence of classic drift correction that is applied "all at once" at the beginning of each image pass.

In an example embodiment, a predictive dynamic drift correction is used to "de-skew" this distortion during scanning. At the end of the scan the predicted drift and the actual drift may be compared, and if necessary, a correction skew may be applied in post processing the image.

The predictive dynamic drift correction uses a Predictive Model of Drift that allows continuous sub-pixel compensation. In implementation, one or more fiducial(s) 1400 are monitored for the time taken to acquire the image 1402. A drift factor is calculated for example, based on a drift of the fiducial(s) 1410) and the drift correction factor is applied on the subsequent frames, for example, to FIG. 26C and FIG. 26D based on "picometer" beam correction—i.e., by applying infinitesimally small correction to each pixel. The correction is typically well below DAC granularity, so that the correction results in a "smooth" correction throughout image.

The dynamic drift correction results in the corrected image scanning the exact desired region, similar if not identical to FIG. 26B and not as shown in FIG. 26C and FIG. 26D obtained due to continuous drift during imaging, which outline classic drift correction which takes place periodically (often at the end of an image) as a single motion. By storing applied drift vector for every image (which may or may not be applied linearly), the drift correction can also be "removed" from the image if it proves to be a poor estimate, or re-corrected, which results in a somewhat skewed imaged area, but most likely not as badly skewed as with "Classic" drift correction.

In other example embodiments, the dynamic drift correction may be applied based on environmental monitoring. For example, drift correction may be applied as a function of spatial and environmental measurements, such as temperature, pressure, sound etc. The impact of these environmental factors on the drift may be modeled as a function of change in the environmental factor (for example, how a 1 degree change in temperature affects the drift) and the drift correction may be adapted to incorporate these measurements and modeled impact in real time. This enhances the dynamic drift correction capabilities and improves the quality of imaging when an image may take several minutes to acquire.

In a further example embodiment, the dynamic drift correction may also be used to interrupt an image periodically to drift correct. However, the interruption may result in "jumps" in the image and hence it may be preferable to correct the drift as a smooth function based on the predictive model, and perhaps update the predictive model periodically (e.g. multiple times within a scan) instead.

According to a present embodiment, a drift correction method is executed during live imaging as in the case of the preemptive milling correction. Given past drift measurements, a preemptive beam shift is applied during the imaging to compensate for the expected drift during the image, negating the need for post-processing. Again, as in the case of the milling correction, a PID controller can be used to estimate the amount of drift necessary to compensate for the system drift and eliminate any actual shift in the image. For very long image acquisitions, the amount of drift at various times during the image can be re-evaluated (e.g. pause at the end of a line, image the notches, then resume the imaging) in case the required drift correction changed during the acquisition time. Note that the drift correction to be applied can be calculated to a level that is well below the least significant bit on the DAC. For example, the total drift correction calculated to be applied during an imaging sequence can be divided by the total number of dwell periods during said imaging sequence, and this differential drift correction per pixel can be added to the engine at each and every pixel dwell, and when the cumulative correction becomes large enough to exceed one DAC LSB, the correction effectively shifts the beam by one LSB, and the accumulation of correction continues.

In the examples discussed thus far, the "slice" of material removed by an ion beam is generally removed in a geometry such that the ion beam is at a glancing angle to the surface being sliced. It is also possible to remove material using an ion beam whose angle of incidence is much closer to the normal to the surface being sliced. In general, it is well known in the art (especially from the field of SIMS) that this approach will develop topography, especially if the sample is not homogenous. Gas based chemistries can be used during milling (also known as NanoPatterning or patterning) to enhance the removal rate of a material, sometimes selectively compared to the removal rate of another material, but when the patterning beam deviates from near glancing incidence topographic artifacts as well as artifacts due to uneven gas flow tend to disrupt the uniform removal of material and disrupt the desired "flat bottom" structure necessary for such processes as circuit editing or 3D reconstruction.

The following probabilistic patterning embodiment is used for maintaining a "flat bottomed" structure desired for circuit editing or 3D reconstruction. Most patterning involves repeating the same simple pattern over and over for a given amount of time. In the case of regular shapes such as rectangles, this results in a shape that has been exposed to a uniform dose, and will consequently have eroded or deposited a uniform amount of material, subject to milling or deposition effects (particularly on the periphery of the NanoPatterned areas) that are well known in the art to occur.

To expose a shape to a non-uniform dose, commonly known as "bitmap" or "greyscale" milling, several implementations exist. The most common approach is to vary the dwell time at each pixel of the shape based on the grey level of its corresponding pixel in the shape mask. This results in a dose distribution that is a copy of the dwell time distribution. Another approach is to pattern the shape as a sequence of slices corresponding to the various grey levels in the mask bitmap. This also results in a final dose distribution that matches the grey-level distribution in the mask image. It should be noted that as early as 1995, Micrion Corporation of Peabody, Mass. incorporated a means to pattern using this second approach, with the "bitmap" generated at predetermined intervals from the signals (image) generated by the ion beam.

The advantage of the first method is that each pass delivers a proper distributed dose and that all the pixels are visited for each pass, so if the pattern is stopped at any point in time, the actual dose distribution is proportional to the target distribution. However, during each pass, the local dose delivered per pixel is not constant: pixels with longer dwell times receive more dose that those with shorter dwell times. In the case of gas assisted etching or deposition, where the dose per pixel must be closely regulated to avoid gas depletion and optimize milling efficiency, this results in inefficient and sometimes improper milling conditions. The second method does not suffer from this problem since each slice is patterned with the proper dwell and pixel spacings, thereby ensuring gas chemistry to be optimal. However, since the patterning of each slice is occurring as subsequent steps, the proper dose distribution is only obtained after all the slices are processed.

Figure 26A:
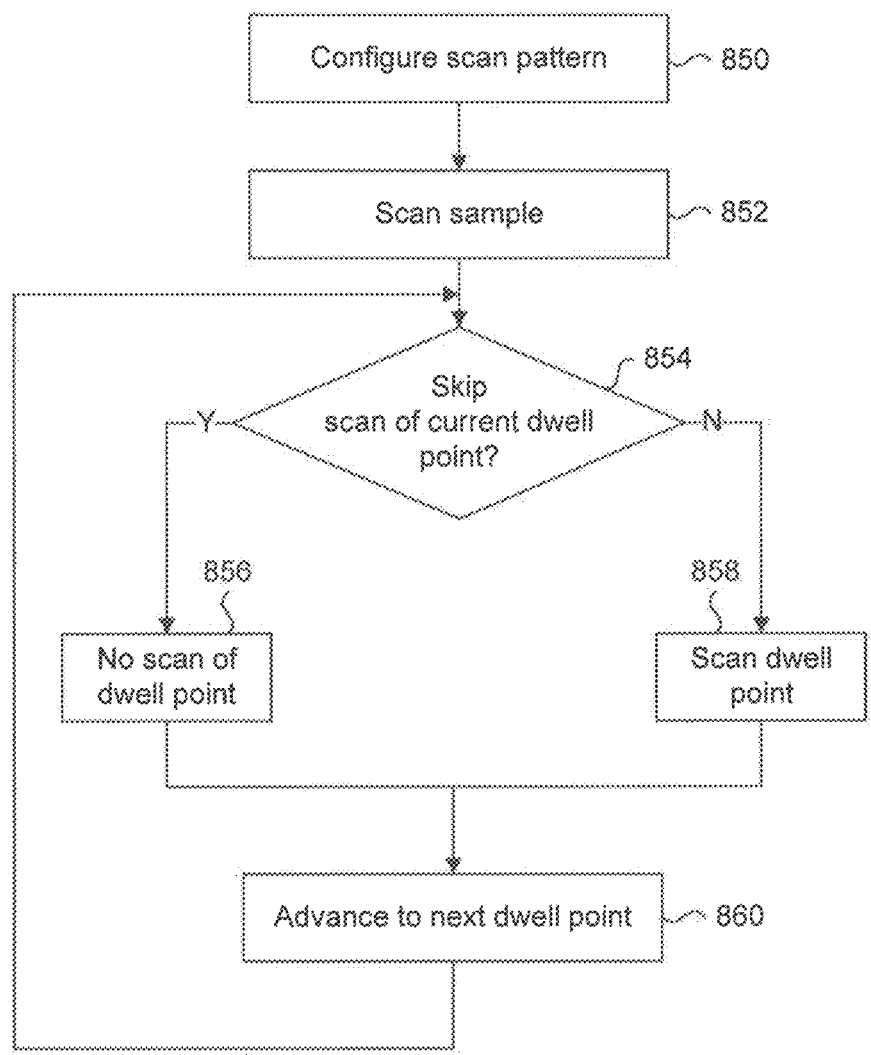
FIG. 26A is a flow chart showing a probabilistic patterning method, according to a present embodiment.

To resolve issues with the existing approaches, the presently described probabilistic patterning method is employed, an embodiment of which is shown in FIG. 26A. The scan pattern for a region of interest input by the operator is configured at 850 by the CPB workstation 100. The scan of the sample is executed at 852 and the beam is iteratively positioned at each dwell point within the pattern. At 854, the scan generator algorithm will choose whether it will dwell on a dwell point or skip it with a probability supplied as the mask bitmap. If the dwell point is skipped, then the beam is not activated, and the beam is positioned for the next dwell point at 860. Otherwise, the beam is activated at 858 and the beam is positioned for the next dwell point at 860. The method loops back to 854 for a determination if the current dwell point is to be skipped or not.

The result of this approach is that for each pass, the proper dwell time is applied to all of the dwell points, resulting in proper gas assisted processes, and at any time the average local dose will be correct. Based on the central limit theorem of probability theory, the patterned dose distribution at each dwell point will converge to the target distribution given a large enough number of passes. In the present embodiment, the operator has the option to control the number of passes of the pattern by the beam. The greater the number of passes, the closer the actual dose distribution will reflect the target dose distribution.

Although this approach is probabilistic and may be implemented using a number of well known methods of generating random numbers, implementation is accomplished by using a known random number sequence to accept or reject dwell points at each pass, which results in a very deterministic stream of dwell points that can readily be deconvoluted during imaging to determine where the beam dwelled and where it did not, thus allowing the resultant signals from the target to be imaged, thereby allowing the patterning to be constantly monitored in real-time, allowing proper visual endpointing. Indeed, it is possible to apply the approach of Micrion Corporation to determine, via this signal collected at known increments, how to evolve the milled (or otherwise patterned area) over time, based on the image, reconstructed periodically, from the signals and deterministic stream of dwell points.

In addition to resolving both issues of instantaneous dose distribution proportional to target dose distribution, and proper pixel dose per pass, this technique also resolves other issues present when using gas assisted etching. One common example occurs when using XeF2 to assist the etching of silicon, once exposed to the beam, the silicon continues to be etched spontaneously for a short period of time. This spontaneous etching typically is not uniform and results in pitting of the surface which may get accentuated by further milling and will result in a non-flat mill. When using a variable dwell method, the total frame time may be quite long because of the dwell multiplier (a 1000×1000 pixel pattern with a base dwell of 100 ns and an average multiplier of 128 will have a frame time of more than 12 s). When using the slice based approach, in portions of the pattern that do not get many passes, the delay between the slices where the beam is unblanked may be too long, thereby resulting in pitting in these areas.

When using the probabilistic patterning embodiments, even if an area has a low overall probability, the probability that at least one pixel in the vicinity will be patterned at each frame can be quite high. So even though for a given pixel, the time between visits may be large enough to cause problem with self etching if its milling probability is low, the time between visits in its vicinity will be such that self etching can be inhibited. For example, if an area of the pattern has a probability of 20% of being patterned (⅕ of the total dose is desired), then for a square dwell point arrangement where each pixel has 8 neighbours, then the probability of at least one of the neighbours of being visited at each pass is almost 90% (P=1−(1−20/100)9), which direct experimentation has proven to be sufficient to reduce the spontaneous etch issues using $XeF_2$.

A benefit of the probabilistic patterning embodiment is the reduction of the current density of the incident beam on the sample, which can reduce charging artifacts during imaging.

Probabilistic milling can also be used for top-down or nearer normal incidence removal of material for 3D activities, rather than near glancing angle. Scanning the beam in a probabilistic pattern according to the previously described embodiment, rather than in the conventional sequential method, reduces differential milling artifacts that arise from sample features, leading to a more planar removal rate. Note that the sample can be monitored using either the signal generated by the patterning beam during probabilistic patterning, or by another imaging beam such as an electron beam directed at the area of interest. By having the imaging beam off-axis from the patterning beam, a three-dimensional view can be reconstructed whose information can be used to alter the probabilistic patterning probability distribution to smooth out (or enhance if desired) variations arising from sample inhomogeneity.

As previously mentioned, the 2D and 3D imaging embodiments can benefit from additional improvements over control of the CPB system 10, which can be provided by CPB workstation 100. These are referred to as multi-pass rastering, spatial super-sampling and temporal sub-sampling, which can be optionally enabled during the imaging phase in order to improve data quality or optimize a particular component of the signal that is used to generate the image.

During any beam raster operation executed by CPB system 10, which includes imaging, milling, gas assisted etching or deposition, the FIB beam deflection software and hardware deflects or positions the beam in a preset pattern across the surface, generally referred to as rastering. At each preset location, the beam is left to dwell for a given period of time before moving to the next point in the raster. At its simplest, a raster pass consists of positioning the beam at fixed increments along one axis from a start point to an end point, dwelling for a fixed dwell time at each point. At the end of a line, the beam waits a fixed retrace time before moving an increment in a second axis. The beam may return to the start point in the first axis and begin again, or may begin "counting down" the first axis from the point it had just reached (depending on whether the raster type is raster (the former) or serpentine (the latter). This process continues until all increments in both axes have occurred, and the beam has dwelled at all points in the scan. The typical spacing between each point along a raster is determined based on the scan size and the digital scan generator. These factors affect the resolution of the scans as discussed below.

Many CPB systems use 12 bit high speed deflection on a 12 bit scan generator. Dwell time per point is typically less than 1 µs. One example is the Vectra FIB system from FEI Company of Hillsboro Oreg., which is capable of achieving a focused spot with significant beam current that is less than 20 nm in diameter. When operating with a 20 nm spot at a 320 µm FOV at the maximum limit of the 12 bits of the scan generator, the spacing between scan points, $\Delta x_{scan}$ and $\Delta y_{scan}$ will be about four times the spot size (320 µm/4096≈80 nm). This results in a situation such as that shown diagrammatically in FIG. 27, where a single raster pass "A" generates dwell points that are on a grid with spacings $\Delta x_{scan}$ and $\Delta y_{scan}$, each $\Delta x_{scan}$ and $\Delta y_{scan}$ equalling about 80 nm.

Figure 27:
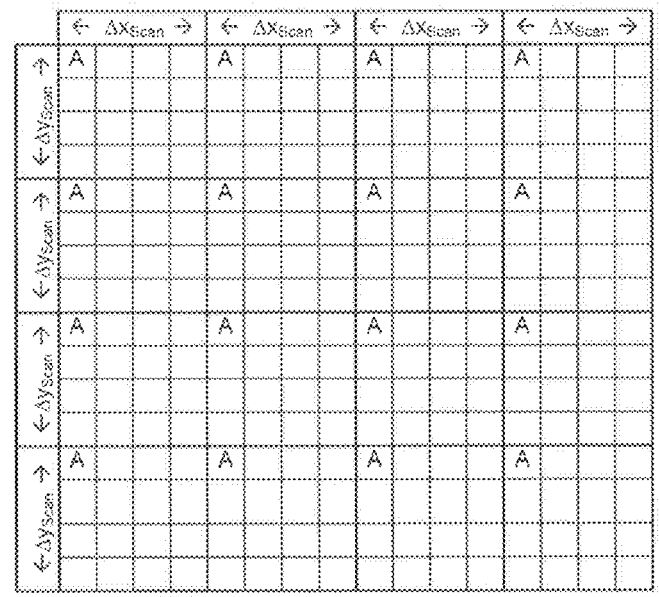
FIGS. 27 and 28 are diagrams of scan areas.
Figure 28:
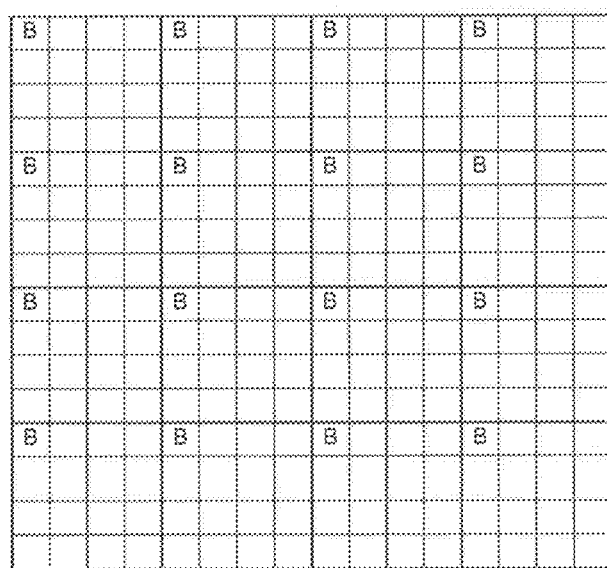

As can be seen from FIG. 27, under these beam and scan conditions only $\frac{1}{16}^{th}$ of the total area nominally being scanned is actually having the beam incident upon its surface because of the limitations of the 12 bit scan generator. Although under these beam conditions the CPB is capable of a 20 nm spatial resolution, it cannot address points 20 nm apart under these scan and FOV conditions, hence its resolution effectively becomes limited by the 12 bit scan generator. Assuming no random drift occurs, the next raster pass "B" of the scan will place the beam at exactly the same locations, with exactly the same problems, as shown in FIG. 28.

The raster scanning method according to a present embodiment improves the spatial resolution of the scans by controlling the beam along a raster. The method advantageously uses the finer placement controls for the beam available on CPB systems. For example, the Vectra can position the beam with much finer placement through a control known as the beam Pan (analogous to a beam Shift or other offset voltage as applied in other CPB systems). On the Vectra and similar systems, the magnitude of the Pan deflection is independent of the field of view, and the minimum Pan increment is on the order of the smallest spot size achievable, although the speed with which the Pan can be varied is typically much slower than the deflection. Thus, even at the 320 µm FOV considered in the earlier example, it is possible to deflect the beam, using the Pan, by an increment that is much smaller than the scan increments $\Delta x_{scan}$ and $\Delta y_{scan}$, which are both ~80 nm at a 320 μm FOV.

Figure 29A:
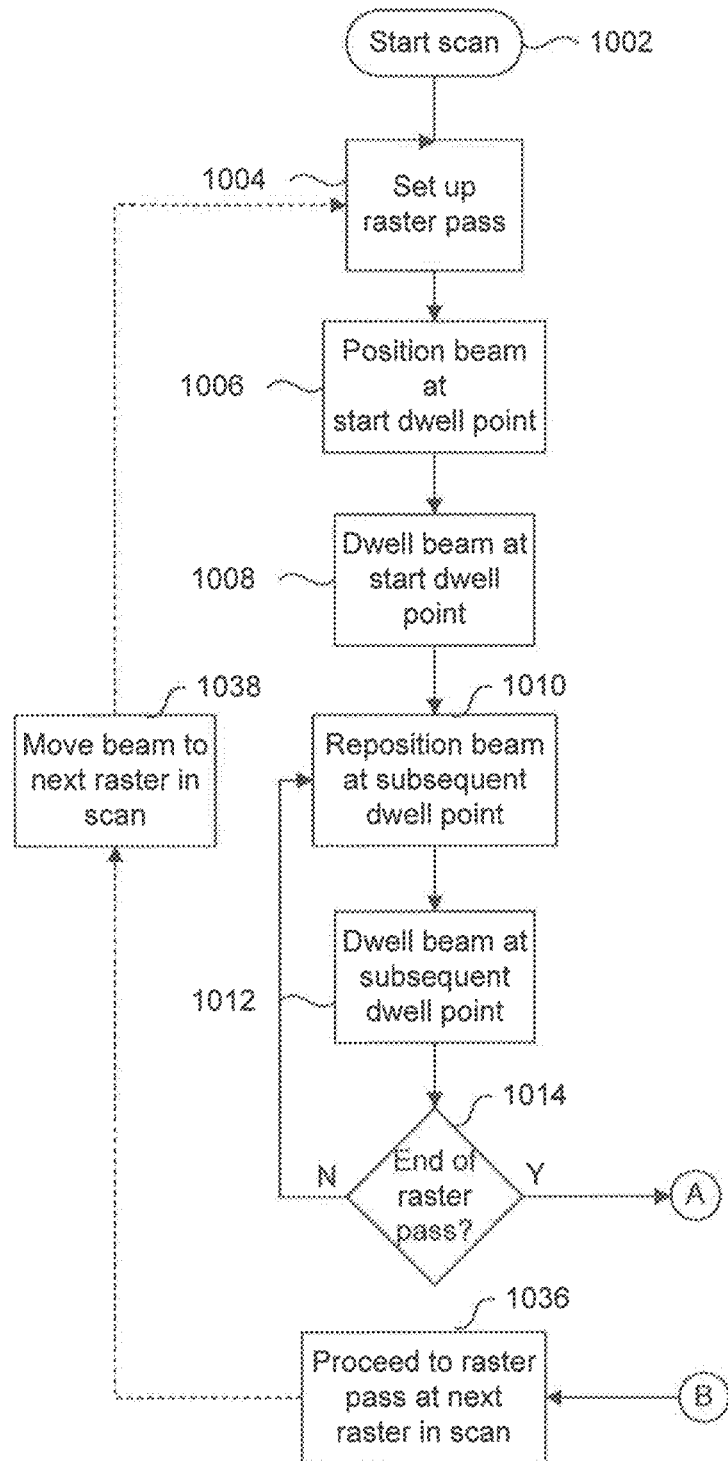
FIGS. 29A and 29B is a flow chart of a scanning method, according to a present embodiment.
Figure 29B:
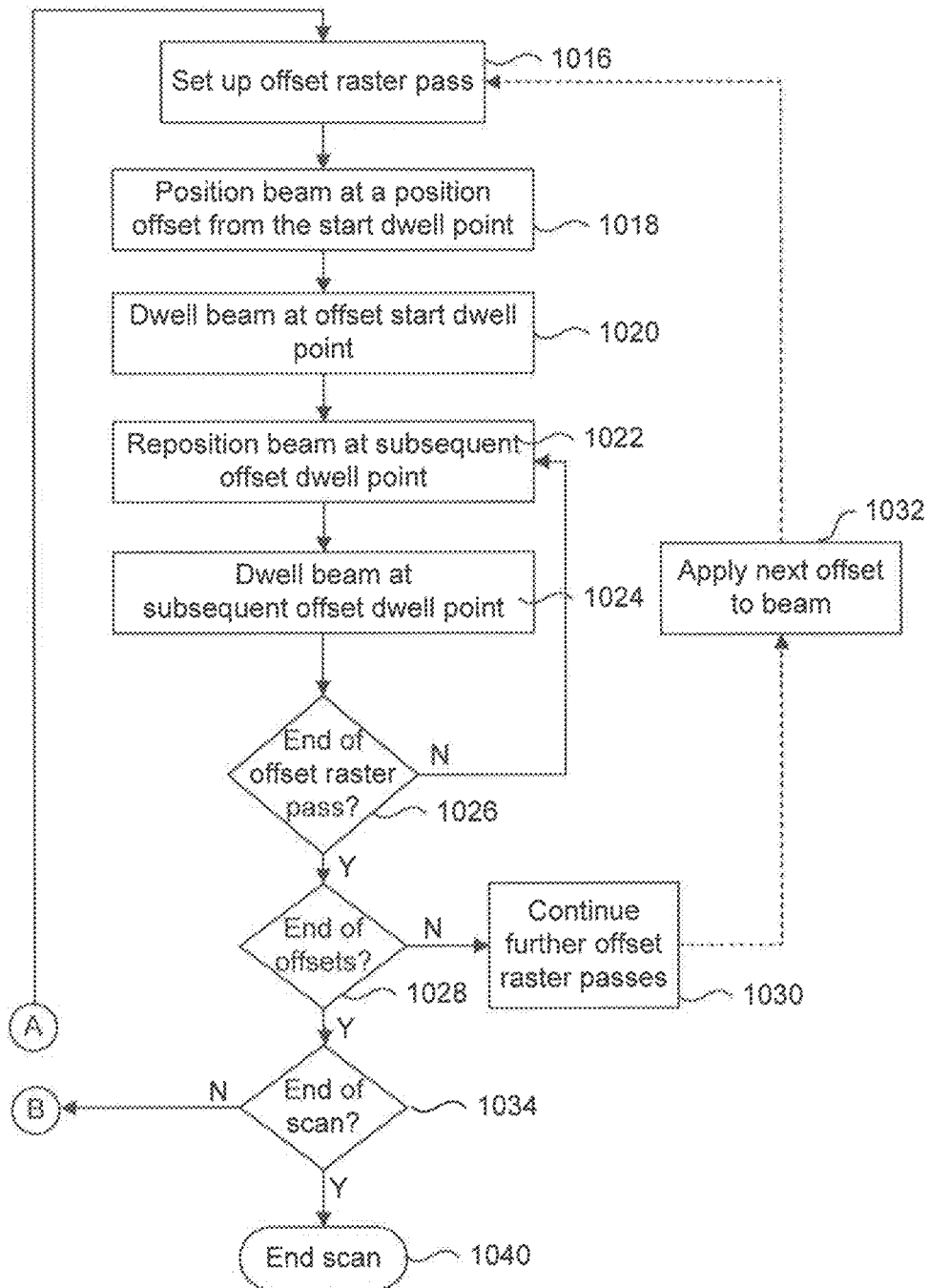

Generally, the method may be implemented in an example embodiment as illustrated in the flowchart of FIGS. 29A and 29B, where FIG. 29B is a continuation of FIG. 29A. When a scan is started 1002, the CPB system is set up for raster pass 1004 to collect data. The beam is positioned at a start dwell point in the raster 1006 and allowed to dwell at the start dwell point for a selected period of time 1008. The beam is then repositioned the beam at a subsequent dwell point along the raster 1110 and allowed to dwell at the subsequent dwell point for the selected period of time 1012. The repositioning and dwelling is iteratively performed at subsequent dwell points until the end dwell point in the raster is reached, i.e., the end of raster pass is reached 1014. Each subsequent dwell point is defined by a fixed spacing from its previous dwell point. As described earlier, the fixed spacing or increment is a function of a scan size and a resolution of the digital scan generator.

For improving the spatial resolution, one or more offset raster passes are performed 1016. In an offset raster pass, the beam is repositioned the beam at a position offset from the start dwell point in the raster 1016, once the end of the raster is reached. The offset is less than the fixed spacing, and may be determined, for example, as function of the beam size. The beam is then allowed to dwell at the position offset from the start dwell point for the selected period of time 1018. The beam is then iteratively repositioned at subsequent offset dwell points along the raster 1020 and allowed to dwell at each subsequent offset dwell point for the selected period of time 1024 until the end dwell point in the raster is reached 1026. Each subsequent offset dwell point is defined by the fixed spacing from its previous offset dwell point.

At the end of an offset raster pass, if additional offset raster passes are desired 1028, further offset raster passes are performed 1030 and additional offset is applied to the beam 1032 for setting up the next offset raster pass. Upon completion of the multiple-raster passes and no further offsets remain in the current raster, the raster is advanced to the next raster in the scan 1036. Upon completion of multiple-raster passes for each raster in the scan, i.e., when the end of scan is reached 1034, the process is stopped 1040.

Figures 30, 31:
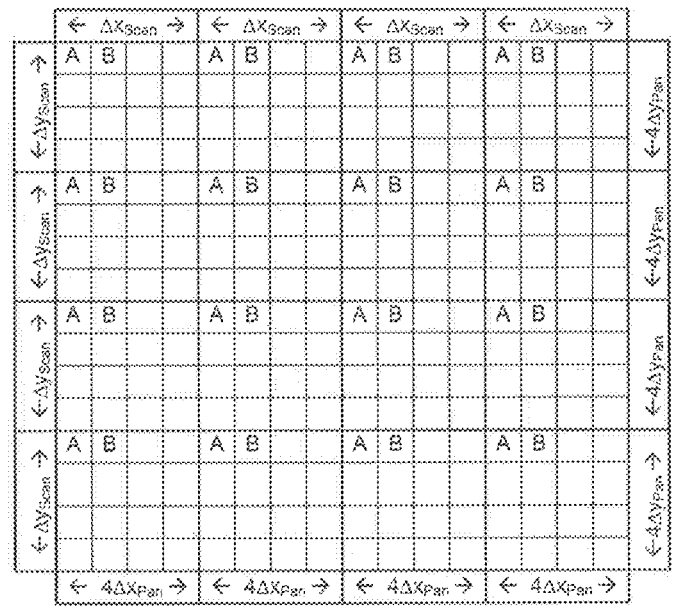
FIGS. 30 and 31 are diagrams of scan areas after using the method of FIGS. 29A and 29B.

With reference to FIG. 30, consider a case where the Pan increments $\Delta x_{Pan}$ and $\Delta y_{Pan}$ could be set to 20 nm, namely one quarter of the scan increments ($\Delta x_{Pan} = \frac{1}{4} \Delta x_{scan}$) By performing a first raster pass "A" with $\Delta x_{Pan} = 0$ nm, then setting the $\Delta x_{Pan} = 20$ nm, and performing a second raster pass "B", the sample would have been exposed to the beam in the manner as shown in FIG. 30.

According to an embodiment of the present invention, this general approach can be repeated a total of 16 times, over raster passes "A" through "P", sequentially changing $\Delta x_{Pan}$ and $\Delta y_{Pan}$ at the completion of each raster. Within each $\Delta x_{scan}$ and $\Delta y_{scan}$, sixteen different $\Delta x_{Pan}$ and $\Delta y_{Pan}$ could be set, according to Table 1 below:

TABLE 1

| A | B | C | D |
|---|---|---|---|
| $X_{Pan} = 0$ nm<br>$Y_{Pan} = 0$ nm | $X_{Pan} = 20$ nm<br>$Y_{Pan} = 0$ nm | $X_{Pan} = 40$ nm<br>$Y_{Pan} = 0$ nm | $X_{Pan} = 60$ nm<br>$Y_{Pan} = 0$ nm |
| E | F | G | H |
| $X_{Pan} = 0$ nm<br>$Y_{Pan} = 20$ nm | $X_{Pan} = 20$ nm<br>$Y_{Pan} = 20$ nm | $X_{Pan} = 40$ nm<br>$Y_{Pan} = 20$ nm | $X_{Pan} = 60$ nm<br>$Y_{Pan} = 20$ nm |

TABLE 1-continued

| I | J | K | L |
|---|---|---|---|
| $X_{Pan} = 0$ nm<br>$Y_{Pan} = 40$ nm | $X_{Pan} = 20$ nm<br>$Y_{Pan} = 40$ nm | $X_{Pan} = 40$ nm<br>$Y_{Pan} = 40$ nm | $X_{Pan} = 60$ nm<br>$Y_{Pan} = 40$ nm |
| M | N | O | P |
| $X_{Pan} = 0$ nm<br>$Y_{Pan} = 60$ nm | $X_{Pan} = 20$ nm<br>$Y_{Pan} = 60$ nm | $X_{Pan} = 40$ nm<br>$Y_{Pan} = 60$ nm | $X_{Pan} = 60$ nm<br>$Y_{Pan} = 60$ nm |

This would result in a more optimal mapping of the field of view, where after this 16 raster pass operation was complete, the dwell points data could be reconstructed to produce an image where all dwell points were contiguous. FIG. 31 illustrates the resulting mapping after implementing an embodiment of the present invention.

According to another embodiment of the present invention, the previously described method could be further refined by modifying the Pan variation algorithm to operate in a "serpentine" manner, where between each sequential raster pass "A" through "P" only a very small change in the Pan settings would be required. Such small changes could likely be accommodated in a more stable manner by the slower speed Pan electronics. Table 2 illustrates a raster pass mapping according the presently described embodiment of the invention.

TABLE 2

| A | B | C | D |
|---|---|---|---|
| $X_{Pan} = 0$ nm<br>$Y_{Pan} = 0$ nm | $X_{Pan} = 20$ nm<br>$Y_{Pan} = 0$ nm | $X_{Pan} = 40$ nm<br>$Y_{Pan} = 0$ nm | $X_{Pan} = 60$ nm<br>$Y_{Pan} = 0$ nm |
| H | G | F | E |
| $X_{Pan} = 0$ nm<br>$Y_{Pan} = 20$ nm | $X_{Pan} = 20$ nm<br>$Y_{Pan} = 20$ nm | $X_{Pan} = 40$ nm<br>$Y_{Pan} = 20$ nm | $X_{Pan} = 60$ nm<br>$Y_{Pan} = 20$ nm |
| I | J | K | L |
| $X_{Pan} = 0$ nm<br>$Y_{Pan} = 40$ nm | $X_{Pan} = 20$ nm<br>$Y_{Pan} = 40$ nm | $X_{Pan} = 40$ nm<br>$Y_{Pan} = 40$ nm | $X_{Pan} = 60$ nm<br>$Y_{Pan} = 40$ nm |
| P | O | N | M |
| $X_{Pan} = 0$ nm<br>$Y_{Pan} = 60$ nm | $X_{Pan} = 20$ nm<br>$Y_{Pan} = 60$ nm | $X_{Pan} = 40$ nm<br>$Y_{Pan} = 60$ nm | $X_{Pan} = 60$ nm<br>$Y_{Pan} = 60$ nm |

This "serpentine" mapping technique preferably uses software configured to activate the necessary $\Delta x_{pan}$ and $\Delta y_{pan}$ settings between raster passes, as well as to reconstruct the resultant new image at high resolution as a mosaic of 16 separate raster passes. Such software or firmware can be written, or existing control software can be modified.

It is noted that in the above example embodiment, upon completion of the first raster pass (with no offset), the beam is repositioned at the start dwell point with the offset applied. In other example embodiments, the beam need not be repositioned at the start dwell point (with the offset) for the subsequent raster, but the subsequent raster may commence at the end dwell point, by positioning the beam at a position offset from the end dwell point and rastering in a direction opposite to the previous raster. This process is referred to as "double serpentining."

An advantage of this technique is the virtue of requiring no major changes to the deflection electronics. It is noted that if the deflection power supplies prove to be insufficiently stable, they can be replaced with more stable units without effecting the other components or control logic. It is further noted that the presently described embodiments are not limited to 16 raster passes.

Another advantage of this embodiment is the fact that, as the CPB system is designed to accept Pan changes during rastering, this method could be implemented without requiring a change to the raster control software merely by setting up a system to set the necessary $\Delta x_{Pan}$ and $\Delta y_{Pan}$ settings at the appropriate points in time. Otherwise, the raster control software would operate normally and yield the correct values for dose per unit area, etc. As CPB systems such as the Vectra are designed with a "refresh" interval, whereby the beam pauses for a definable amount of time at the end of each raster pass, setting the appropriate $\Delta x_{Pan}$ and $\Delta y_{Pan}$ settings could be accomplished in software during the refresh time at the end of a raster. Another approach would be to examine the vertical retrace signal generated in hardware by the raster generator and make appropriate modifications to the Pan values when a vertical retrace signal was detected.

Dwell point analysis software such as FIB Assist from Fibics Incorporated of Ottawa, Canada could be configured to assemble the appropriate "human-readable" high resolution images from such an approach as well as set the necessary $\Delta x_{Pan}$ and $\Delta y_{Pan}$ settings at the appropriate points in time. By providing an appropriate user interface, such a system could theoretically achieve 20 nm spatial and placement resolution anywhere within a 320 µm (+/−160 µm) field of view without resorting to stage motion, on the existing Vectra system electronics.

An example implementation of the aforementioned embodiments of the present invention is now be described.

In this method, all image and mill commands generated by the user are "filtered" by control software, which enable the user to position the stage at a fixed point and operate within a 320 µm FOV, moving as if they were moving the stage, but without stage motion. A typical implementation entails the user performing imaging and enabling mills anywhere within that 320 µm FOV, at "Effective" Fields of View (EFOV) from less than 1 µm up to 320 µm in this mode.

A user request for a standard image pass for a 1,024×1,024 image is intercepted by the CPB workstation 100 and turned into a request for 16 rasters of a mill with 256×256 dwell points, plus implementation of the necessary Pan adjustments (4 adjustments to the $\Delta x_{Pan}$ and 4 adjustments to the $\Delta y_{Pan}$) in an automated fashion. Note that the number of Pan adjustments required for these algorithms are small compared to the full Pan range, so the user would not see a significant reduction in the Pan range available to them through implementation of this technique. The process of defining and building the image is handled in software and is virtually transparent to the user.

To simplify visualization of such an approach, consider an EFOV of 10 µm that can be "scrolled" to anywhere within +/−160 µm of the stage center in High Resolution Navigation (HRN) mode. Using appropriate controls, the user enters this HRN mode, and stage readback, Knights navigation, EFOV, etc. would function as if the user was moving the stage.

The system can optionally apply the Pan corrections on a line by line basis during imaging, in order to generate full resolution lines one at a time, rather than, as in the scheme, above full resolution frames one at a time. In other words, it may be preferable to perform multiple repeats of the same line with $\Delta x_{Pan}$ corrections applied during the horizontal retrace until the full resolution line is composed and displayed to the user, before proceeding to the next line.

The Vectra possesses the necessary "Line Scan" algorithm to raster a mill while delivering the full dose to each line before proceeding to the next line. In this case the user sees a high resolution image built up on a line by line basis, that appears identical to the image that is formed during a conventional image pass. This image is responsive to focus and stigmation in the same manner as a conventional image. Such a line by line process can be applied to milling as well as imaging, however the scheme outlined above may be more suitable to the very short dwell times required for gas assisted milling operations, whereas the longer dwell times typical of imaging operations could more easily support the formation of the high resolution image on a line by line basis.

By appropriately intercepting all calls for imaging and milling operations at a given EFOV, and recasting them to incorporate the Pan adjustment scheme and data processing at the real FOV, the user will not be aware of the "machinations" occurring in the background, but would instead appear to have gained a 16 bit (or higher) deflection system where they previously had only 12 bits. On systems with a higher native DAC resolution, this approach can yield similar improvements.

To simplify the process and avoid errors arising from the granularity of the Pan deflections themselves, the number of EFOVs available in HRN mode can be fixed to a few EFOVs at optimal values ranging from 0.25 µm, to 320 µm, for example. Note that using this approach it will be possible to obtain EFOVs less than 1 µm on the Vectra, however whether in the conventional "real FOV" approach or the modified "EFOV" approach described above, the information limit of all FOVs is ultimately determined by the spot size of the microscope (given sufficient stability of all other components and a suitable specimen).

It should be noted that the "Pan" described above need not be considered as solely the use of the "Pan" or "beam Shift" of the microscope, but could instead be a further offset applied in digital or analog space within the DAC subsystem, or a raster subsystem based on one or more DACs. The described method of rastering the beam across the field of view in a number of discrete steps across multiple passes, ie. dwells at cyclical points A through P, as shown in FIGS. 27, 28, 30 and 31, during sixteen image passes across the field of view, and reconstructing the resultant image from these multiple passes, whether accomplished through a "Pan" operation to move the dwell location from "A" to "B" on the next cycle, or merely through the use of a higher resolution DAC, has the advantage that the local current density at each of the 16 passes is much smaller than if the image were scanned in the traditional 1 pass method with 16 times the dwell points.

Thus, this method can be an effective method to reduce artifacts such as sample charging, drift, contamination and beam damage. One skilled in the art will realize that the actual granularity need not be 4×4 dwell points (i.e. sixteen passes is not a "magic" number), and that alignment techniques such as are commonly employed for "drift correction" in CPB systems may be necessary to align the "center of mass" of each image pass to improve the overall result in the face of whatever "drift" may occur in the imaged area over the time it takes to acquire these multiple passes. Indeed, the total time to acquire 16 passes each at $\frac{1}{16}^{th}$ of the number of dwell points will be very similar to the time to acquire a single image pass in the standard manner, however in the standard manner the drift will be distributed throughout the image (resulting in a potential "stretching" of the image features) whereas in the method described here, for an equivalent amount of drift per unit time, this stretching will be smaller (on the order of $1/16^{th}$ of the stretch) per pass, and with application of drift correction between passes to realign on the field of view of interest, there can be a significant improvement in fidelity, as well as improvement due to the reduction in charging. It should be noted that the derived granularity of sub-positioning the beam may be in a "regular" fashion as described or may be accomplished using probabilistic methods similar to those described above.

Another method to improve the scan quality when acquiring images with pixel spacings much larger than the spot size of the beam is a spatial super sampling method, illustrated in the flowchart of FIG. 32, which is discussed as follows.

The presently described method advantageously uses the pixel's intensity as a function of the average intensity of the area represents by the pixel in the image, rather than a single sampling of the area covered by the beam itself. In order to generate this average intensity, the beam can, during the dwell time of that pixel, be moved around randomly or systematically within the pixel sub-area. This is known as spatial super-sampling.

Although from an imaging point of view this may be partially accomplished by defocusing the beam to match the pixel size, defocusing may not be suitable when patterning with gases as it affects the spot current density. In the case of gas assisted etching or deposition, very large pixel spacings are commonly used to improve the gas efficiency, but this leads to non-uniform milling or deposition. By moving the beam around with sub-pixel resolution during the patterning, a more uniform etch or deposition can be obtained without sacrificing the efficiency of the gas process. It should be noted that such movement may be in a regular fashion or using probabilistic methods similar to those described above.

Figure 32:
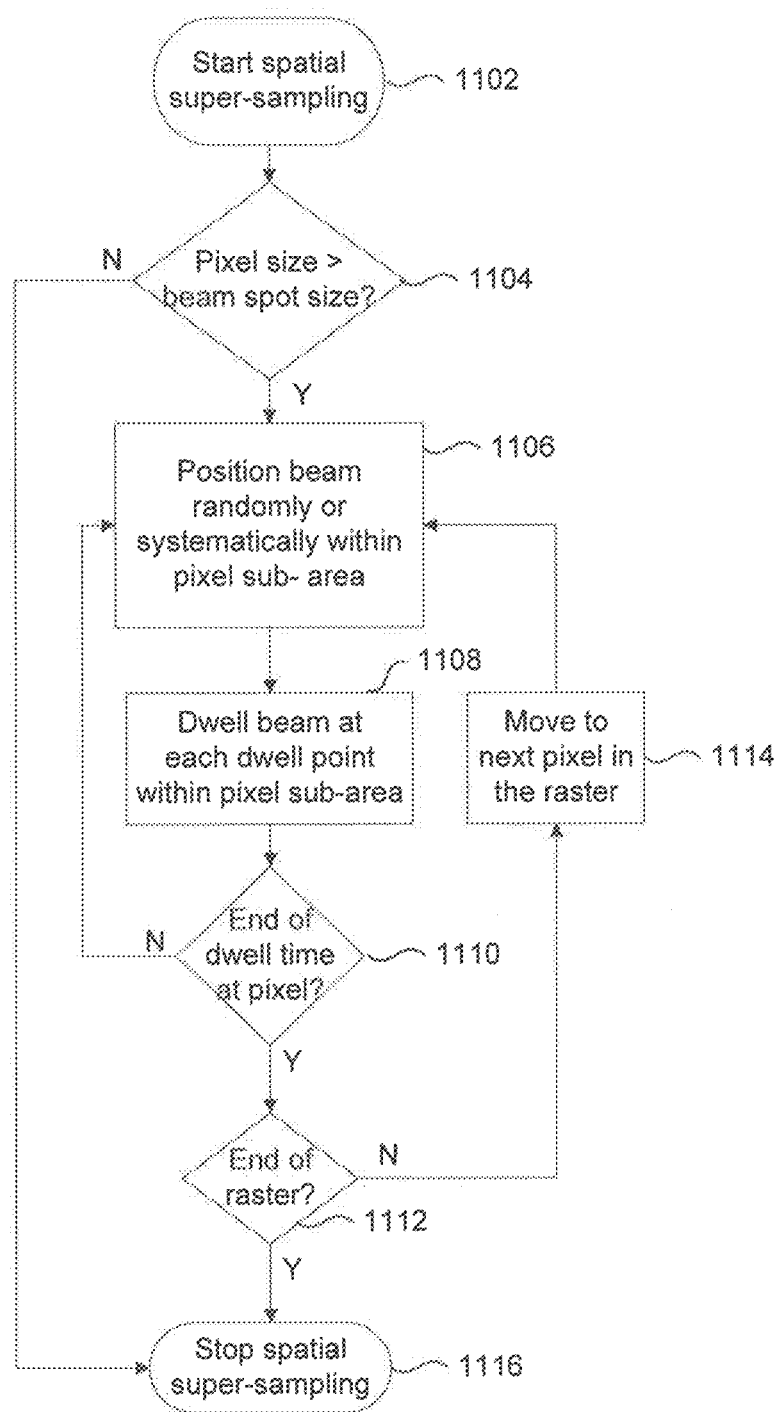
FIG. 32 is a flow chart of a spatial super sampling method, according to a present embodiment.

As illustrated in FIG. 32, the process starts at 1102, and is implemented when the pixel size is greater than the beam spot size 1104. The beam is positioned randomly or systematically within the pixel sub-area 1106, and is allowed to dwell at each dwell point within the pixel sub-area 1108. At the expiration of the dwell time at each pixel 1110, the process continues at the next pixel in the raster 1114. At the end of the raster 1112, the spatial super-sampling process is stopped 1116.

In an example embodiment, the spatial super-sampling may be implemented in a digital scan-generator by over-clocking the output DAC at a rate significantly higher than the dwell time. The nominal scan data can then be shifted by a random or fixed amount along either scan axis. The shifted beam position is clocked out several times around each nominal pixel position. For example, by updating clocking the DAC at 50 MHz (new data every 20 ns), it is possible to generate 50 distinct sampling locations during a 1 μs pixel dwell time, thereby spatially super-sampling the dwell area within the dwell time.

It is noted that the benefit is not limited to a case where the pixel spacing is much larger than the spot size. The benefit may also be realized by applying this technique under other conditions where the spot size is near or larger than the pixel size.

Another method to improve the scan quality when acquiring images is by temporal sub-sampling. According to this embodiment, scan quality is improved by extracting the signal variation in time once a dwell point is irradiated by the beam. The intensity of a pixel is normally obtained by summing and averaging the detector signal during the entire time the beam is dwelling at that location. In cases where the beam shortly interacts with the sample, it may be useful to extract how the signal varies in time once the sample dwell point is irradiated by the beam. This data can be used to extract dynamic process information, or to exclude one or more time slices during which there is an extraneous or otherwise undesired signal.

In an example embodiment, this can be implemented by sampling the intensity data at a higher rate than the dwell time in order to get access and process this data. For example, the system may sample the intensity at a frequency of 40 MHz, which produces a sample every 25 ns. Under normal circumstances, these samples are accumulated during the entire dwell period to generate an average intensity. When the information of interest is only in the signal after the first 200 ns, the first 8 samples might be rejected, and all subsequent samples can be averaged, integrated, or otherwise processed to produce the displayed intensity.

By way of another example, the initial signal from an ion beam may in fact contain information on the chemical state at the surface that is lost after the first few ions have impacted. It may be advantageous to combine both methods, by splitting the initial and subsequent data, or any number of time slices within the dwell period. Although processing the intensity data in this fashion can be done in a purely analog system, it is easier to implement a flexible solution in a digital system where the intensity is sampled by an ADC at high speed and processed by an FPGA or DSP prior to being displayed. This could also be accomplished in software on a computer if the entire high speed data stream is collected and processed prior to being displayed.

The signal may be separated into different components for identifying properties of the sample—for example, chemical state, charge state, capacitive contrast effects, etc. based on time slices, or on the variation of the signal within the spatial super-sampling. Also, the entire super-sampled data may be set and subdivide based on characteristics (rise, fall, slope, noise level, etc.) rather than purely on time slices.

The previously described embodiments for maneuvering the beam involves deflecting the beam a given amount in X and Y axes so that the beam strikes the target at a nominally known position. One method of accomplishing this involves applying a voltage to a series of plates or coils to deflect the beam in X and Y axes, with the magnitude of the voltage correlating to the magnitude of the deflection. This particular aspect of CPB systems should be well known to those skilled in the art. Historically, this deflection was produced by analog circuitry, and this is still the case in many systems on the market today.

More recently, systems have been marketed where the deflection position was determined using a digital scan generator, and a digital to analog converter (DAC) was used to produce the deflection voltages in response to a digital deflection code.

Many of the initial digital deflection systems and their DACs were based on 12 bits in both X and Y axes, yielding 4,096 discrete positions that the beam could be deflected to, assuming sufficiently fast and stable electronics and power supplies. These 12 bit DACs typically had the virtue the difference in the analog output values resulting from a unity change in the digital code applied to the DAC, say from code N to code N+1 (effectively a change of one Least Significant Bit (LSB)) deviates from the ideal difference of the analog output by no more than the ideal difference itself. Mathematically, $DNL = Max(|V_{out}(i+1) - V_{out}(i)) - V_{ideal\ LSB\ step}|)$, and these 12 bit DACs typically were specified such that the DNL error was less than or equal to 1 LSB, thereby guaranteeing a monotonic transfer function with no missing codes.

When observing a 20 µm field of view in such a FIB system, 12 bits were sufficient, as the 20 µm field of view (FOV) would be broken down into 4,096 discrete positions, effectively mapping each position with a square just under 0.005×0.005 µm (5 nm×5 nm) in size. As the best beam resolution achievable was on the order of 5 nm, this degree of granularity was sufficient for a 20 µm or smaller FOV.

When high placement resolution was required at sites outside the 20 µm FOV, it became necessary to physically move the stage in order to reposition the new site(s) within the 20 µm FOV, or to use a larger field of view and accept the poorer placement resolution available. For example, to work on two sites 200 µm apart, one can either
(a) shuttle between the two sites with stage motion and continue working with a 20 µm field of view, 5 nm placement accuracy, and any stage positioning error that may occur, or
(b) increase the field of view to 200 µm, removing the need to move the stage and introduce a potential inaccuracy in stage motion, but instead the user must accept a 10 times poorer placement accuracy of just under 50 nm.

Newer systems typically employ DACs and scan generators based on 16 or more bits, to allow greater placement accuracy at larger fields of view. Another approach that will work with a 12 bit ADC is to define a fixed offset voltage that deflects the center of the field of view a known amount, and shuttle between points using this offset voltage rather than stage motion, while retaining the 5 nm placement resolution.

In the CPB systems, including FIB and SEM systems, a digital to analog converter (DAC) is used to convert a code into a corresponding voltage magnitude for application to the system deflection plates. Given that the beam can be deflected in the X and Y axes, separate X and Y deflection codes are provided by the control system. There is a range of available codes spanning a min code value and a max code value, where each code is calibrated to provide a predetermined deflection voltage. In some systems, the scan generator and the DAC's are configured based on 16 bit codes. Ideally, the deflection voltages from the min code to the max code follow a linear relationship. In the presently described CPB system, either a single DAC is used to generate both the X and Y deflection voltages, or dedicated DAC's are used for generating the X and Y deflection voltages. In some CPB systems, the scan generator and the DAC's are mounted to a daughterboard, which in turn is connected to a motherboard of the system.

Figure 33:
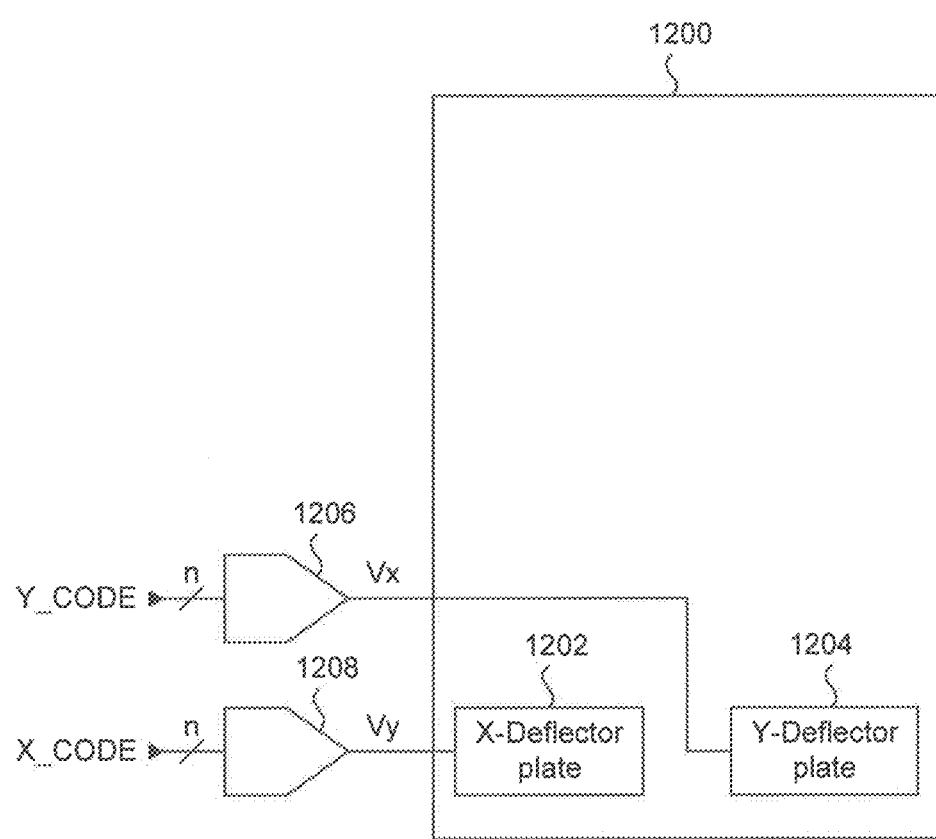
FIG. 33 is a partial block diagram of a beam column.

FIG. 33 is a partial block diagram showing a beam column 1200 having an x-axis deflector plate 1202 and a Y-axis deflector plate 1204. Y-axis deflector plate 1204 receives a Y deflection voltage Vy, generated from an n-bit DAC 1206 in response to input code Y_CODE. Similarly, X-axis deflector plate 1202 receives an X deflection voltage Vx, generated from an n-bit DAC 1208 in response to input code X_CODE.

Ideally, to achieve a monotonic transfer function with no missing codes at the 16 bit level, the differential non linearity (DNL) of the DAC and raster generator sub-system should not exceed 1. While the DAC may have a native DNL, additional circuitry on the daughterboard can increase the total DNL. It should be understood that a lower DNL is desired. DAC systems at greater than 16 bits do exist that guarantee a DNL of less than 1 LSB at the 16 bit level, however there is another requirement for this application—the DAC preferably outputs at a minimum frequency on the order of 40 MHz (25 ns dwell times). No "high speed" DAC commercially available at this point has a DNL of less than 1 across all digital codes and can also operate at these speeds. Some high speed DAC integrated circuits do come close, and can have average DNL value which is less than one LSB with very low standard deviation, however experimental testing has discovered that large variations in the DNL often occurs at the code boundaries which are certain powers of two, which is likely caused by the DAC architecture. By example, the most pronounced DNL variations observed in some DAC's occur at code boundaries that are multiples of 4,096. In otherwords, certain input codes for the DAC will generate a voltage that is non-linear with the voltages generated by the other codes. This is not unexpected given the architecture of certain DACs which are comprised of "strings" of resistors, each responsible for a portion of the full slope of the output analog value; at the points where these resistor strings must be matched, it is more difficult to achieve a low DNL. It should be clear that such variations will contribute to scan inaccuracies by the CPB system. For example, in the system of FIG. 33, a large non-linear variation in Vx or Vy as the beam is being rastered across a surface will result in the beam being deflected in either or both the x and y axes beyond the expected range by deflector plates 1202 and 1204, which in the case of an image to be acquired could result in scanning a region that had already been scanned, or jumping ahead and missing a region of the sample, resulting in duplicate information or missing information in the image. In the case where the DAC is controlling a CPB system that is removing material, this can cause non-uniform removal rates that are undesirable.

Figure 34:
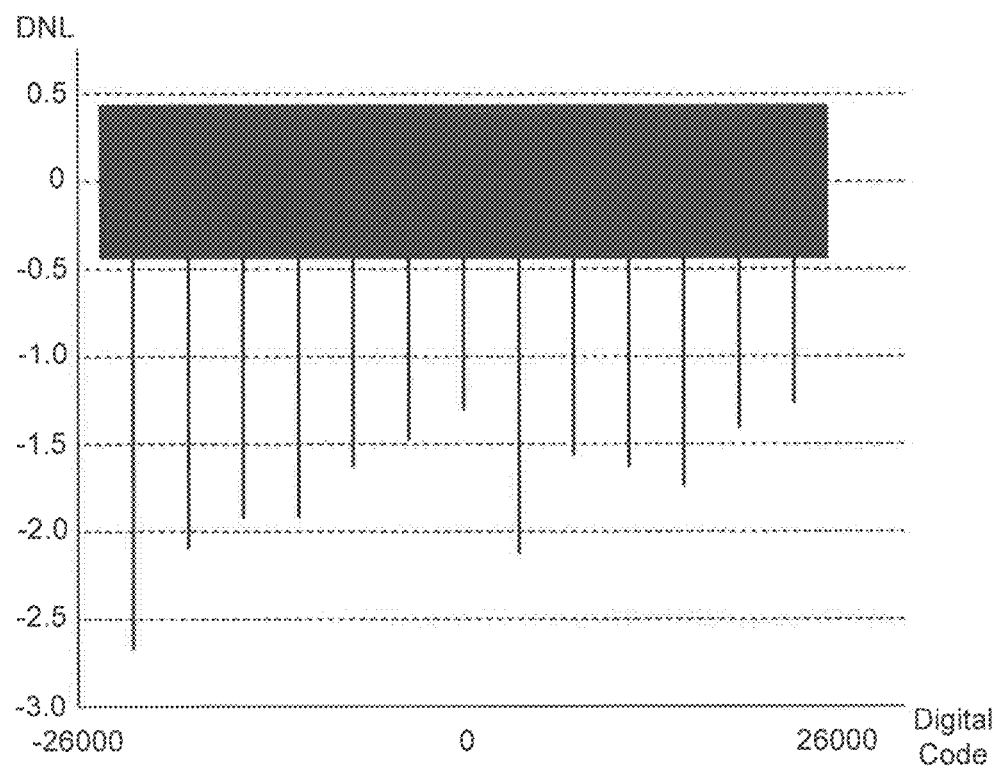
FIG. 34 is a DNL plot for a commercially available DAC.

DNL measurements for every input code of a commercially available DAC device are shown in the graph of FIG. 34, within a range of +/−26,000 as a digital input value. On average, a DNL of magnitude 0.5 is seen for each input code to the DAC. However, there are specific codes where the DNL spikes beyond 1, and in some cases, beyond 2. For the present DAC device under test, these specific codes were observed to occur at multiples of 4096 and at the central crossover of 0; these specific codes are visible as clearly observable descending "spikes" in FIG. 34. For different DAC devices, these abnormal spikes in DNL can occur at codes other than those seen in FIG. 34.

The effect of such abnormal DNL spikes can be mitigated by taking advantage of the fact that output voltages corresponding to codes proximate to a code having an abnormally high DNL value, will typically have low DNL values. According to the present embodiments, the output voltage corresponding to the target code of interest having an abnormally high DNL value is averaged with the output voltages corresponding to codes proximate to the target code.

Figure 35:
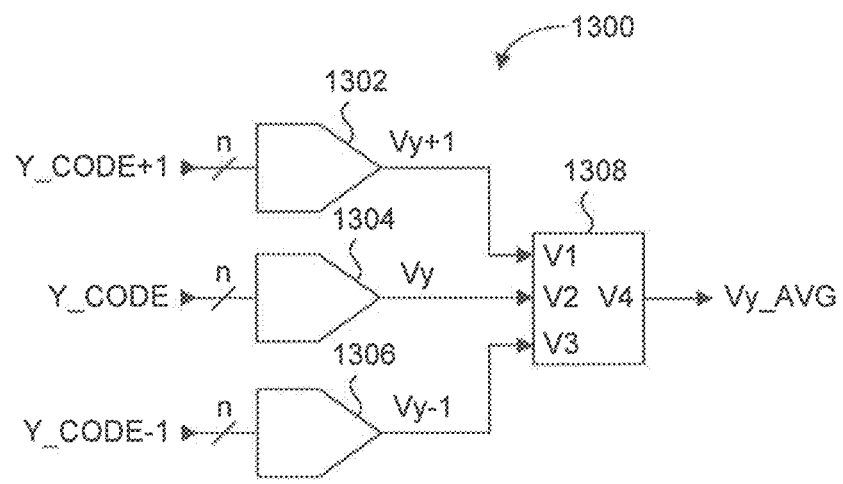
FIG. 35 is a block diagram of a multi-DAC voltage generator, according to a present embodiment.

FIG. 35 is a block diagram of a multi-DAC voltage generator according to a present embodiment. Multi-DAC voltage generator 1300 is configured to generate a Y deflection voltage Vy_AVG in response to three different Y input codes. This Y deflection voltage is then provided to the Y-Deflector plate of the beam column, such as deflector plate 1204 of FIG. 33, for moving the beam in the Y axis. While not shown, an identically configured circuit is used for generating an X deflection voltage Vx_AVG.

Multi-DAC voltage generator 1300 includes three identical n-bit DAC devices 1302, 1304 and 1306, and a voltage averager 1308. DAC device 1304 receives the target Y input code Y_CODE generated by the raster generator. DAC device 1302 receives a Y input code that is one code step above the target Y input code, and is referred to as Y_CODE+1. A code step is the subsequent code to a target code or the preceding code to a target code. DAC device 1306 receives a Y input code that is one code step below the target Y input code, and is referred to as Y_CODE−1. Both Y_CODE+1 and Y_CODE−1 can be generated automatically by the control system in response to Y_CODE simply by incrementing Y_CODE by one code step and decrementing Y_CODE by one code step. Accordingly, DAC 1304 generates a voltage Vy, DAC 1302 generates a voltage Vy+1 and DAC 1306 generates a voltage Vy−1. Voltage averager 1308 receives all three output voltages and provides an output voltage Vy_AVG representing the average of voltages Vy, Vy+1 and Vy−1. Therefore, all three DAC devices operate in parallel, but with different input codes.

According to the principles of the presently shown embodiment, if the target code Y_CODE happens to have an abnormally high DNL, then the output voltage for DAC 1304 is averaged with the voltages provided from the other two DAC devices having input codes adjacent to the target code. Because the DNL for the other input codes adjacent to the target codes have normal/low DNL, the output voltages from DAC devices 1302 and 1306 will have normal voltage levels expected for those codes. Thus the resulting Vy_AVG voltage for the corresponding target code becomes closer to the expected level. As previously mentioned, an identical circuit can be used for generating the X deflection voltage.

Figure 36:
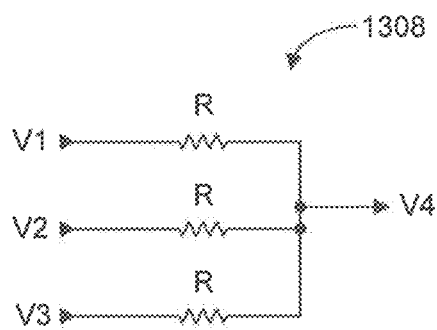
FIG. 36 is a circuit schematic of the voltage averager shown in FIG. 35.

FIG. 36 is a circuit schematic showing an embodiment of the voltage averager 1308 shown in FIG. 35. This simple circuit includes three resistor elements R, each having a first terminal connected to inputs labeled V1, V2 and V3. As shown in FIG. 35, voltage averager 1308 has inputs V1, V2 and V3 coupled to a voltage output of each of the three DAC devices 1302, 1304 and 1306. The second terminal of each resistor R is connected to a common output node, which is labeled as the voltage output V4. As shown in FIG. 35, V4 provides the averaged voltage of V1, V2 and V3 as signal Vy_AVG. If the value of each resistor R is the same, then the voltage V4 can be mathematically expressed as:

$$V4 = \frac{V1 + V2 + V3}{3}$$

The circuit embodiment of voltage averager 1308 shown in FIG. 36 is one possible voltage averaging circuit which can be used. Different circuits can be used to provide an output voltage that is an average of the received input voltages.

Figure 37:
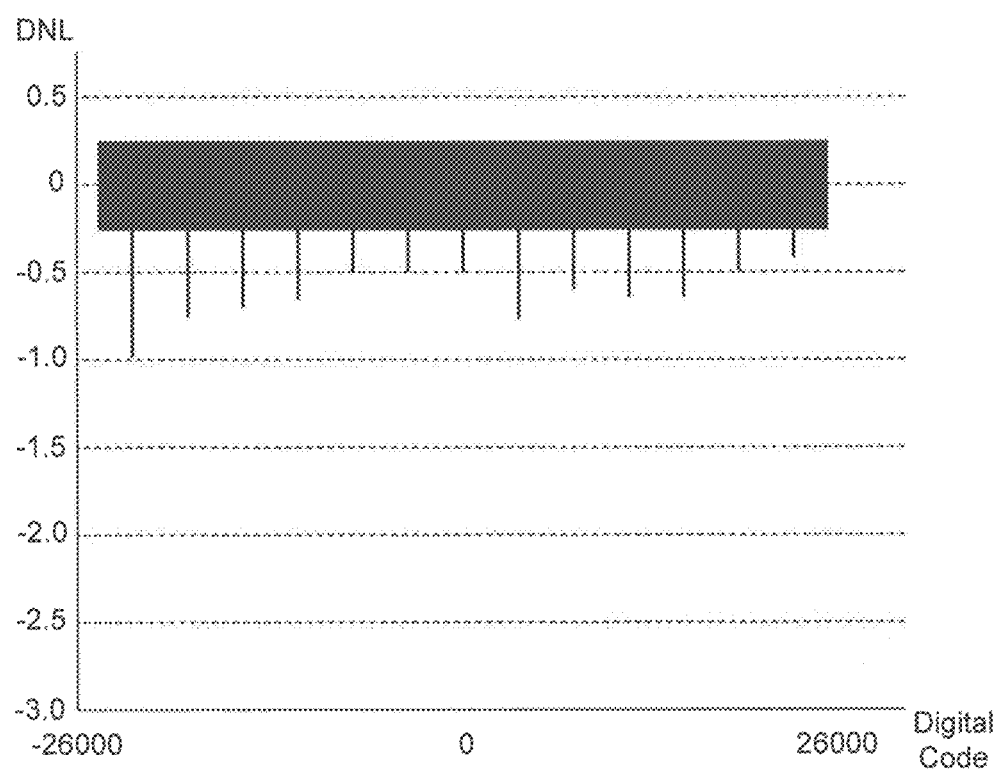
FIG. 37 is a DNL plot for the multi-DAC voltage generator of FIG. 35.

In order to illustrate the effectiveness of the presently shown embodiments for all target codes, DNL measurements for every input code for the Multi-DAC voltage generator 1300 are shown in the graph of FIG. 37. It is assumed that the same DAC devices used to measure the DNL for FIG. 34 are used in the Multi-DAC voltage generator 1300. The same graph scale is used for both FIGS. 34 and 37 for ease of comparison. On average, a DNL of less than magnitude 0.5 is seen for each input code to the DAC. When compared to the single DAC of FIG. 34, this is an overall improvement in overall DNL. More significantly, the abnormal DNL spikes are significantly reduced relative to the spikes at the same codes shown in FIG. 34. As can be seen in FIG. 37, the maximum DNL for the abnormal spikes does not exceed 1. In contrast, the maximum DNL for the abnormal spikes in FIG. 34 all exceed 1. Accordingly, a beam system employing the Multi-DAC voltage generator embodiments shown herein benefit from improved raster accuracy and beam positioning. Therefore, the Multi-DAC voltage generator 1300 can be used to improve overall DNL for all input codes, even in the cases where all three input codes have a normal DNL, or in the cases where any one of the input codes has an abnormal DNL.

It is noted that the number of DAC's used in the embodiment of FIG. 35 is not limited to 3. According to alternate embodiments, 2 DAC's can be used or more than 3 DAC's can be used, with an appropriately configured voltage averager 1308. In the 2 DAC alternate embodiment, two adjacent codes can be input to the DAC's. In the more than 3 DAC alternate embodiment, multiple adjacent codes can be input to the DAC's.

According to further alternate embodiments, the codes received by the Multi-DAC voltage generator 1300, or its previously described alternate embodiments, are not limited to receiving codes that are one code apart from each other. More specifically, the DAC's can receive codes that are two or more codes apart from each other. For example in the embodiment of FIG. 35, instead of having the 3 DAC's receive Y_CODE−1, Y_CODE and Y_CODE+1, they can receive Y_CODE−2, Y_CODE and Y_CODE+2. Furthermore, the codes can be asymmetric in step. For example, the 3 DAC's can receive Y_CODE−2, Y_CODE and Y_CODE+1.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method to compensate for 3 dimensional drift while controlling a charged particle beam (CPB) system having first and second charged particle beams each controllable in position, comprising:

positioning a sample supported by a stage in the CPB system;

identifying at least two reference fiducials of the sample;

determining a first drift compensation to compensate for a drift that causes an unintended change in first and second dimension positions of the first charged particle beam relative to the sample by a known amount over a period of time by monitoring one of the at least two reference fiducials;

determining a second drift compensation to compensate for a drift that causes an unintended change in a third dimension position of the second charged particle beam relative to the sample by a known amount over a period of time by monitoring the at least two reference fiducials before and after cross-sectioning the sample with the second charged particle beam, the third dimension being orthogonal to the first and second dimensions; and adjusting the position of the first charged particle beam by applying the determined first drift compensation and adjusting a rate of advancement of the second charged particle beam by applying the determined second drift compensation during an operation of the CPB system.

2. The method of claim 1, wherein the steps of positioning, identifying, determining the first drift compensation and determining the second drift compensation are executed at least once before the operation and the determined first and second drift compensation is a predictive 3 dimensional drift compensation model.

3. The method of claim 2, further including measuring a change in an environmental variable in close proximity to at least one of the sample and the CPB system during the steps of determining the first and second drift compensation, and the 3 dimensional predictive drift compensation model is updated to change the 3 dimensional drift compensation when the same change in the environmental variable is measured during the operation of the CPB system.

4. The method of claim 2, wherein the operation includes controlling the first charged particle beam to scan a new surface to obtain an image thereof, and determining the first drift compensation includes
dividing the known amount by the total number of dwell periods for the new surface to arrive at a drift correction per dwell period position, and
adjusting positions includes applying the drift correction per pixel to each dwell period position of the first charged particle beam for the new surface.

5. The method of claim 1, wherein the operation includes controlling the first charged particle beam to scan a new surface to obtain an image thereof, and further including monitoring environmental events of the CPB system using sensors for detecting environmental variables exceeding predetermined thresholds, and upon detection of any environmental variable exceeding its predetermined threshold, re-scanning a portion of the new surface at a point prior to the detection.

6. The method of claim 1, wherein the operation includes controlling the first charged particle beam to scan a new surface to obtain an image thereof, and further includes at least one of stigmation correcting, focus correcting or fine position correcting the first charged particle beam to preserve focus and quality on the surface as a function of the first and second dimension positions of the first charged particle beam in the surface while rastering.

7. The method of claim 1, wherein the operation includes controlling the first charged particle beam to scan a new surface of the sample to obtain an image thereof, the steps of identifying and determining the first drift compensation are executed during the operation, and determining the first drift compensation includes
monitoring the one of the at least two reference fiducials from a start time to an end time:
calculating a drift factor function as an amount of drift by the one of the at least two reference fiducials at points between the start time and the end time,
calculating a total drift for the time required to raster the new surface based on the drift factor function, and
correcting for the total drift to further shift the first charged particle beam for each pixel during rastering of the new surface by dividing the total drift by the total number of dwell periods to arrive at a drift correction per dwell period position, and
adjusting the position of the first charged particle beam includes applying the drift correction per pixel to each dwell period position for the new surface.

8. The method of claim 7, further including
storing the calculated drift factor function for the new surface, and
post processing at least a portion of an image of the new surface to remove the corresponding applied drift factor function from the portion of the image of the new surface.

9. The method of claim 1, wherein the operation includes controlling the first charged particle beam to scan the surface of the sample to obtain an image thereof, the steps of identifying and determining the first drift compensation are executed during the operation, and further includes
pausing the scanning of the surface of the sample,
monitoring the time (t) and the first and second dimension position (X,Y) of the one of the at least two reference fiducials from the start time after pausing to the end time after pausing,
wherein determining the first drift compensation includes
calculating a drift factor function (dX, dY, t) by fitting the amount of observed drift by the one of the at least two reference fiducials at points between each of at the least one start time and the end time pairs and fitting these points to a suitable pre-determined model, and
calculating the time at which each pixel is rastered in a subsequent portion of the cross-section surface, and
wherein adjusting the position of the first charged particle beam includes dynamically correcting for the drift by applying drift correction per pixel obtained from the drift factor function (dX, dY, t) to the (X,Y) position of each pixel during rastering based on the time during which each pixel is dwelled for the subsequent portion of the surface, and resuming image acquisition at the portion of the surface when the pausing occurred using the applied drift correction.

10. The method of claim 1, wherein the operation is a selective high resolution imaging operation including
acquiring and displaying a sample area image of the sample at a first resolution on a display;
scanning at least one exact region of interest in the sample area image defined by an arbitrary outline positioned on the sample area image, including
receiving the arbitrary outline corresponding to the at least one exact region of interest in the sample area and receiving a second arbitrary outline corresponding to a second exact region of interest positioned on the sample area image,
mapping the arbitrary outline to a coordinate system of the sample area image, generating a raster pattern for directing the first charged particle beam in response to the arbitrary outline, and rastering the first charged particle beam at a position of the sample corresponding to the arbitrary outline and within an area defined by the arbitrary outline;

acquiring an image of the at least one exact region of interest at a second resolution greater than the first resolution;

overlaying the image of the at least one exact region of interest at the second resolution, over the arbitrary outline positioned on the sample area image;

sectioning the sample to expose a new sample surface after acquiring and displaying the image of the at least one exact region of interest by advancing the second charged particle beam in the third dimension with the applied second drift compensation;

scanning the at least one exact region of interest of the new sample surface, acquiring and displaying another image of the at least one exact region of interest of the new sample surface at a second resolution greater than the first resolution, wherein a sequence of sectioning, scanning, acquiring and displaying is executed iteratively until a request for a new sample area image at a first resolution is received.

11. The method of claim 1, wherein the surface is a first cross-section surface of the sample having x, y and z dimensions corresponding respectively to the first, second and third dimensions, with the at least two reference fiducials corresponding to first and second linear fiducials each having ends electronically detectable on the first cross-section surface of the sample defined by the x-y plane and each extending from the surface in a direction having the z-dimension component at known angles relative to the x-y surface, and determining the second drift compensation includes exposing a second cross-section surface defined by the x-y plane after milling the sample to a selected depth, where an x dimension distance between ends of the first and second linear fiducials exposed in each cross-sectioned surface changes as a function of the z-dimension;

electronically calculating an actual milled depth in the z-dimension between the first cross-section surface and the second cross-section surface based on a change in the x dimension distance and the angles;

adjusting parameters to change the rate of advancement of the second charged particle beam in the z dimension effective for exposing a third cross-section surface at approximately the actual milled depth in the z dimension from the second cross-section surface.

12. The method of claim 1, wherein the surface is a front cross-section surface and the operation is for removing material from the sample to provide a section of the sample, where the sample has x, y and z dimensions corresponding respectively to the first, second and third dimensions, with the at least two reference fiducials corresponding to first and second linear fiducials each having ends electronically detectable on the front cross-section surface of the sample defined by the x-y plane and each extending from the front cross-section surface in a direction having the z-dimension component at known angles relative to the x-y surface, the operation including;

setting a target distance m from the front cross-section surface in the z-dimension, where m is a real number;

setting a front slice distance of n, where n<m and n is a real number;

iteratively executing the steps of
a. scanning the front cross-section surface with the first charged particle beam with the applied first drift compensation to obtain a front slice image thereof by an imaging system;
b. exposing another front cross-section surface defined by the x-y plane with the second charged particle beam to the slice distance of n, and where an x dimension distance between ends of the first and second linear fiducials exposed in each front cross-sectioned surface as a function of the z-dimension;
c. electronically calculating an actual front slice distance in the z-dimension between a previous front cross-section surface and the currently exposed front cross-section surface based on a change in the x dimension distance and the angles;
c.1 updating the adjustment of parameters to advance the second charged particle beam in the z-dimension to the actual front slice distance as the second drift compensation;
d. advancing the second charged particle beam in the z dimension with the applied second drift compensation for exposing a subsequent front cross-section surface at a distance in the z dimension from the currently exposed front—cross-section surface that is closer to the front slice distance n; and,
e. aggregating the actual front slice distances and stopping the iterative execution of steps a-d when the aggregated actual front slice distances is approximately the target distance m.

13. The method of claim 12, wherein the sample has third and fourth linear fiducials each having ends electronically detectable on a rear cross-section surface of the sample defined by the x-y plane and each extending from the rear cross-section surface in a direction having the z-dimension component at known angles relative to the x-y surface, the method after step e. further including positioning the rear cross-section surface of the sample for imaging by the imaging system and exposing another rear cross-section surface by the second charged particle beam, setting a target distance r from the rear cross-section surface in the z-dimension, where r is a real number;

setting a rear slice distance of s, where s<r and s is a real number;

iteratively executing the steps of
f. scanning the rear cross-section surface with the first charged particle beam with the applied first drift compensation to obtain a rear slice image thereof by the imaging system;
g. exposing another rear cross-section surface defined by the x-y plane with a the second charged particle beam to the slice distance of s, and where an x dimension distance between ends of the third and fourth linear fiducials exposed in each rear cross-sectioned surface changes as a function of the z-dimension;
h. electronically calculating an actual rear slice distance in the z-dimension between a previous rear cross-section surface and the currently exposed rear cross-section surface based on a change in the x dimension distance and the angles;
h.1 updating the adjustment of parameters to advance the second charged particle beam in the z-dimension to the actual rear slice distance as the second drift compensation;
i. advancing the second charged particle beam in the z dimension with the second drift compensation for exposing a subsequent rear cross-section surface to at a distance in the z dimension from—the currently exposed rear cross-section surface that is closer to the rear slice distance s; and, j. aggregating the actual rear slice distances and stopping the iterative execution of steps a-d when the aggregated actual rear slice distances is approximately the target distance r.

14. The method of claim 1, wherein the at least two reference fiducials include first and second linear fiducials each having ends electronically detectable on each cross-section face of the sample where a distance between the ends changes as a function of the third dimension.

15. The method of claim 14, wherein one of the ends of the first and second linear fiducials is monitored for determining the first drift compensation.

16. The method of claim 14, wherein both ends of the first and second linear fiducials are monitored for determining the first drift compensation.

17. The method of claim 1, wherein the at least two reference fiducials includes a surface reference fiducial on the sample monitored for determining the first drift compensation.

18. The method of claim 1, wherein the at least two reference fiducials includes first and second linear fiducials each having ends electronically detectable on each cross-section face of the sample where a distance between the ends changes by a known amount as a function of the third dimension, and a surface reference fiducial on the sample.

19. The method of claim 1, wherein the operation is cross-sectioning the sample to a preset depth to expose a new surface by advancing the second charged particle beam in the z dimension with the applied second drift compensation, and scanning the new surface with the first charged particle beam with the applied first drift compensation to obtain an image thereof.

* * * * *